US010313600B2

(12) United States Patent
Kimura et al.

(10) Patent No.: US 10,313,600 B2
(45) Date of Patent: Jun. 4, 2019

(54) IMAGING DEVICE CAPABLE OF SIMULTANEOUSLY CAPTURING OF A MOTION IMAGE AND A STATIC IMAGE AND IMAGING METHOD

(71) Applicant: CANON KABUSHIKI KAISHA, Tokyo (JP)

(72) Inventors: Masafumi Kimura, Kawasaki (JP); Koichi Washisu, Tokyo (JP); Yasuo Suda, Yokohama (JP); Akihiko Nagano, Ichihara (JP); Fumihiro Kajimura, Kawasaki (JP); Go Naito, Kawasaki (JP); Ryo Yamasaki, Tokyo (JP); Makoto Oikawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/283,936

(22) Filed: Oct. 3, 2016

(65) Prior Publication Data

US 2017/0104910 A1  Apr. 13, 2017

(30) Foreign Application Priority Data

Oct. 13, 2015  (JP) ................................ 2015-202086
Jul. 28, 2016  (JP) ................................ 2016-148738

(51) Int. Cl.
*H04N 5/235*  (2006.01)
*H04N 5/355*  (2011.01)
*H04N 5/378*  (2011.01)
*H01L 27/146*  (2006.01)

(52) U.S. Cl.
CPC ...... *H04N 5/2352* (2013.01); *H01L 27/14629* (2013.01); *H01L 27/14643* (2013.01); *H04N 5/2355* (2013.01); *H04N 5/35563* (2013.01); *H04N 5/378* (2013.01); *H01L 27/14621* (2013.01)

(58) Field of Classification Search
CPC .............. H04N 5/2352; H04N 5/2355; H04N 5/35563; H04N 5/378; H04N 5/359; H01L 27/14629; H01L 27/14643
See application file for complete search history.

(56) References Cited

U.S. PATENT DOCUMENTS

| | | | |
|---|---|---|---|
| 6,078,037 A * | 6/2000 | Booth, Jr. ......... | H01L 27/14609 250/208.1 |
| 9,118,883 B2 * | 8/2015 | Wan ..................... | H04N 5/765 |
| 9,578,265 B2 * | 2/2017 | Roffet ................... | H04N 5/3597 |

(Continued)

FOREIGN PATENT DOCUMENTS

JP  2014-048459 A  3/2014

*Primary Examiner* — Nicholas G Giles
(74) *Attorney, Agent, or Firm* — Cowan, Liebowitz & Latman, P.C.

(57) ABSTRACT

Provided is an imaging device including an imaging element having a first photoelectric conversion unit and a second photoelectric conversion unit, in which a light-receiving efficiency of the second photoelectric conversion unit is lower than a light-receiving efficiency of the first photoelectric conversion unit; an optics that guides a light flux from an object to the imaging element; and a control unit that selects a combination of the first photoelectric conversion unit and the second photoelectric conversion unit used for a motion image capturing and a static image capturing in accordance with a brightness of the object.

15 Claims, 38 Drawing Sheets

(56) References Cited

U.S. PATENT DOCUMENTS

| | | | |
|---|---|---|---|
| 9,912,884 B2* | 3/2018 | Kovacovsky | H04N 5/353 |
| 2005/0157194 A1* | 7/2005 | Altice, Jr. | H04N 5/35581 |
| | | | 348/308 |
| 2006/0181627 A1* | 8/2006 | Farrier | H01L 27/14603 |
| | | | 348/308 |
| 2008/0018763 A1* | 1/2008 | Sato | H04N 5/335 |
| | | | 348/308 |
| 2011/0007196 A1* | 1/2011 | Yamashita | H01L 27/14609 |
| | | | 348/294 |
| 2011/0090385 A1* | 4/2011 | Aoyama | H01L 27/14603 |
| | | | 348/308 |
| 2011/0134298 A1* | 6/2011 | Aoyama | H01L 27/14609 |
| | | | 348/311 |
| 2012/0033118 A1* | 2/2012 | Lee | H01L 27/14609 |
| | | | 348/296 |
| 2012/0257093 A1* | 10/2012 | Sa | H01L 27/14609 |
| | | | 348/302 |
| 2012/0274744 A1* | 11/2012 | Wan | H04N 5/37452 |
| | | | 348/46 |
| 2013/0027596 A1* | 1/2013 | Wan | H01L 27/14612 |
| | | | 348/302 |
| 2018/0020172 A1* | 1/2018 | Hirota | H04N 5/3559 |

* cited by examiner

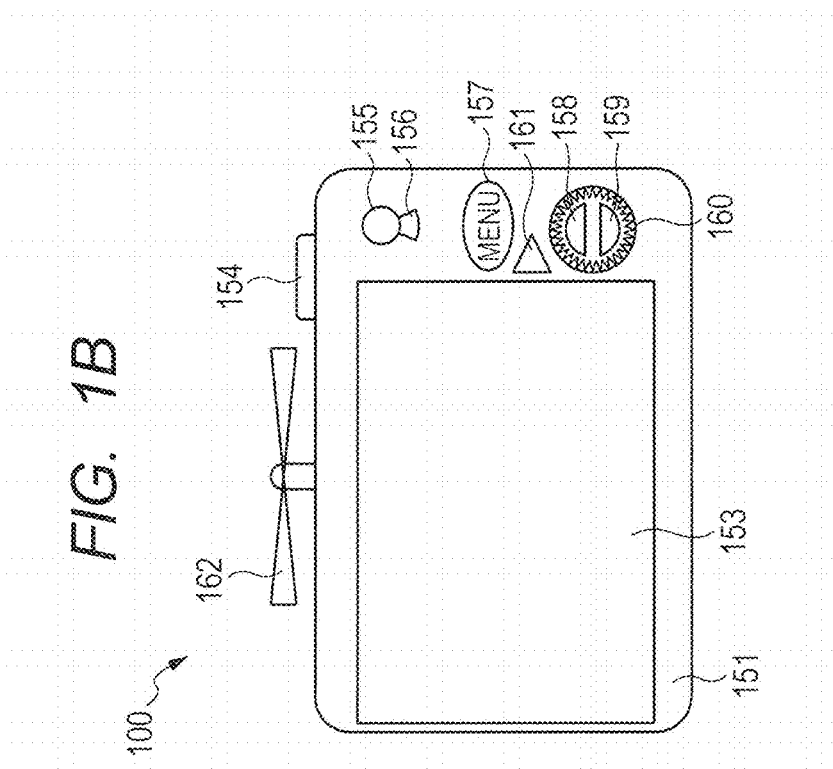
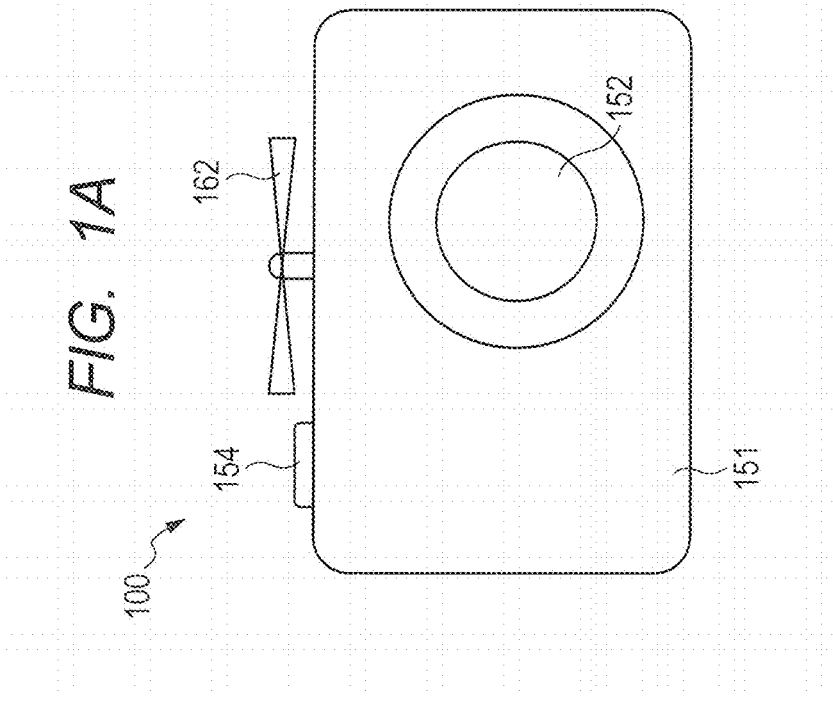

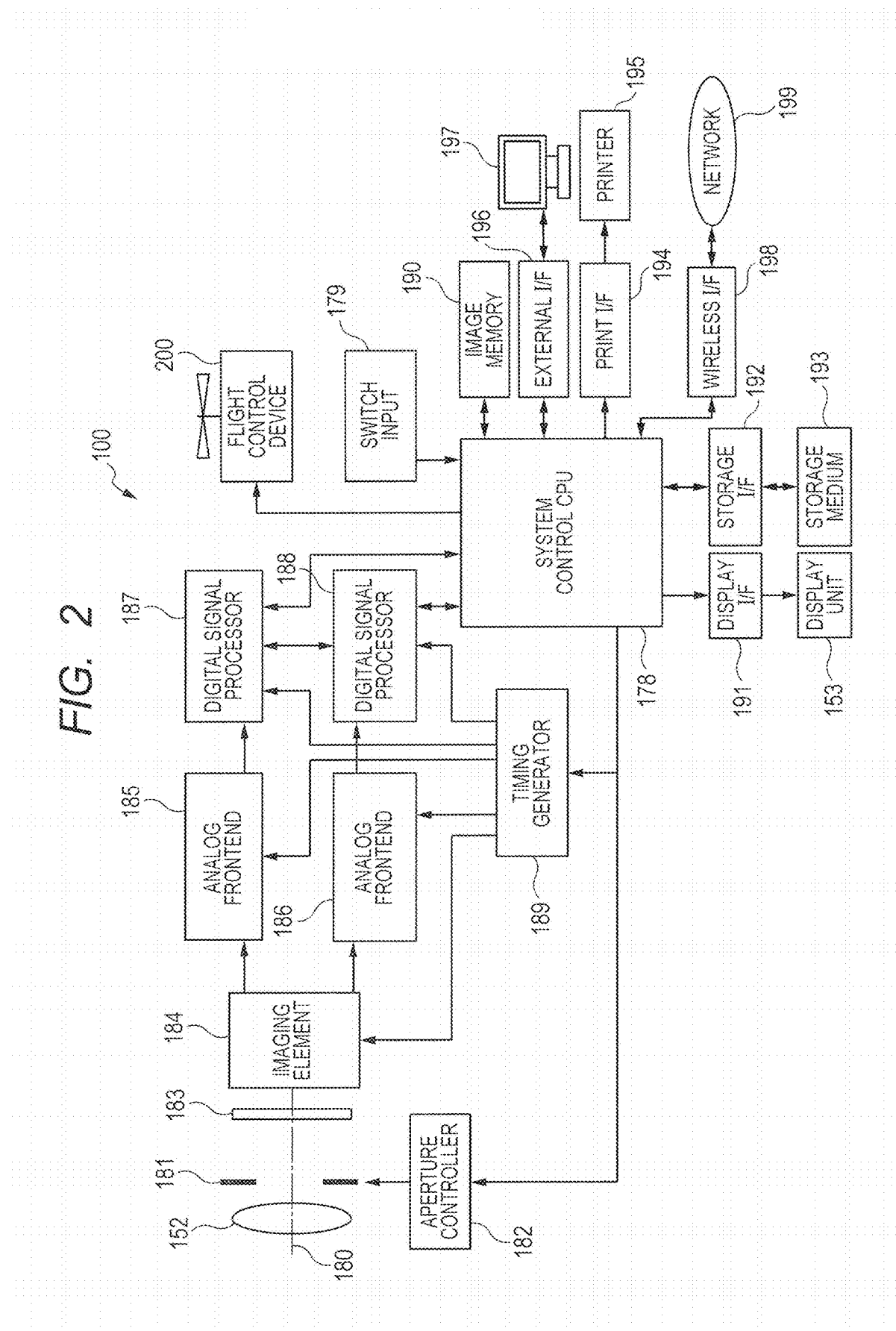

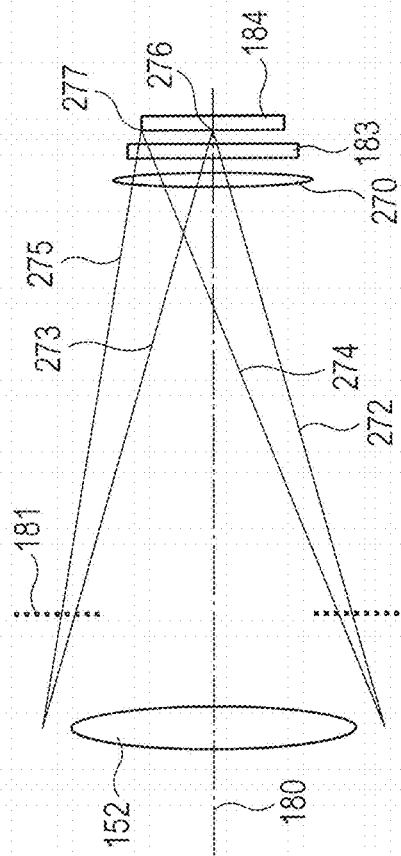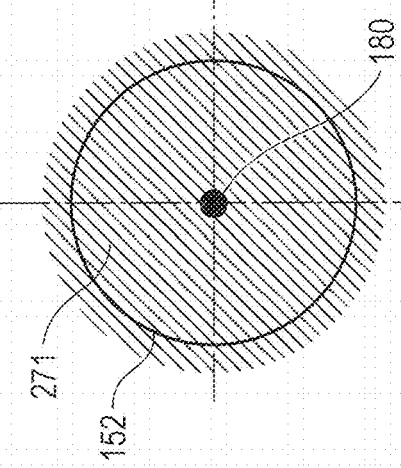

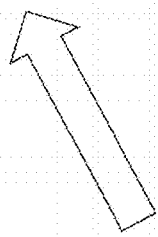

APERTURE  SHUTTER SPEED
F4.0      1/1000

APERTURE  SHUTTER SPEED
F4.0      1/60

IMAGING DEVICE CAPABLE OF SIMULTANEOUSLY CAPTURING OF A MOTION IMAGE AND A STATIC IMAGE AND IMAGING METHOD

BACKGROUND OF THE INVENTION

Field of the Invention

The present invention relates to an imaging device having two photoelectric conversion units with different light-receiving efficiencies.

Description of the Related Art

A simultaneous capturing of a motion image and a static image enables a user to view a captured scene as a motion image and also enjoy a critical scene in the motion image as a static image, which can significantly enhance the value of the captured image. Further, a simultaneous capturing of a motion image of a normal framerate and a motion image of a high framerate by a single camera allows a user to enjoy a high quality production while switching a particular scene to a slow-motion video and thereby perceive full of movement.

In general, a faster shutter speed in capturing a motion image causes so called jerkiness, which is viewed like a frame-by-frame video during playback, resulting in a loss of smoothness of a video. In order to suppress such jerkiness to have a smooth video, it is necessary to set accumulation time close to one frame period in a series of capturing. That is, when the framerate is 30 fps, a relatively longer accumulation time period such as $\frac{1}{30}$ seconds or $\frac{1}{60}$ seconds will be appropriate. In particular, this setting is important in a situation where a position of a camera is unstable such as in an aerial capturing.

On the other hand, in a static image, it is required to capture an image having a so called stop motion effect that suppresses a blur to capture a moment. It is therefore necessary to set a short accumulation time period such as around $\frac{1}{1000}$ second, for example. Further, since one frame period is short in a high framerate motion image, when the framerate is 120 fps, for example, a shorter accumulation time period such as $\frac{1}{125}$ seconds or $\frac{1}{250}$ seconds will necessarily be set.

Simultaneously capturing two images of a motion image and a static image or two images of a motion image of a normal framerate and a motion image of a high framerate through a single capturing lens means that an aperture used in these types of capturing is common to each other. Also in this case, it is desirable to obtain almost the same level of signal charges at imaging elements while two images are captured with different settings of the accumulation time period and thereby obtain both images with a good S/N ratio and less feeling of noise.

Japanese Patent Application Laid-open No. 2014-048459 discloses an imaging device including a pair of photodiodes (photoelectric conversion units) having asymmetric pupils in each pixel. In the imaging device disclosed in Japanese Patent Application Laid-open No. 2014-048459, one photodiode of the pair of photodiodes has a higher light-receiving efficiency and the other photodiode has a lower light-receiving efficiency. A use of two signals from a pair of photodiodes as separate image data enables a simultaneous capturing of two images.

In using one imaging element having two photoelectric conversion units with different light-receiving efficiencies to simultaneously capture two images, however, it is difficult to optimize exposures of two images at the same time because of the common aperture. In particular, when different shutter speeds are set for two images, optimizing the exposure of one of the two images results in overexposure or underexposure of the other.

SUMMARY OF THE INVENTION

According to one aspect of the present invention, provided is an imaging device including: an imaging element having a first photoelectric conversion unit and a second photoelectric conversion unit, in which a light-receiving efficiency of the second photoelectric conversion unit is lower than a light-receiving efficiency of the first photoelectric conversion unit; an optics that guides a light flux from an object to the imaging element; and a control unit that selects a combination of the first photoelectric conversion unit and the second photoelectric conversion unit used for a motion image capturing and a static image capturing in accordance with a brightness of the object.

Further features of the present invention will become apparent from the following description of exemplary embodiments with reference to the attached drawings.

BRIEF DESCRIPTION OF THE DRAWINGS

FIG. 1A and FIG. 1B are external views of an imaging device according to a first embodiment of the present invention.

FIG. 2 is a block diagram illustrating a general configuration of the imaging device according to the first embodiment of the present invention.

FIG. 6A and FIG. 6B are diagrams illustrating an imaging optics and the imaging element in the imaging device according to the first embodiment of the present invention.

FIG. 7A, FIG. 7B, and FIG. 7C are schematic diagrams illustrating image signals output from the imaging elements.

FIG. 20 is a diagram illustrating a view of a display unit during a live view display after the imaging device is powered on.

DESCRIPTION OF THE EMBODIMENTS

Figure 3:
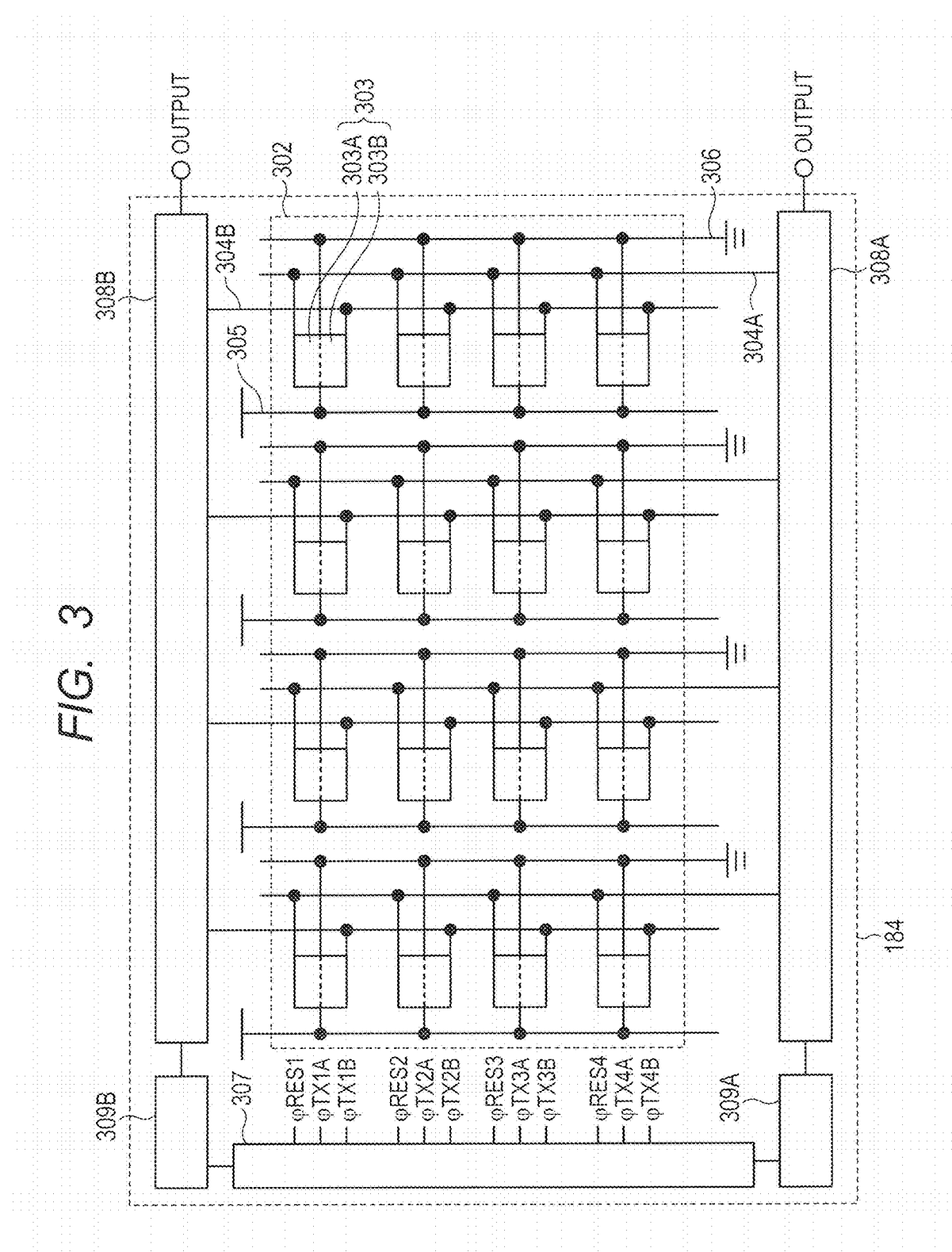
FIG. 3 is a block diagram illustrating a configuration example of an imaging element of the imaging device according to the first embodiment of the present invention.

Preferred embodiments of the present invention will now be described in detail in accordance with the accompanying drawings.

First Embodiment

An imaging device according to the first embodiment of the present invention will be described by using FIG. 1 to FIG. 23. In the present embodiment, an imaging device in which an imaging optics and the like for a capturing is added to an image processing device adapted to process image signals output from an imaging element will be described as an example of a preferred embodiment of the present invention. However, the image processing device is not necessarily configured as a part of the imaging device and may instead be formed of hardware that is different from the imaging element or an imaging optics. Further, all of or a part of the functions of the image processing device may be installed in the imaging element.

FIG. 1A and FIG. 1B are external views of a digital still motion camera as an example of the imaging device according to the present embodiment. FIG. 1A illustrates a front view and FIG. 1B illustrates a backside view of the digital still motion camera.

An imaging device 100 according to the present embodiment has a housing 151, an imaging optics 152 provided to the front face of the housing 151, a switch ST 154 provided on the top face of the housing 151, and a propeller 162. Further, the imaging device 100 has a display unit 153, a switch MV 155, a capturing mode selection lever 156, a menu button 157, up/down switches 158 and 159, a dial 160, and a playback button 161 on the back face of the housing 151.

The housing 151 is an enclosure that accommodates various functional parts of the imaging device 100 such as the imaging element, a shutter device, and the like. The imaging optics 152 is an optics for capturing an optical image of an object. The display unit 153 is formed of a display device for displaying capturing information and/or one or more images. The display unit 153 may be provided with a movable mechanism for changing the orientation of a screen as necessity. The display unit 153 has a display intensity range that is sufficient for displaying even an image having a wide dynamic range without suppressing the intensity range thereof. The switch ST 154 is a shutter button used for mainly capturing a static image. The switch MV 155 is a button for starting and stopping a motion image capturing. The capturing mode selection lever 156 is a selection switch for selecting a capturing mode. The menu button 157 is a button for entering a function setting mode for setting a function of the imaging device 100. The up/down switches 158 and 159 are buttons used in changing various setting values. The dial 160 is a dial for changing various setting values. The playback button 161 is a button for entering a playback mode that causes an image stored in a storage medium accommodated in the imaging device 100 to be played back on the display unit 153. The propeller 162 is adapted to cause the imaging device 100 to float in the air for capturing an image from the air.

FIG. 2 is a block diagram illustrating the general configuration of the imaging device 100 according to the present embodiment. As illustrated in FIG. 2, the imaging device 100 has an aperture 181, an aperture controller 182, an optical filter 183, an imaging element 184, analog frontends 185 and 186, digital signal processors 187 and 188, and a timing generator 189. Further, the imaging device 100 has a system control CPU 178, a switch input 179, an image memory 190, and a flight control device 200. Further, the imaging device 100 has a display interface unit 191, a storage interface unit 192, a storage medium 193, a print interface unit 194, an external interface unit 196, and a wireless interface unit 198.

The imaging element 184 is adapted to convert an optical image of an object captured via the imaging optics 152 into an electrical image signal. Without being limited to a particular element, the imaging element 184 has such a number of pixels, a signal readout speed, a color gamut, and a dynamic range that are sufficient for satisfying the Ultra High Definition Television (UHDTV) specification. The aperture 181 is adapted to adjust the amount of a light passing through the imaging optics 152. The aperture controller 182 is adapted to control the aperture 181. The optical filter 183 is adapted to restrict a wavelength of a light entering the imaging element 184 and a space frequency traveling to the imaging element 184. The imaging optics 152, the aperture 181, the optical filter 183, and the imaging element 184 are arranged on an optical axis 180 of the imaging optics 152.

The analog frontends 185 and 186 are adapted to perform an analog signal processing and an analog-to-digital conversion of image signals output from the imaging element 184. The analog frontends 185 and 186 are formed of, for example, a correlated double sampling (CDS) circuit that removes noise, an amplifier that adjusts a signal gain, an A/D convertor that converts an analog signal into a digital signal, and the like. The digital signal processors 187 and 188 are adapted to apply various corrections to digital image data output from the analog frontends 185 and 186 and then compress the image data. The timing generator 189 is adapted to output various timing signals to the imaging element 184, the analog frontends 185 and 186, the digital signal processors 187 and 188. The system control CPU 178 is a controller that integrates execution of various calculations and entire control of the imaging device 100. The image memory 190 is adapted to temporarily store image data.

The display interface unit 191 is an interface that is provided between the system control CPU 178 and the display unit 153 and adapted to display a captured image on the display unit 153. The storage medium 193 is a storage medium such as a semiconductor memory for storing image data, additional data, and the like, and may be equipped to the imaging device 100 or may be removable. The storage interface unit 192 is an interface that is provided between the system control CPU 178 and the storage medium 193 and adapted to perform storage to the storage medium 193 or readout from the storage medium 193. The external interface 196 is an interface that is provided between the system control CPU 178 and external equipment adapted to communicate with the external equipment such as an external computer 197. The print interface unit 194 is an interface that is provided between the system control CPU 178 and a printer 195 and adapted to output a captured image to the printer 195 such as a compact inkjet printer for printing. The wireless interface unit 198 is an interface that is provided between the system control CPU 178 and a network 199 and adapted to communicate with the network 199 such as the internet. The switch input 179 includes the switch ST 154, the switch MV 155, and a plurality of switches for performing switching among various modes. The flight control device 200 is a control device for controlling the propeller 162 to fly the imaging device 100 for performing a capturing from the air.

FIG. 3 is a block diagram illustrating a configuration example of the imaging element 184. As illustrated in FIG. 3, the imaging element 184 includes a pixel array 302, a vertical scanning circuit 307, readout circuits 308A and 308B, and timing control circuits 309A and 309B.

A plurality of pixels 303 are arranged in a matrix in the pixel array 302. Note that, although a large number of the pixels 303 are included in the pixel array 302 in an actual implementation in general, only 16 pixels 303 arranged in a matrix with four rows by four columns are illustrated for simplifying the drawing in this example. Each of the plurality of pixels 303 has a pair of a pixel element 303A and a pixel element 303B. In FIG. 3, the upper area of the pixel 303 is denoted as the pixel element 303A and the lower area of the pixel 303 is denoted as the pixel element 303B. The pixel element 303A and the pixel element 303B each generate a signal by photoelectric conversion.

Signal output lines 304A and 304B extending in the column direction are provided on each column of the pixel array 302. The signal output line 304A on each column is connected to the pixel elements 303A that are associated with that column. Signals from the pixel elements 303A are output to the signal output line 304A. The signal output line 304B on each column is connected to the pixel elements 303B associated with that column. Signals from the pixel elements 303B are output to the signal output line 304B. A power source line 305 and a ground line 306 extending in the column direction are provided on each column of the pixel array 302. The power source line 305 and the ground line 306 on each column are connected to the pixels 303 that are associated with that column. The power source line 305 and the ground line 306 may be signal lines extending in the row direction.

The vertical scanning circuit 307 is arranged adjacent in the row direction to the pixel array 302. The vertical scanning circuit 307 outputs predetermined control signals for controlling readout circuits within the pixels 303 on a row basis to the plurality of pixels 303 of the pixel array 302 via control lines (not illustrated) arranged extending in the row direction. FIG. 3 depicts a reset pulse φRESn and transfer pulses φTXnA and TXnB as control signals (n is an integer corresponding to the row number).

The readout circuits 308A and 308B are arranged adjacent to the pixel array 302 in the column direction so as to interpose the pixel array 302. The readout circuit 308A is connected to the signal output line 304A on each column. By selectively activating the signal output lines 304A on respective columns in a sequential manner, the readout circuit 308A sequentially reads out signals from the signal output lines 304A on respective columns and performs a predetermined signal processing. In the same manner, the readout circuit 308B is connected to the signal output line 304B on each column. By selectively activating the signal output lines 304B on respective columns in a sequential manner, the readout circuit 308B sequentially reads out signals from the signal output lines 304B on respective columns and performs a predetermined signal processing. The readout circuits 308A and 308B may include a noise removal circuit, an amplification circuit, an analog-to-digital conversion circuit, a horizontal scanning circuit, and the like, respectively, and sequentially outputs signals that has been subjected to such a predetermined signal processing.

The timing control circuit 309A is connected to the vertical scanning circuit 307 and the readout circuit 308A. The timing control circuit 309A outputs a control signal that controls a driving timing of the vertical scanning circuit 307 and the readout circuit 308A. The timing control circuit 309B is connected to the vertical scanning circuit 307 and the readout circuit 308B. The timing control circuit 309B outputs a control signal that controls a driving timing of the vertical scanning circuit 307 and the readout circuit 308B.

Figure 4:
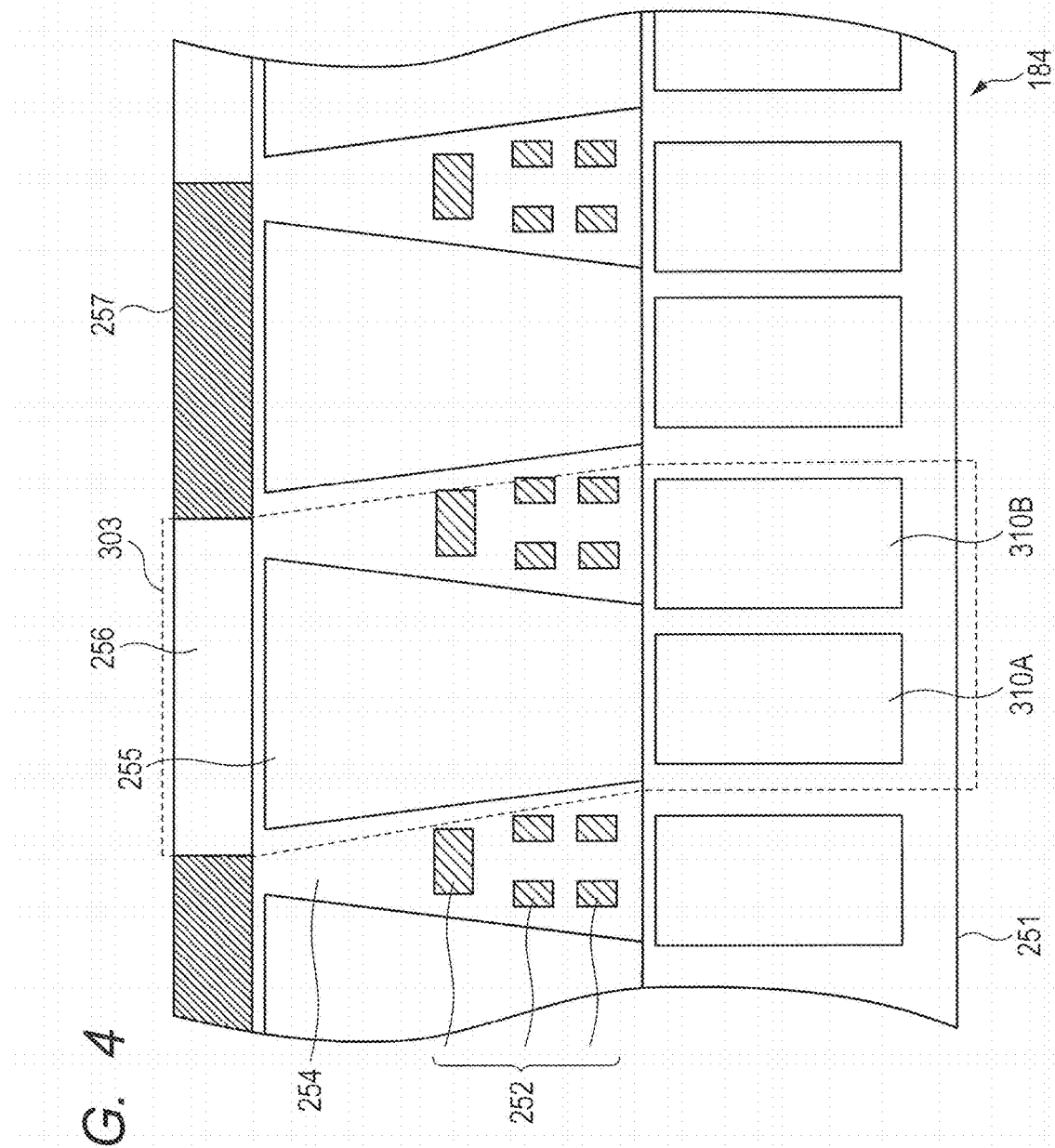
FIG. 4 is a sectional view illustrating internal structure of the imaging element in the imaging device according to the first embodiment of the present invention.

FIG. 4 is a sectional view illustrating the internal structure of the pixels 303 of the imaging element 184. As illustrated in FIG. 4, each of the pixels 303 includes two photodiodes 310A and 310B, a light guide 255, and a color filter 256. The photodiode 310A forms a part of the pixel element 303A, and the photodiode 310B forms a part of the pixel element 303B. The photodiodes 310A and 310B are provided inside a silicon substrate 251. The light guide 255 is provided inside an insulating layer 254 provided on the silicon substrate 251. The insulating layer 254 is formed of silicon oxide, for example, and the light guide 255 is formed of a material such as silicon nitride whose refractive index is higher than that of the insulating layer 254, for example. A wiring layer 252 is provided in the insulating layer 254 between the light guides 255. On the light guide 255, a color filter 256 having a predetermined spectral transmission factor characteristics is provided. Note that FIG. 4 depicts an example in which color filters for two neighboring pixels 303 are formed of color filters 256 and 257 whose spectral transmission factor characteristics are different from each other.

The light guide 255 has a property of confining a light therein due to a difference in the refractive index from the insulating layer 254. This allows an incident light through the color filter 256 to be guided to the photodiodes 310A and 310B by the light guide 255. The photodiodes 310A and 310B are arranged asymmetrically with respect to the light guide 255, and a light flux that has traveled through the light guide 255 enters the photodiode 310A at a high efficiency and enters the photodiode 310B at a low efficiency. Furthermore, the light guide 255 is configured such that, with adjustment of the depth and the taper angle thereof, unbalance is eliminated in the incident angle property with respect to the incident light flux that can be effectively photoelectrically-converted by the photodiodes 310A and 310B.

Figure 5:
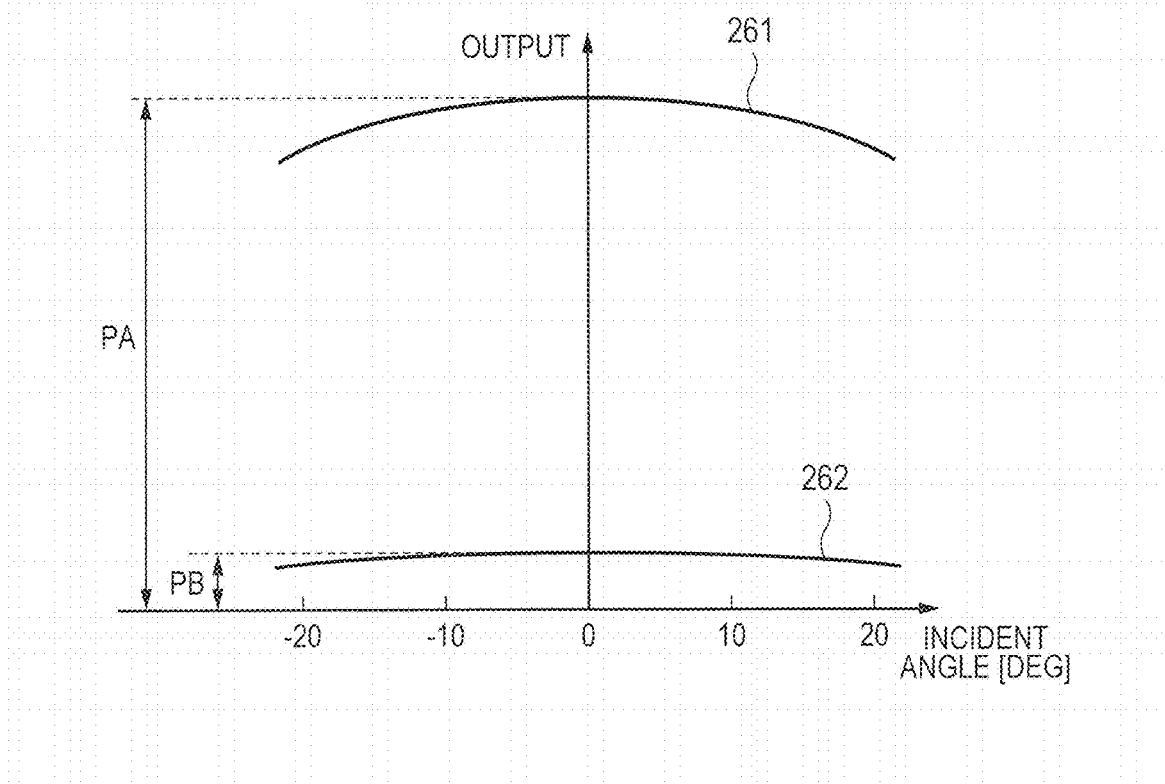
FIG. 5 is a graph illustrating a relationship between an angle of a light beam entering a pixel and an output from a photodiode.

FIG. 5 is a graph illustrating a relationship between an incident angle of a light beam entering a pixel and an output from a photodiode. In FIG. 5, the horizontal axis represents an incident angle of a light beam entering a pixel, and the vertical axis represents an output from a photodiode. FIG. 5 illustrates an output characteristics 261 from the photodiode 310A and an output characteristics 262 from the photodiode 310B.

As illustrated in FIG. 5, the output characteristics 261 and the output characteristics 262 each have a symmetrical, slightly convex shape having a peak when the incident angle of a light beam is zero. Further, a peak intensity PB of the output characteristics 262 is around one-eighth a peak intensity PA of the output characteristics 261. This means that the photodiodes 310A and 310B each have little dependency on the incident angle and the photodiode 310B has one-eighth the light-receiving efficiency of the photodiode 310A. That is, this means that, in terms of a setting value of the ISO sensitivity, the photodiode 310B has a sensitivity that is lower by three steps than that of the photodiode 310A.

Next, a relationship between the imaging optics 152 and the imaging element 184 will be described in further details by using FIG. 6A and FIG. 6B. FIG. 6A and FIG. 6B are diagrams illustrating a relationship between the imaging optics 152 and the imaging element 184. FIG. 6A is a diagram of the imaging optics 152 when viewed from the direction of the optical axis 180 thereof. FIG. 6B is a diagram illustrating a portion from the imaging optics 152 to the imaging element 184 of FIG. 2 in further details.

It is assumed that the imaging element 184 includes a pixel 276 located in the center of a capturing area and a pixel 277 located near an outer edge of the capturing area as illustrated in FIG. 6A. In this case, the pixel 276 can receive light fluxes from an area surrounded by a light beam 272 and a light beam 273. Further, the pixel 277 can receive light fluxes from an area surrounded by a light beam 274 and a light beam 275. In this case, since a field lens 270 is arranged between the optical filter 183 and the imaging optics 152, a light flux received by the pixel 276 and a light flux received by the pixel 277 overlap as depicted by an area 271 in FIG. 6A near the imaging optics 152. As a result, it is possible for any of the pixels to receive a light flux from the imaging optics 152 at a high efficiency.

FIG. 7A, FIG. 7B, and FIG. 7C are schematic diagrams illustrating image signals output from the imaging element. Let us assume here a case where a color filter having a predetermined spectral transmission factor characteristics is arranged according to a color filter alignment 281 illustrated in FIG. 7A in the pixel array 302. FIG. 7A schematically depicts the pixel array 302 in which the pixels 303 are aligned in a matrix of six rows by eight columns and respective colors of a color filter arranged in respective pixels. In FIG. 7A, each R represents a red color filter, each of G1 and G2 represents a green color filter, and each B represents a blue color filter. The depicted color filter alignment 281 is a color filter alignment that is a so called Bayer arrangement, in which color filters in respective colors are arranged with repetition such as "G1, B, G1, B . . . ", "R, G2, R, G2 . . . " "G1, B, G1, B . . . ", and " . . . " on a row basis.

From the pixel array 302 having such the color filter alignment 281, output data 282 and 283 illustrated in FIG. 7B and FIG. 7C are obtained. In FIG. 7B, each of g1A and g2A represents an output from the pixel elements 303A of the pixels 303 on which a green color filter is arranged. Each bA represents an output from the pixel elements 303A of the pixels 303 on which a blue color filter is arranged. Each rA represents an output from the pixel elements 303A of the pixels 303 on which a red color filter is arranged. In FIG. 7C, each of g1B and g2B represents an output from the pixel elements 303B of the pixels 303 on which a green color filter is arranged. Each bB represents an output from the pixel elements 303B of the pixels 303 on which a blue color filter is arranged. Each rB represents an output from the pixel elements 303B of the pixels 303 on which a red color filter is arranged.

As having been described by using FIG. 3, two outputs from the readout circuits 308A and 308B are obtained from the imaging element 184, one of which is the output data 282 illustrated in FIG. 7B and the other is the output data 283 illustrated in FIG. 7C. The output data 282 will be an image signal "picture A" after predetermined signal processing. Also, the output data 283 will be an image signal "picture B" after predetermined signal processing. In the following description, an image signal based on the output data 282 is denoted as "picture A" and an image signal based on the output data 283 is denoted as "picture B". Note that, although "picture A", and "picture B" are image signals after subjected to a predetermined process such as a correction in a strict sense, image signals before a correction or during a correction may also be denoted as "picture A" and "picture B" for simplified illustration. Further, images obtained based on the image signals "picture A" and "picture B" may also be denoted as "picture A" and "picture B", respectively.

Figure 8:
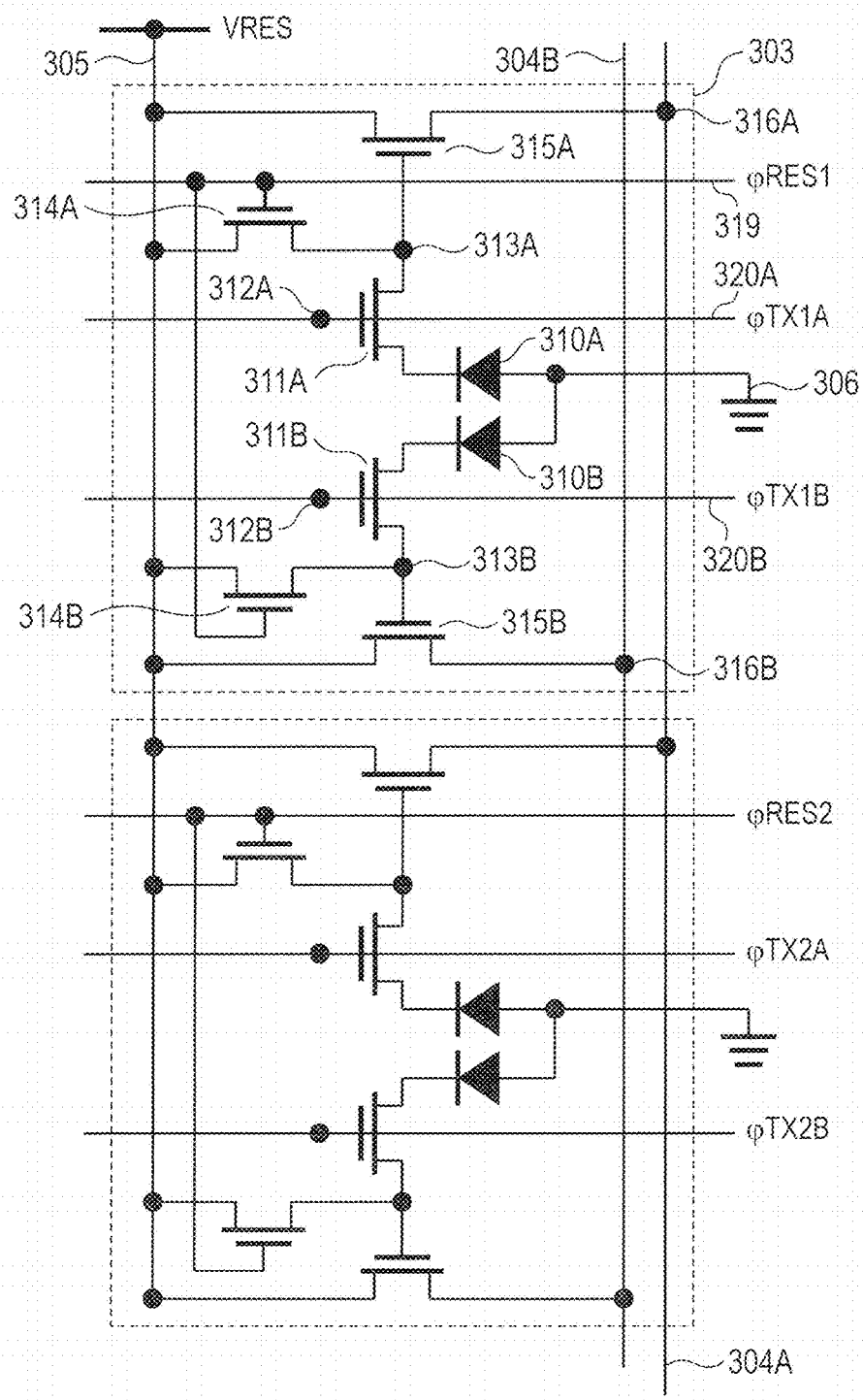
FIG. 8 is a circuit diagram illustrating a configuration example of pixels of the imaging element of the imaging device according to the first embodiment of the present invention.

FIG. 8 is a circuit diagram illustrating a configuration example of the pixel 303. The pixel 303 has the pixel element 303A and the pixel element 303B as described above. The pixel element 303A has a photodiode 310A, a transfer transistor 311A, a floating diffusion region 313A, a reset transistor 314A, and an amplification transistor 315A. The pixel element 303B has a photodiode 310B, a transfer transistor 311B, a floating diffusion region 313B, a reset transistor 314B, and an amplification transistor 315B. Note that the photodiode 310A corresponds to the photodiode 310A illustrated in FIG. 4 and the photodiode 310B corresponds to the photodiode 310B illustrated in FIG. 4.

The anode of the photodiode 310A is connected to the ground line 306, and the cathode of the photodiode 310A is connected to the source of the transfer transistor 311A. The drain of the transfer transistor 311A is connected to the source of the reset transistor 314A and the gate of the amplification transistor 315A. A connection node of the drain of the transfer transistor 311A, the source of the reset transistor 314A, and the gate of the amplification transistor 315A forms a first floating diffusion region 313A. The drain of the reset transistor 314A and the drain of the amplification transistor 315A are connected to the power source line 305. The source of the amplification transistor 315A forming a pixel signal output portion 316A is connected to the signal output line 304A.

In the same manner, the anode of the photodiode 310B is connected to the ground line 306, and the cathode of the photodiode 310B is connected to the source of the transfer transistor 311B. The drain of the transfer transistor 311B is connected to the source of the reset transistor 314B and the gate of the amplification transistor 315B. A connection node of the drain of the transfer transistor 311B, the source of the reset transistor 314B, and the gate of the amplification transistor 315B forms a second floating diffusion region 313B. The drain of the reset transistor 314B and the drain of the amplification transistor 315B are connected to the power source line 305. The source of the amplification transistor 315B forming a pixel signal output portion 316B is connected to the signal output line 304B.

The pixels 303 on each column are connected to a reset control line 319 and transfer control lines 320A and 320B arranged in the row direction from the vertical scanning circuit 307. The reset control line 319 is connected to the gate of the reset transistor 314A and the gate of the reset transistor 314B. The transfer control line 320A is connected to the gate of the transfer transistor 311A via a contact portion 312A. The transfer control line 320B is connected to the gate of the transfer transistor 311B via a contact portion 312B. The reset control line 319 supplies, to the gate of the reset transistor 314A and the gate of the reset transistor 314B, the reset pulse φRESn output from the vertical scanning circuit 307. The transfer control line 320A supplies, to the gate of the transfer transistor 311A, the transfer pulse φTXnA output from the vertical scanning circuit 307. The transfer transistor line 320B supplies, to the gate of the transfer transistor 311B, the transfer pulse φTXnB output from the vertical scanning circuit 307. Note that the number n added in the reset pulse ϕRESn, the transfer pulse ϕTXnA, and the transfer pulse ϕTXnB is an integer corresponding to the row number. FIG. 8 depicts labels in which n is replaced with the number corresponding to the row number.

The photodiode 310A is a first photoelectric conversion unit that generates charges by photoelectric conversion, and the photodiode 310B is a second photoelectric conversion unit that generates charges by photoelectric conversion. The floating diffusion regions 313A and 313B are regions that accumulate charges. The transfer transistor 311A is adapted to transfer charges generated by the photodiode 310A to the floating diffusion region 313A. The transfer transistor 311B is adapted to transfer charges generated by the photodiode 310B to the floating diffusion region 313B.

In response to an output of a high-level transfer pulse ϕTXnA from the vertical scanning circuit 307, the transfer transistor 311A is turned on and the photodiode 310A and the floating diffusion region 313A are connected to each other. In the same manner, in response to an output of a high-level transfer pulse ϕTXnB from the vertical scanning circuit 307, the transfer transistor 311B is turned on and the photodiode 310B and the floating diffusion region 313B are connected to each other. In response to an output of a high-level reset pulse ϕRESn from the vertical scanning circuit 307, the reset transistors 314A and 314B are turned on and the photodiodes 310A and 310B and the floating diffusion regions 313A and 313B are reset.

In response to an output of a low-level transfer pulse ϕTXnA from the vertical scanning circuit 307, the transfer transistor 311A is turned off and the photodiode 310A starts accumulation of signal charges generated by photoelectric conversion. Subsequently, in response to an output of a high-level transfer pulse ϕTXnA from the vertical scanning circuit 307, the transfer transistor 311A is turned on and the signal charges of the photodiode 310A are transferred to the floating diffusion region 313A. In response, the amplification transistor 315A amplifies an input that is based on a voltage value of the floating diffusion region 313A in accordance with the amount of signal charges transferred from the photodiode 310A and outputs the amplified input to the signal output line 304A.

In the same manner, in response to an output of a low-level transfer pulse ϕTXnB from the vertical scanning circuit 307, the transfer transistor 311B is turned off and the photodiode 310B starts accumulation of signal charges generated by photoelectric conversion. Subsequently, in response to an output of a high-level transfer pulse ϕTXnB from the vertical scanning circuit 307, the transfer transistor 311B is turned on and the signal charges of the photodiode 310B are transferred to the floating diffusion region 313B. In response, the amplification transistor 315B amplifies a voltage of the floating diffusion region 313B in accordance with the amount of signal charges transferred from the photodiode 310B and outputs the amplified voltage to the signal output line 304B.

Figure 9:
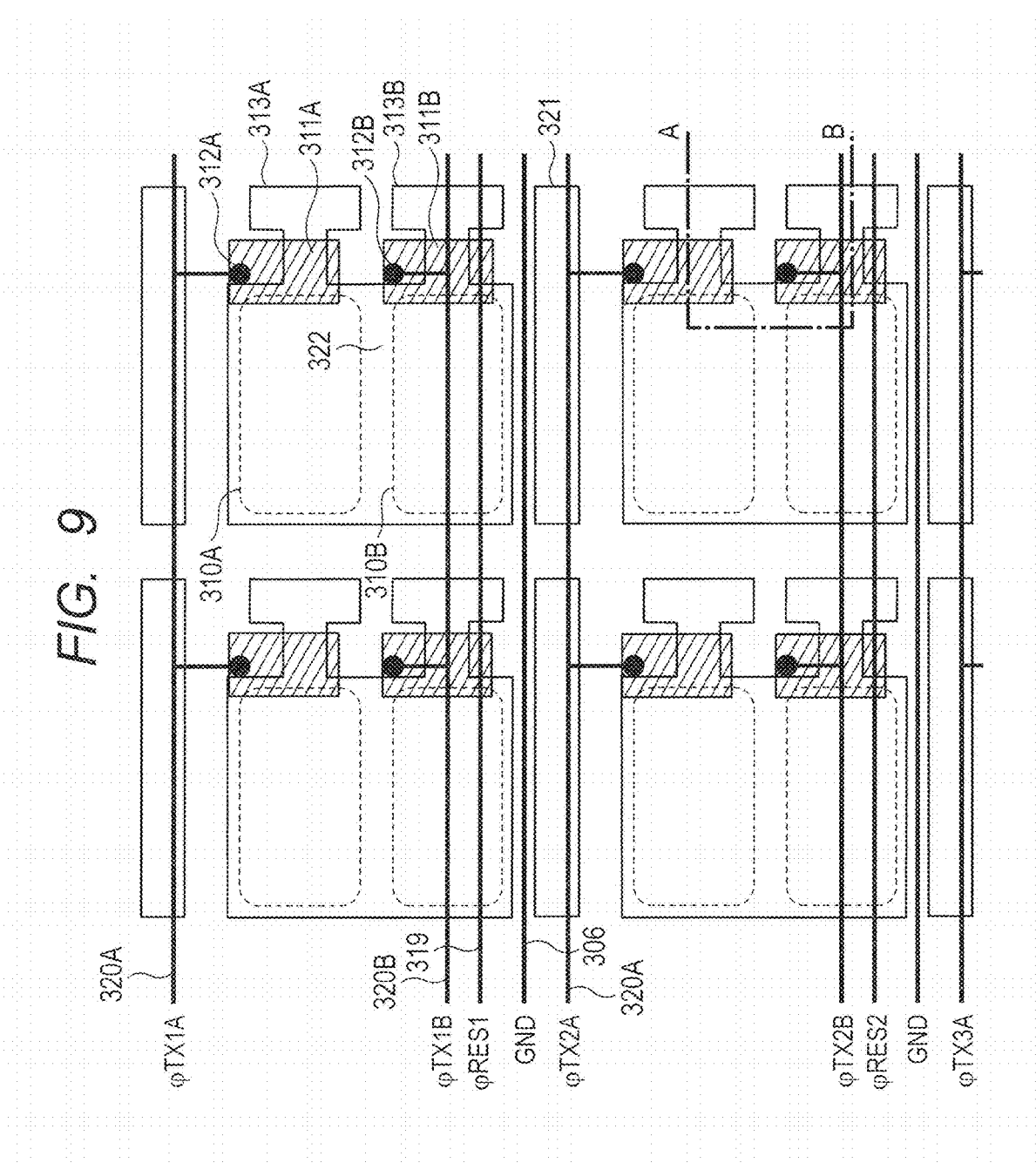
FIG. 9 is a plan layout diagram illustrating a primary portion of the pixels of the imaging element of the imaging device according to the first embodiment of the present invention.
Figure 10:
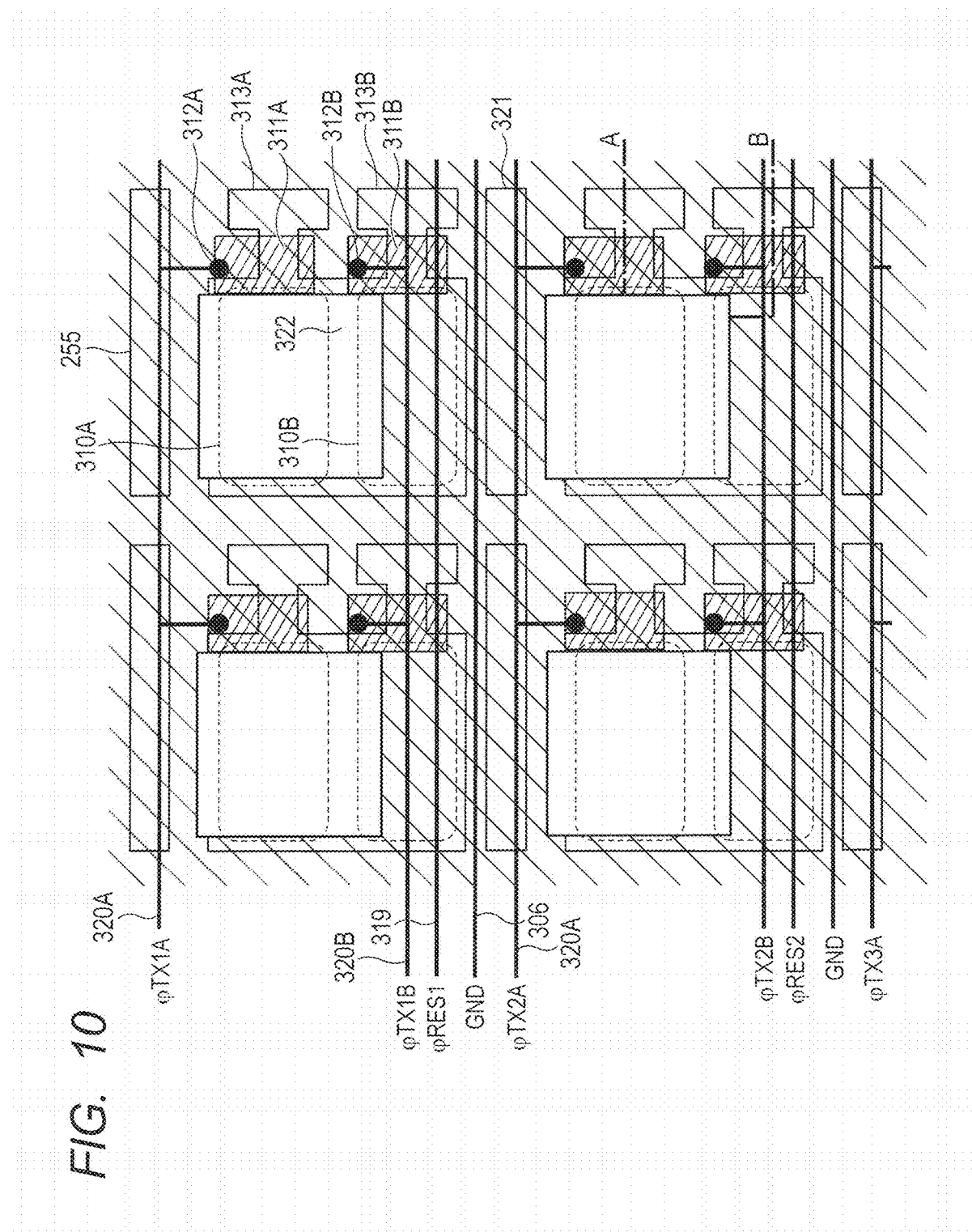
FIG. 10 is a plan layout diagram illustrating a primary portion of the pixels of the imaging element of the imaging device according to the first embodiment of the present invention.

FIG. 9 and FIG. 10 is a plan layout diagram illustrating a primary portion of the pixels 303. FIG. 9 illustrates the photodiodes 310A and 310B, the transfer transistors 311A and 311B, and the floating diffusion regions 313A and 313B of the components of the pixel 303. Other circuit elements including the reset transistors 314A and 314B and the amplification transistors 315A and 315B are represented as a readout circuit unit 321 in FIG. 9 and FIG. 10, and the detailed depiction thereof is omitted. Further, the signal output lines 304A and 304B and the power source line 305 arranged in the vertical direction of the pixels 303 are omitted and contact points of the reset control line 319, the power source line 305, and the ground line 306 are omitted. FIG. 10 depicts the light guide 255 illustrated in FIG. 4 in addition to the components illustrated in FIG. 9. In the light guide 255, a hatched portion indicates a low refractive index area and white portions indicate high refractive index areas, that is, light guide portions.

In FIG. 9 and FIG. 10, the contact point 312A is a contact point that connects the transfer control line 320A to the gate of the transfer transistor 311A. The contact point 312B is a contact point that connects the transfer control line 320B to the gate of the transfer transistor 311B. Each of the photodiodes 310A and 310B is a photoelectric conversion unit that performs photoelectric conversion and has a first conduction type (for example, P type) semiconductor region and a second conduction type (for example, N type) semiconductor region (an N type electron accumulation region) forming a PN junction with the first conduction type semiconductor region. The second conduction type semiconductor region of the photodiode 310A and the second conduction type semiconductor region of the photodiode 310B are separated from each other by a separation portion 322.

The transfer transistors 311A and 311B, the contact points 312A and 312B, and the transfer control lines 320A and 320B are arranged in a symmetrical manner or substantially a symmetrical manner with respect to the separation portion 322 located between the photodiodes 310A and 310B, respectively. On the other hand, the light guide 255 is arranged in a position asymmetrical with respect to the separation portion 322 as illustrated in FIG. 10. That is, while the photodiode 310A occupies a large area of a bottom portion of the light guide 255, the photodiode 310B only slightly overlaps with the bottom portion of the light guide 255. As a result, the light-receiving efficiency of the photodiode 310A is higher and the light-receiving efficiency of the photodiode 310B is lower.

In the imaging element 184 according to the present embodiment, the ratio of the light-receiving efficiencies of the photodiodes 310A and 310B is set to around 8:1, that is, the difference of the sensitivity is set to around three steps. Further, almost the same level of signal charges are obtained in pixel elements while two images are captured with different accumulation time settings, which contributes to provide both images having a good S/N ratio and causing less feeling of noise or allow a high quality HDR image to be synthesized. Details thereof will be described later.

Figure 11:
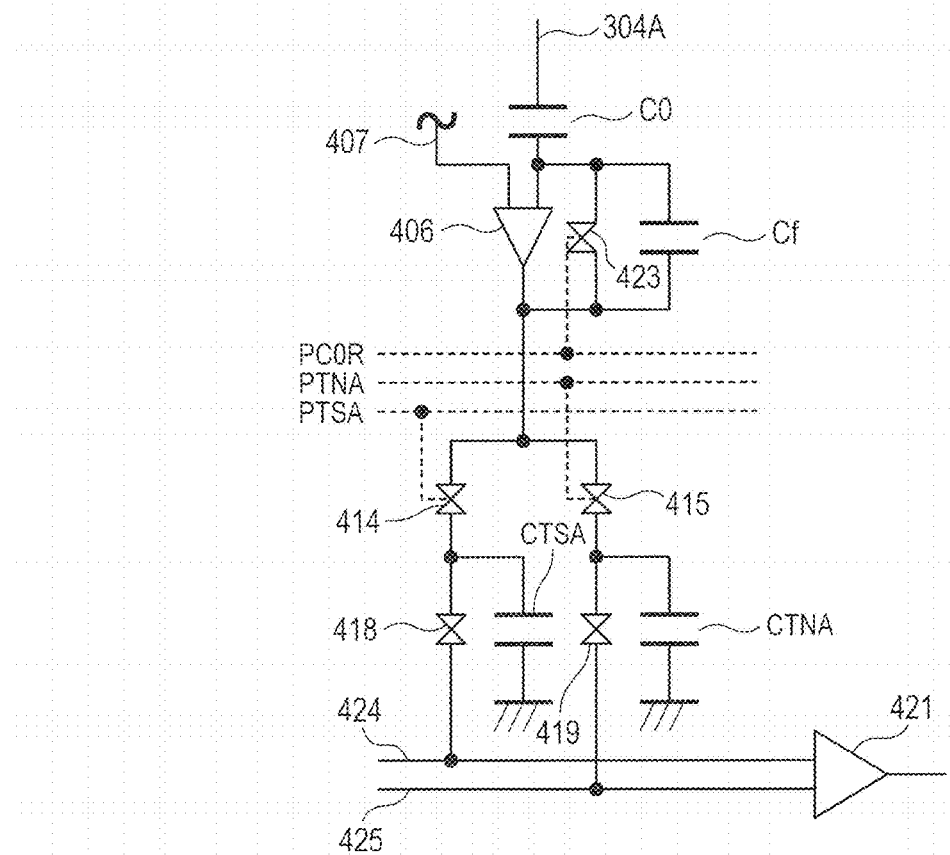
FIG. 11 is a circuit diagram illustrating a configuration example of a readout circuit of the imaging element of the imaging device according to the first embodiment of the present invention.

FIG. 11 is a circuit diagram illustrating a configuration example of a readout circuit of the imaging element 184. Note that, in FIG. 11, reference numerals of some components are labeled with "A" in the ends thereof preparing for a case of the readout circuit 308A. It should be understood that, in a case of the readout circuit 308B, corresponding reference numerals will be labeled with "B" in the ends thereof.

As illustrated in FIG. 11, the readout circuit 308A includes a clamp capacitor C0, a feedback capacitor Cf, an operational amplifier 406, a reference voltage source 407, and a switch 423. One of the input terminals of the operational amplifier 406 is connected to the signal output line 304A via the clamp capacitor C0. The feedback capacitor Cf and the switch 423 are connected in parallel between the one of the input terminals and the output terminal of the operational amplifier 406. The other input terminal of the operational amplifier 406 is connected to a reference voltage source 407. The reference voltage source 407 is adapted to supply a reference voltage Vref to the operational amplifier 406. The switch 423 is a switch controlled by a signal PC0R and is turned on to short-circuit both ends of the feedback capacitor Cf when the signal PC0R is a high level.

The readout circuit 308A further includes switches 414, 415, 418, and 419, a capacitor CTSA, a capacitor CTNA, horizontal output lines 424 and 425, and an output amplifier 421. The switches 414 and 415 are switches adapted to control writing of pixel signals to the capacitors CTSA and CTNA. The switch 414 is a switch controlled by a signal PTSA and is turned on to connect the output terminal of the operational amplifier 406 to the capacitor CTSA when the signal PTSA is a high level. The switch 415 is a switch controlled by a signal PTNA and is turned on to connect the output terminal of the operational amplifier 406 to the capacitor CTNA when the signal PTNA is a high level.

The switches 418 and 419 are switches adapted to control outputs of pixel signals held in the capacitors CTSA and CTNA to the output amplifier 421. The switches 418 and 419 are turned on in response to control signals from a horizontal shift resistor. This causes a signal written to the capacitor CTSA to be output to the output amplifier 421 via the switch 418 and the horizontal output line 424. Further, a signal written to the capacitor CTNA is output to the output amplifier 421 via the switch 419 and the horizontal output line 425. The signal PC0R, the signal PTNA, and the signal PTSA are signals supplied from the timing generator 189 under the control of the system control CPU 178.

The readout circuit 308B also has the same configuration as that of the readout circuit 308A. Further, a signal PTNB and a signal PTSB in the following description are signals supplied from the timing generator 189 under the control of the system control CUP 178 and are responsible for the same functions as the signal PTNA and the signal PTSA in the readout circuit 308A.

Figure 12:
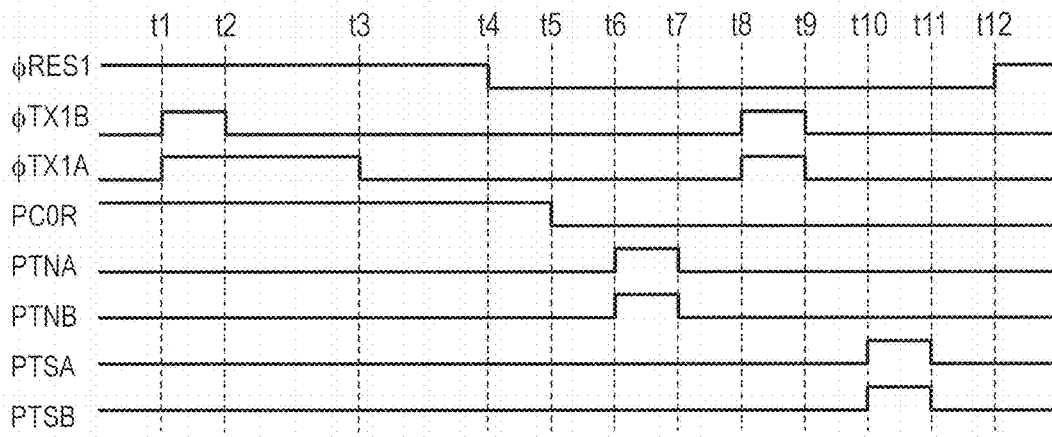
FIG. 12 is a timing chart illustrating a driving sequence of the imaging element.

Next, operations of reset, accumulation, and readout in the imaging element 184 will be described one by one with respect to an example of a readout operation from the pixels 303 on the first row by using a timing chart of FIG. 12.

First, at time t1, the vertical scanning circuit 307 causes the transfer pulses φTX1A and φTX1B output to the transfer control lines 320A and 320B to transition from a low level to a high level. Thereby, the transfer transistors 311A and 311B are turned on. At this time, a high-level reset pulse φRES1 is being output to the reset control line 319 from the vertical scanning circuit 307, and the reset transistors 314A and 314B are in an on-state, too. Thereby the photodiodes 310A and 310B are connected to the power source line 305 via the transfer transistors 311A and 311B and the reset transistors 314A and 314B resulting in a reset state. At this time, the floating diffusion regions 313A and 313B are also in a reset state.

Subsequently, at time t2, the vertical scanning circuit 307 causes the transfer pulse φTX1B to transition from a high level to a low level. Thereby, the transfer transistor 311B is turned off and accumulation of signal charges by photoelectric conversion starts in the photodiode 310B.

Subsequently, at time t3, the vertical scanning circuit 307 causes the transfer pulse φTX1A to transition from a high level to a low level. Thereby, the transfer transistor 311A is turned off and accumulation of signal charges by photoelectric conversion starts in the photodiode 310A.

Subsequently, at time t4, the vertical scanning circuit 307 causes the reset pulse φRES1 to transition from a high level to a low level. Thereby, the reset transistors 314A and 314B are turned off to unlatch the reset of the floating diffusion regions 313A and 313B.

Thereby, the potential of the floating diffusion region 313A is read out to the signal output line 304A via an amplification transistor 315A as a reset signal level and input to the readout circuit 308A. Also, the potential of the floating diffusion region 313B is read out to the signal output line 304B via an amplification transistor 315B as a reset signal level and input to the readout circuit 308B.

At the time t4, the signal PC0R of a high level is output to the readout circuit 308A and the readout circuit 308B from the timing generator 189, and the switch 423 is in an on-state. Thus, a pixel signal of a reset signal level is input from the pixel element 303A to the readout circuit 308A with the operational amplifier 406 buffering the output of the reference voltage Vref. Although not depicted, a pixel signal at a reset signal level is input also to the readout circuit 308B from the pixel element 303B in the same manner.

Subsequently, at time t5, the signal PC0R output from the timing generator 189 to the readout circuit 308A and the readout circuit 308B transitions from a high level to a low level to turn off the switch 423.

Subsequently, at time t6, the signal PTNA output from the timing generator 189 to the readout circuit 308A transitions from a low level to a high level to turn on the switch 415 and write the output at this time of the operational amplifier 406 to the capacitor CTNA. In the same manner, the signal PTNB output from the timing generator 189 to the readout circuit 308B transitions from a low level to a high level to turn on the switch 415 and write the output at this time of the operational amplifier 406 to the capacitor CTNB.

Subsequently, at time t7, the signal PTNA output from the timing generator 189 to the readout circuit 308A transitions from a high level to a low level to turn off the switch 415 and complete writing to the capacitor CTNA. In the same manner, the signal PTNB output from the timing generator 189 to the readout circuit 308B transitions from a high level to a low level to turn off the switch 415 and complete writing to the capacitor CTNB.

Subsequently, at time t8, the vertical scanning circuit 307 causes the transfer pulses φTX1A and φTX1B to transition from a low level to a high level to turn on the transfer transistors 311A and 311B. Thereby, signal charges accumulated in the photodiode 310A are transferred to the floating diffusion region 313A, and signal charges accumulated in the photodiode 310B are transferred to the floating diffusion region 313B.

At the time t8, the transfer pulses φTX1A and φTX1B are simultaneously set to a high level and thereby accumulation periods of the photodiodes 310A and 310B are completed at the same time, and this results in that readout operations are performed at the same time when both charges have been fully accumulated.

Subsequently, at time t9, the vertical scanning circuit 307 causes the transfer pulses φTX1A and φTX1B to transition from a high level to a low level from a high level to a low level to turn off the transfer transistors 311A and 311B. Thereby, readout of signal charges accumulated in the photodiode 310A to the floating diffusion region 313A and readout of signal charges accumulated in the photodiode 310B to the floating diffusion region 313B are completed.

Thereby, the potential of the floating diffusion region 313A changed by signal charges is read out to the signal output line 304A via the amplification transistor 315A as an optical signal level and input to the readout circuit 308A. Further, the potential of the floating diffusion region 313B changed by signal charges is read out to the signal output line 304B via the amplification transistor 315B as an optical signal level and input to the readout circuit 308B.

Then, in the readout circuit 308A, a voltage resulted after an inversion gain has been applied to a voltage change at a capacitance ratio of the clamp capacitor C0 and the feedback capacitor Cf is output from the operational amplifier 406. In the same manner, in the readout circuit 308B, a voltage resulted after an inversion gain has been applied to a voltage change at a capacitance ratio of the clamp capacitor C0 and the feedback capacitor Cf is output from the operational amplifier 406.

Subsequently, at time t10, the signal PTSA output from the timing generator 189 to the readout circuit 308A transitions from a low level to a high level to turn on the switch 414 and write the output at this time of the operational amplifier 406 to the capacitor CTSA. In the same manner, the signal PTSB output from the timing generator 189 to the readout circuit 308B transitions from a low level to a high level to turn on the switch 414 and write the output at this time of the operational amplifier 406 to the capacitor CTSB.

Subsequently, at time t11, the signal PTSA output from the timing generator 189 to the readout circuit 308A transitions from a high level to a low level to turn off the switch 414 and complete writing to the capacitor CTSA. In the same manner, the signal PTSB output from the timing generator 189 to the readout circuit 308B transitions from a high level to a low level to turn off the switch 414 and complete writing to the capacitor CTSB.

Subsequently, at time t12, the vertical scanning circuit 307 causes the reset pluses φRES1 to transition from a low level to a high level to turn on the reset transistors 314A and 314B. Thereby, the floating diffusion regions 313A and 313B are connected to the power source line 305 via the reset transistors 314A and 314B to enter a reset state.

Figure 13:
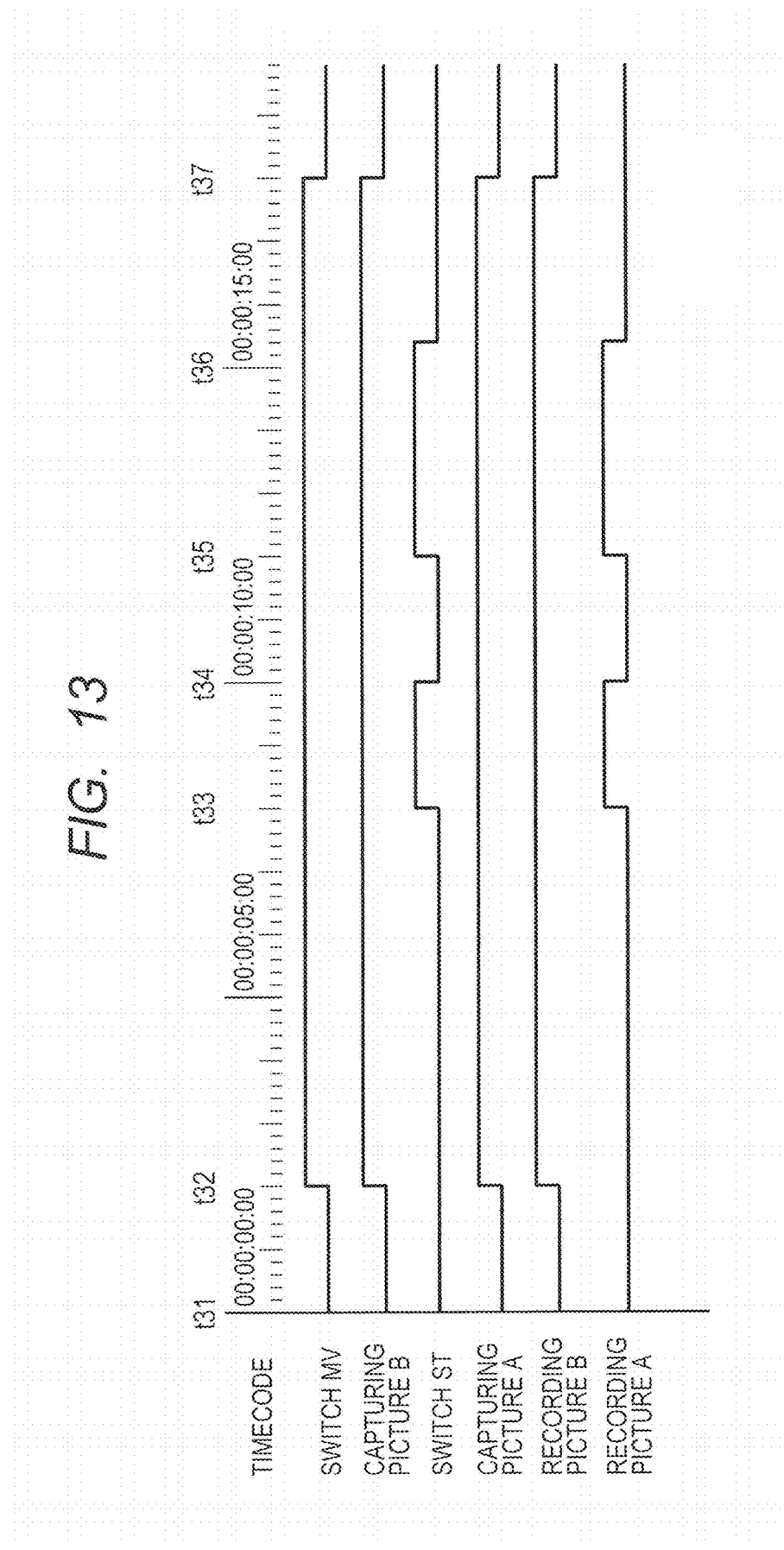
FIG. 13 is a timing chart illustrating a capturing sequence in the imaging device according to the first embodiment of the present invention.
Figure 14:
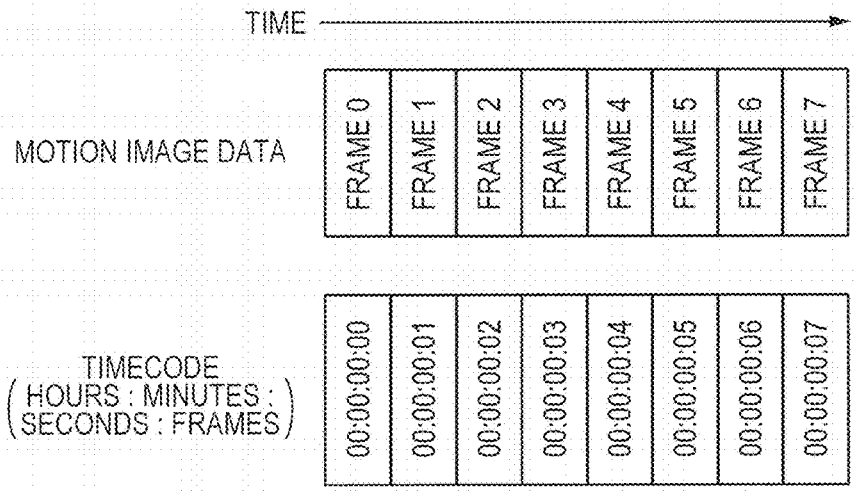
FIG. 14 is a diagram illustrating an example of timecode values added to each frame of capturing data of a motion image and a static image.

FIG. 13 is a timing chart for illustrating a capturing sequence in the imaging device according to the present embodiment. The uppermost "timecode" in FIG. 13 represents elapsed time from a power activation, in which "00:00:00:00" represents "hours:minutes:seconds:frames".

Time t31 is time of the power activation of the imaging device 100.

At time t32, the switch MV 155 that is a motion image capturing button is operated by a user and turned on. In response, a capturing of "picture B" and a capturing of "picture A" are started. In response to the switch MV 155 that is a motion image capturing button being operated, image data of "picture B" is recorded to the storage medium 193 after predetermined signal processing.

During a period from time t33 to time t34 and a period from time 35 to time t36, the switch ST 154 that is used for capturing of a static image is operated. In response, in these periods, image data of "picture A" is also recorded to the storage medium 193 after predetermined signal processing. Note that image data of "picture A" may be recorded to the storage medium 193 not only during the period from time t33 to time t34 and the period from time 35 to time t36 but also during the same period as for image data of "picture B".

For both "picture A" and "picture B", each image data stored in the storage medium 193 is a motion image of the same framerate, for example, 60 fps and a timecode in the NTSC system is added. Values of the timecodes added to each frame of a motion image data will be those illustrated in FIG. 14, for example.

Figure 15:
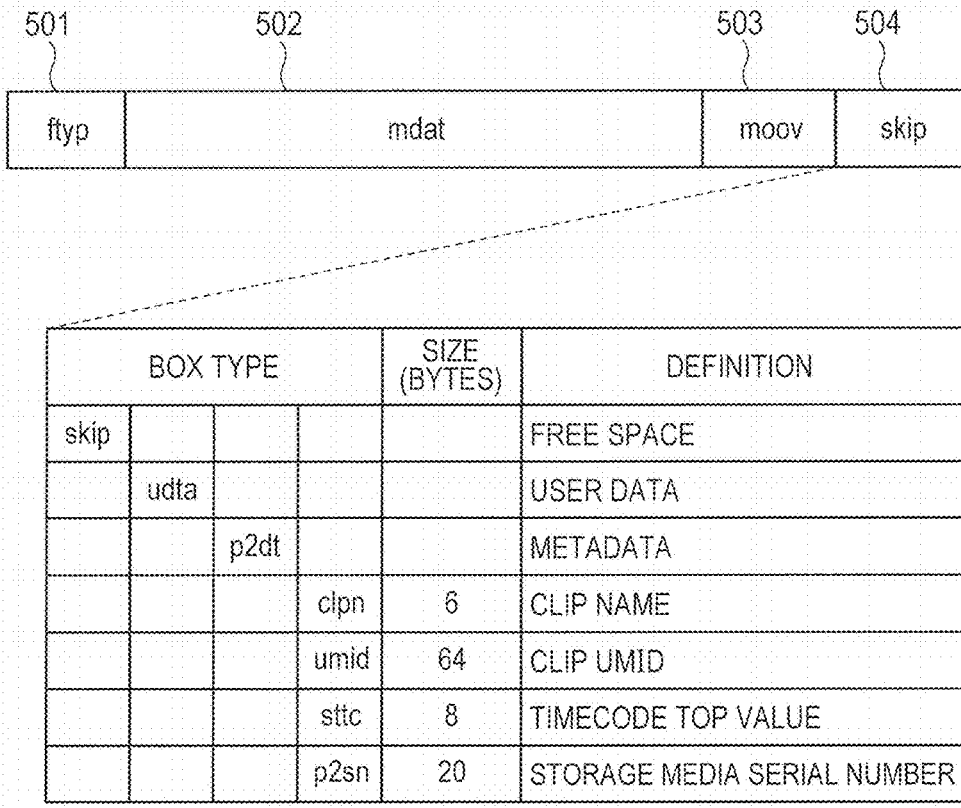
FIG. 15 is a diagram illustrating an example of file structure of capturing data of a motion image and a static image.

FIG. 15 is a diagram illustrating an example of file structure of image data of "picture A" and "picture B". Although an MP4 file is exemplified here as a format of image data, the format of image data is not limited thereto. The MP4 file format is standardized in ISO/IEC 14496-1/AMD6. All pieces of information are stored in a structure called Box and composed of multiplexed video and audio bit streams (media data) and management information for the media data (metadata). Each Box has a four-character identifier representing each Box type. A file type Box 501 (ftyp) is located in the top of a file and represents a Box for identifying a file. In a media data Box 502 (mdat), multiplexed video and audio bit streams are stored. In a movie Box 503 (moov), management information for reproducing bit streams stored in the media data Box is stored. A skip Box 504 (skip) is a Box for skipping over data stored within the skip Box 504 at reproduction.

In the skip Box 504, a clip name 508 of a clip including the image data file and a Unique Material Identifier (UMID) 509 (CLIP-UMID) of the clip provided to the material are stored. In the skip Box 504, a timecode value of a clips top frame (timecode top value) 510 and a serial number 511 of storage media storing the material file are stored. Note that, in FIG. 15, the skip Box 504 further includes a free space 505, user data 506, and metadata 507. Since special data such as the UMID of the material file and a serial number of a storage media is stored in the skip Box, such special data does not affect reproduction by a general viewer.

The same CLIP-UMID is set for respective MP4 files of "picture A" and "picture B". This allows for using the CLIP-UMID to search a file of the same CLIP-UMID from a single material file and performing an automatic associating operation without involving a check operation by a human.

Figure 16:
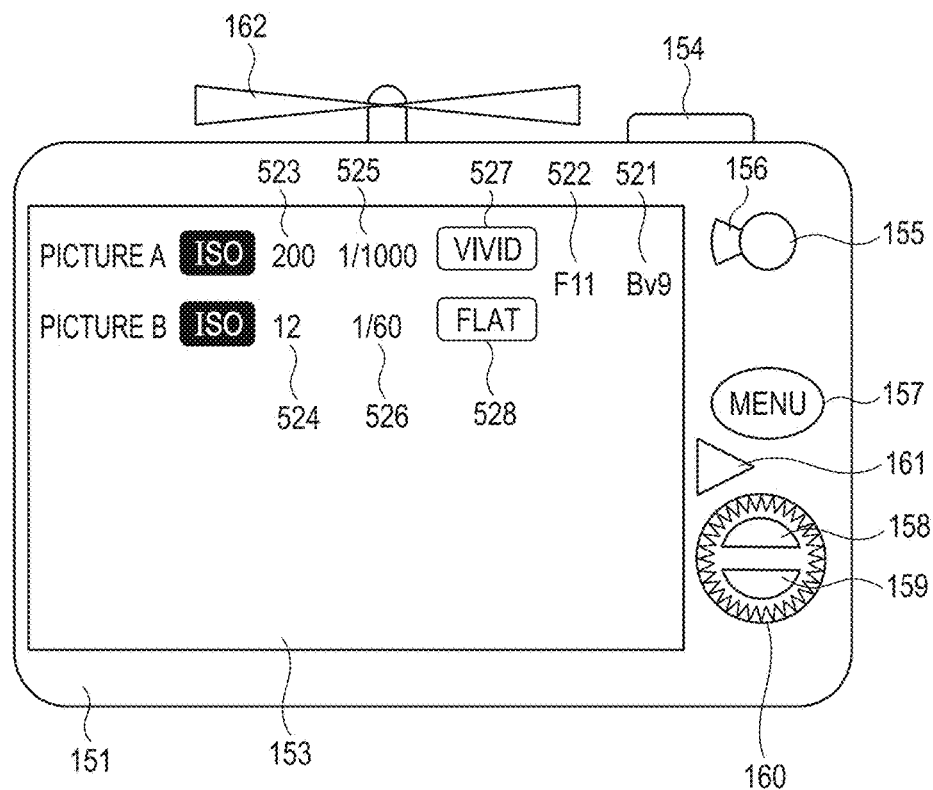
FIG. 16 is a diagram illustrating a setting window of capturing conditions of a motion image and a static image.

FIG. 16 is a diagram illustrating a setting window of capturing conditions of "picture A" and "picture B". For example, with a rotation of the capturing mode selection lever 156 by 90 degrees in the clockwise direction from a position illustrated in FIG. 1B, a dual image mode that enables simultaneous capturing of two images is entered. On the display unit 153, displayed are a Bv value 521 in accordance with the current brightness of an object, an F number 522, respective ISO sensitivities 523 and 524 of "picture A" and "picture B", and shutter speeds 525 and 526. Further, picture modes 527 and 528 that are currently set for "picture A" and "picture B" are displayed, respectively. A picture mode suitable for the intended capturing can be selected from multiple choices by using the up/down switches 158 and 159 and the dial 160.

Figure 17:
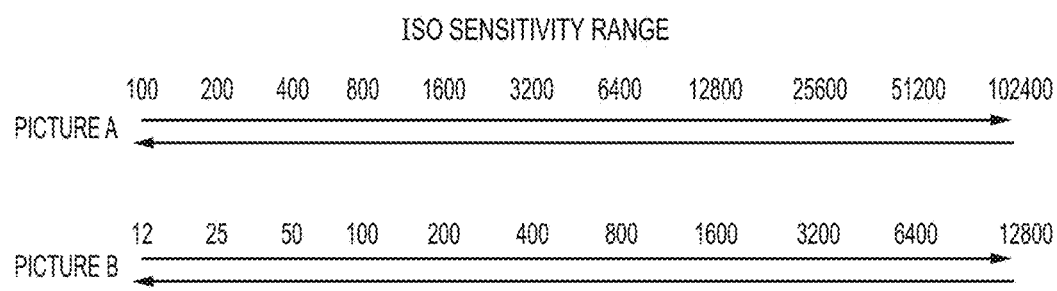
FIG. 17 is a diagram illustrating a relationship of ISO sensitivity ranges of image signals captured by using two photodiodes having different light-receiving efficiencies.

As described above, a difference of the light-receiving efficiency between the photodiode 310A and the photodiode 310B is set to three steps. Thus, there is a three-step difference in the ISO sensitivity between "picture A" and "picture B". As illustrated in FIG. 17, "picture A" ranges from ISO 100 to ISO 102400 and "picture B" ranges from ISO 12 to ISO 12800.

Figure 18:
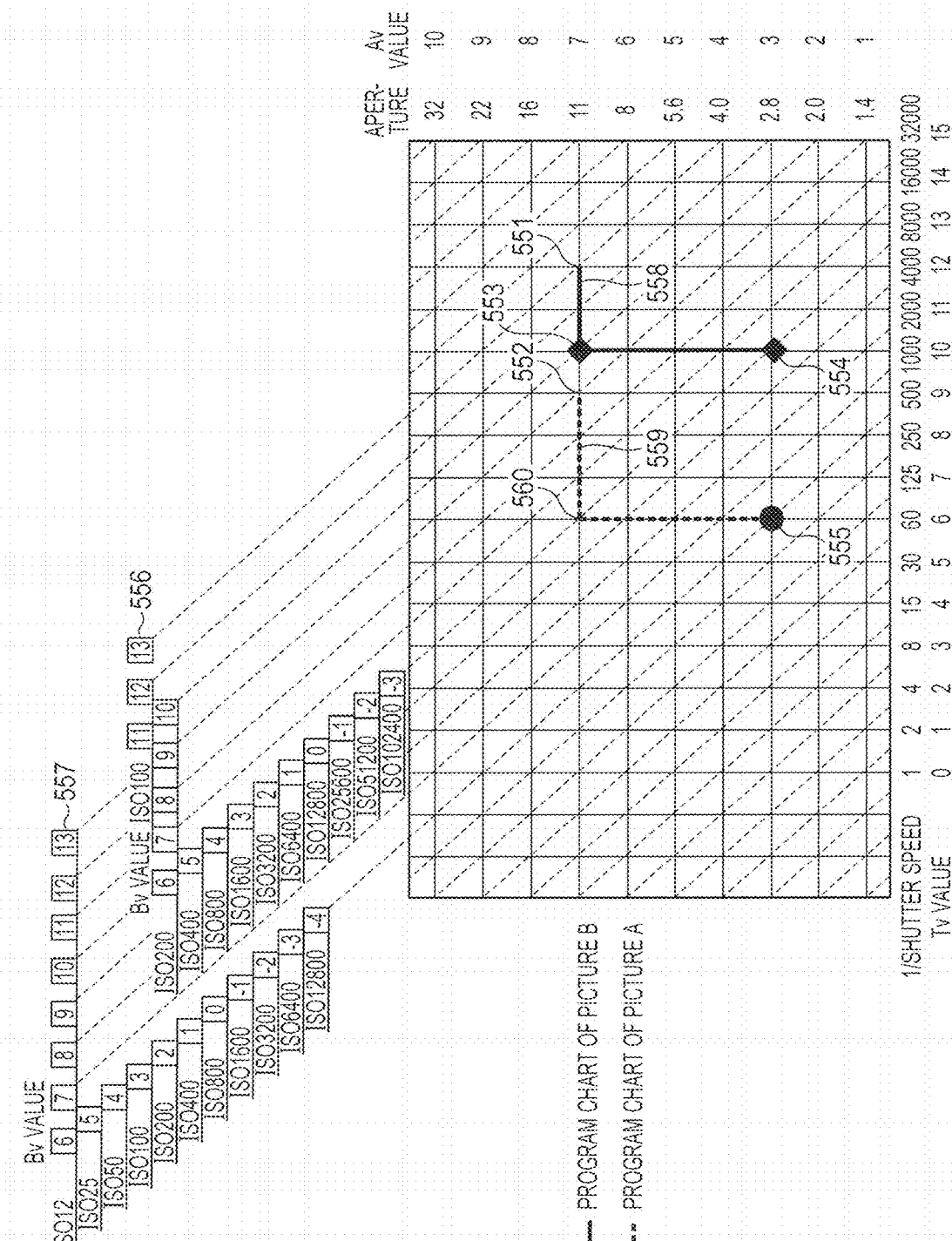
FIG. 18 is a program AE chart in a dual-image mode of the imaging device according to the first embodiment of the present invention.

FIG. 18 is a program Automatic Exposure (AE) chart in the dual image mode. The horizontal axis represents a Tv value and a corresponding shutter speed, and the vertical axis represents an Av value and a corresponding aperture value. Further, the angle direction represents equal Bv lines. The relationship between the Bv value and the ISO sensitivity of "picture A" is indicated in a gain indication area 556, and the relationship between the Bv value and the ISO sensitivity of "picture B" is indicated in a gain indication area 557. Note that, in FIG. 18, each Bv value is indicated by a number enclosed with a square in order to distinguish it from other parameters.

How the shutter speed, the aperture value, and the ISO sensitivity change with respect to a change of the brightness from high to low will be described by using FIG. 18.

First, when the Bv is 13, for "picture A", the ISO sensitivity is set to ISO 100. The equal Bv line of "picture A" intersects at a point 551 with a program chart 558 of "picture A" and, based on the point 551, the shutter speed is determined to be ¹/4000 and the aperture value is determined to be F11. On the other hand, for "picture B", the ISO sensitivity is set to ISO 12. The equal Bv line of "picture B" intersects at a point 552 with a program chart 559 of "picture B" and, based on the point 552, the shutter speed is determined to be ¹/500 and the aperture value is determined to be F11.

When the Bv is 10, for "picture A", the ISO sensitivity is increased by one step and set to ISO 200. The equal Bv line of "picture A" intersects at a point 553 with a program chart 558 of "picture A" and, based on the point 553, the shutter speed is determined to be ¹/1000 and the aperture value is determined to be F11. On the other hand, for "picture B", the ISO sensitivity is set to ISO 12. The equal Bv line of "picture B" intersects at a point 560 with a program chart 559 of "picture B" and, based on the point 560, the shutter speed is determined to be ¹/60 and the aperture value is determined to be F11.

When the Bv is 6, for "picture A", the ISO sensitivity is set to ISO 200. The equal Bv line of "picture A" intersects at a point 554 with a program chart 558 of "picture A" and, based on the point 554, the shutter speed is determined to be ¹/1000 and the aperture value is determined to be F2.8. On the other hand, for "picture B", the ISO sensitivity is set to ISO 12. The equal Bv line of "picture B" intersects at a point 555 with a program chart 559 of "picture B" and, based on the point 555, the shutter speed is determined to be ¹/60 and the aperture value is determined to be F2.8.

When the Bv is 5, for "picture A", the ISO sensitivity is increased by one step and set to ISO 400. The equal Bv line of "picture A" intersects at a point 554 with a program chart 558 of "picture A" and, based on the point 554, the shutter speed is determined to be ¹/1000 and the aperture value is determined to be F2.8. On the other hand, for "picture B", the ISO sensitivity is set to ISO 25. The equal Bv line of "picture B" intersects at the point 555 with a program chart 559 of "picture B" and, based on the point 555, the shutter speed is determined to be ¹/60 and the aperture value is determined to be F2.8.

In the same manner, for both "picture A" and "picture B", as the brightness decreases, the ISO sensitivity increases while the shutter speed and the aperture value are maintained.

With this exposure operation illustrated in the program AE chart, "picture A" maintains a shutter speed of ¹/1000 or faster in the entire represented brightness range, and "picture B" maintains a shutter speed of ¹/60 in most brightness range. This allows "picture B" to be a high quality motion image without jerkiness like a frame-by-frame video while providing a stop motion effect in "picture A".

Figure 19:
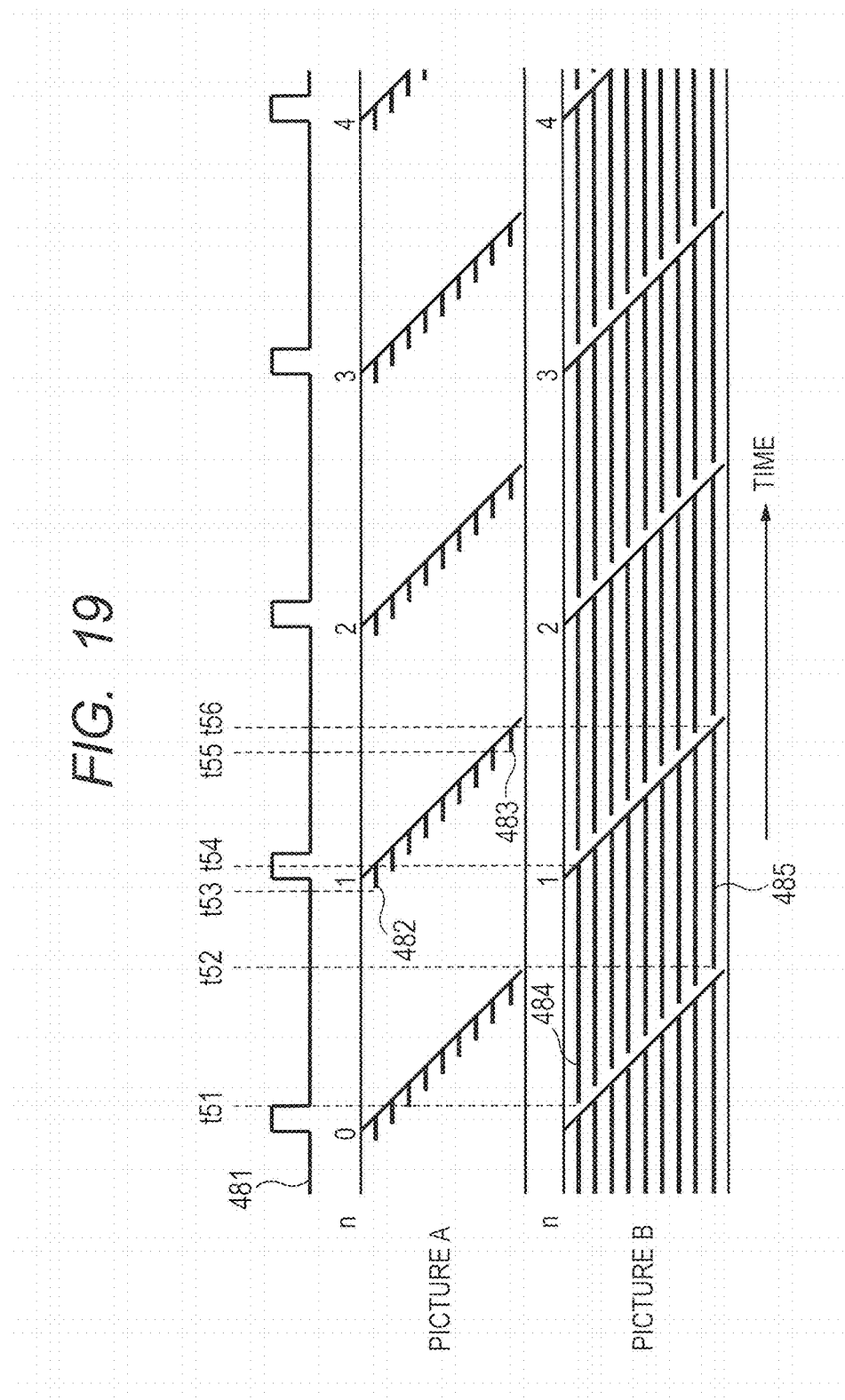
FIG. 19 is a diagram illustrating, on a capturing sequence, a difference in the shutter speed of images captured by using two photodiodes having different light-receiving efficiencies.

FIG. 19 is a diagram illustrating a difference in the shutter speed between "picture A" and "picture B" on a capturing sequence. FIG. 19 has a horizontal axis of time and represents a V-synchronization signal 481, accumulation periods 482 and 483 of "picture A", and accumulation periods 484 and 485 of "picture B". A value n is a frame number.

The accumulation period 482 is an accumulation period on the uppermost line of a screen of "picture A", and the accumulation period 483 is an accumulation period on the lowermost line of a screen of "picture A". In order to perform an exposure operation with a rolling electronic shutter function, the imaging element 184 sequentially starts accumulation operations at a predetermined time interval from the uppermost line of the screen to the lowermost line of the screen and then sequentially stops the accumulation operations at the above-described time interval. Upon the completion of accumulation, signal charges are sequentially read out from the imaging element 184 and input to the analog frontend 185. A period from time t53 to time t54 is the accumulation period 482 and a period from time t55 to time t56 is the accumulation period 483.

Further, the accumulation period 484 is an accumulation period on the uppermost line of a screen of "picture B", and the accumulation period 485 is an accumulation period on the lowermost line of a screen of "picture B". Also in "picture B", in the same manner as in "picture A", accumulation operations are started at a predetermined time interval from the uppermost line of the screen to the lowermost line of the screen and then sequentially stopped at the above-described time interval. Upon the completion of accumulation, signal charges are sequentially read out from the imaging element 184 and input to the analog frontend 186. A period from time t51 to time t54 is the accumulation period 484, and a period from time t52 to time t56 is the accumulation period 485.

While two images of "picture A" and "picture B" are captured with different accumulation time settings, almost the same level of signal charges are obtained by the imaging element 184 without an increase of the gain for "picture A". Therefore, images having a good S/N ratio and causing less feeling of noise are obtained for both "picture A" and "picture B".

Figure 20:
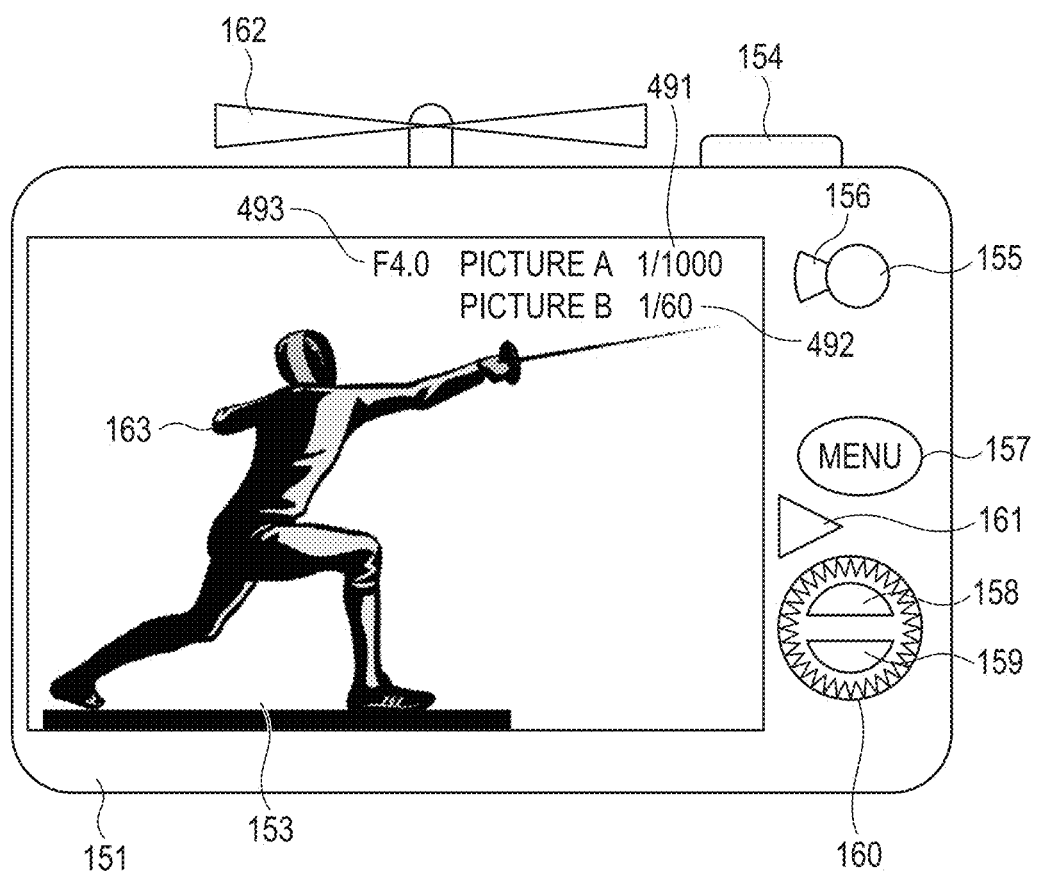

FIG. 20 is a diagram illustrating a view of the display unit 153 during a live view display after the imaging device 184 is powered on. A sports scene including a person 163 captured through the imaging optics 152 is displayed on the display unit 153. Further, the capturing mode selection lever 156 is positioned where it has been revolved by 90 degrees in the clockwise direction from a state of FIG. 1B, and thus shutter speeds 491 and 492 and an F number 493 of "picture A" and "picture B" in the dual image mode are displayed.

Figure 21A:
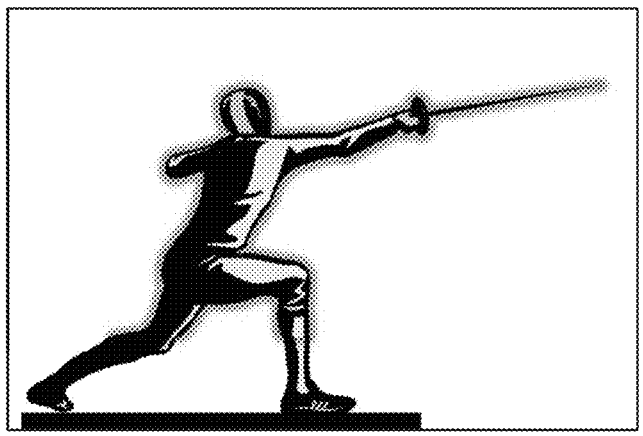
FIG. 21A and FIG. 21B are diagrams illustrating one frame of a motion image and a static image captured by using two photodiodes having different light-receiving efficiencies.
Figure 21B:
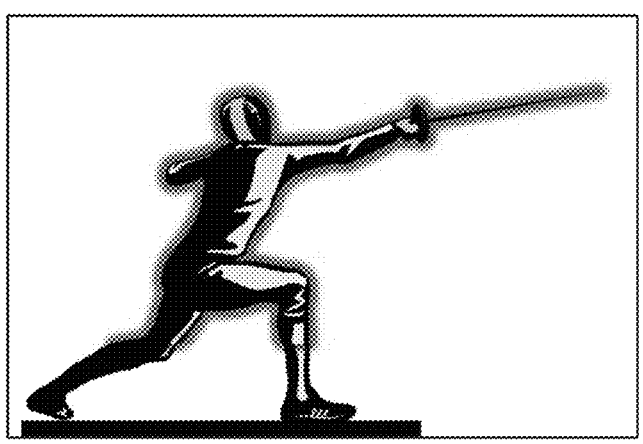

FIG. 21A and FIG. 21B each illustrate one frame of images obtained by operating the switch ST 154 and the switch MV 155. FIG. 21A represents an image of "picture A" captured with a shutter speed of ¹/1000 and an aperture value of F4.0. FIG. 21B represents an image of "picture B" captured with a shutter speed of ¹/60 and an aperture value of F4.0. The image illustrated in FIG. 21B is blurred due to a slow shutter speed and a moving object. When this is played back as a motion image with a framerate of around 60 fps, however, this blur rather works effectively resulting in a smooth, high quality video without causing a feeling of watching flip drawings like a frame-by-frame video.

Figure 22:
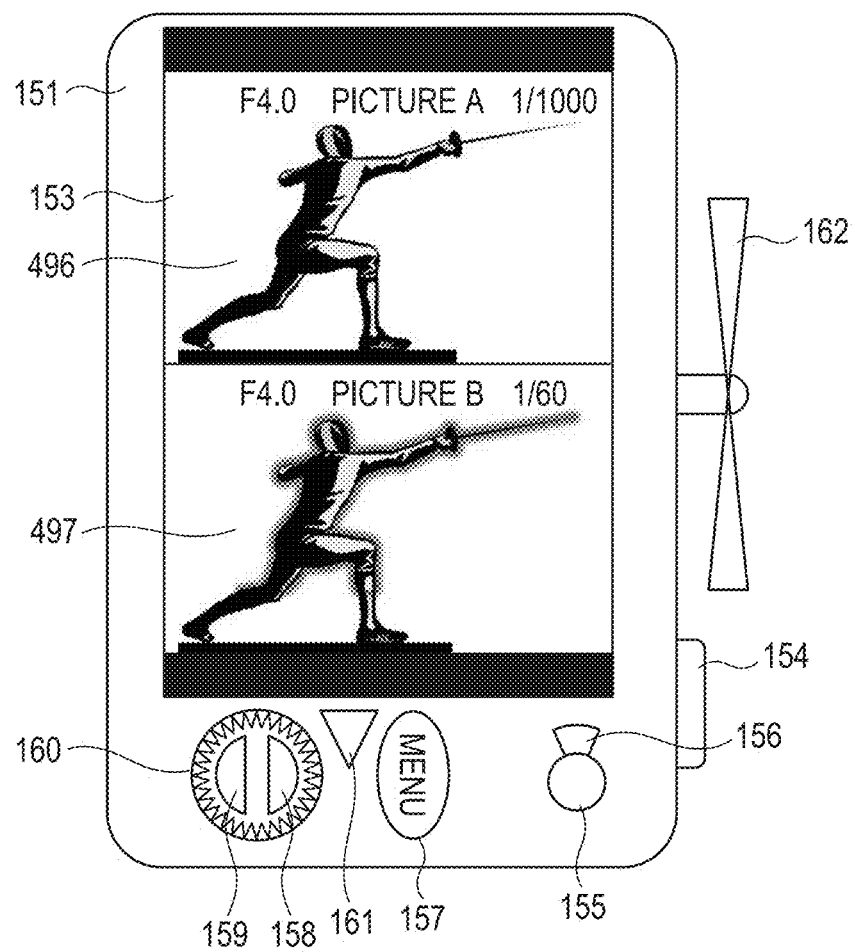
FIG. 22 is a diagram illustrating a view in which a motion image and a static image that are captured by using two photodiodes having different light-receiving efficiencies are displayed juxtaposed on the display unit.

On the other hand, in the image illustrated in FIG. 21A, a stop motion effect appears due to a fast shutter speed. It is desirable to be able to display both "picture A" 496 and "picture B" 497 juxtaposed on the display unit 153 of the digital still motion camera as illustrated in FIG. 22, for example, in response to an operation of the playback button 161. In such a way, the level of a stop motion effect can be checked by comparison of the images. Note that this process may be performed by supplying image data to a system or a device via a network and then by reading out a program by a computer of the system or the device.

Figure 23:
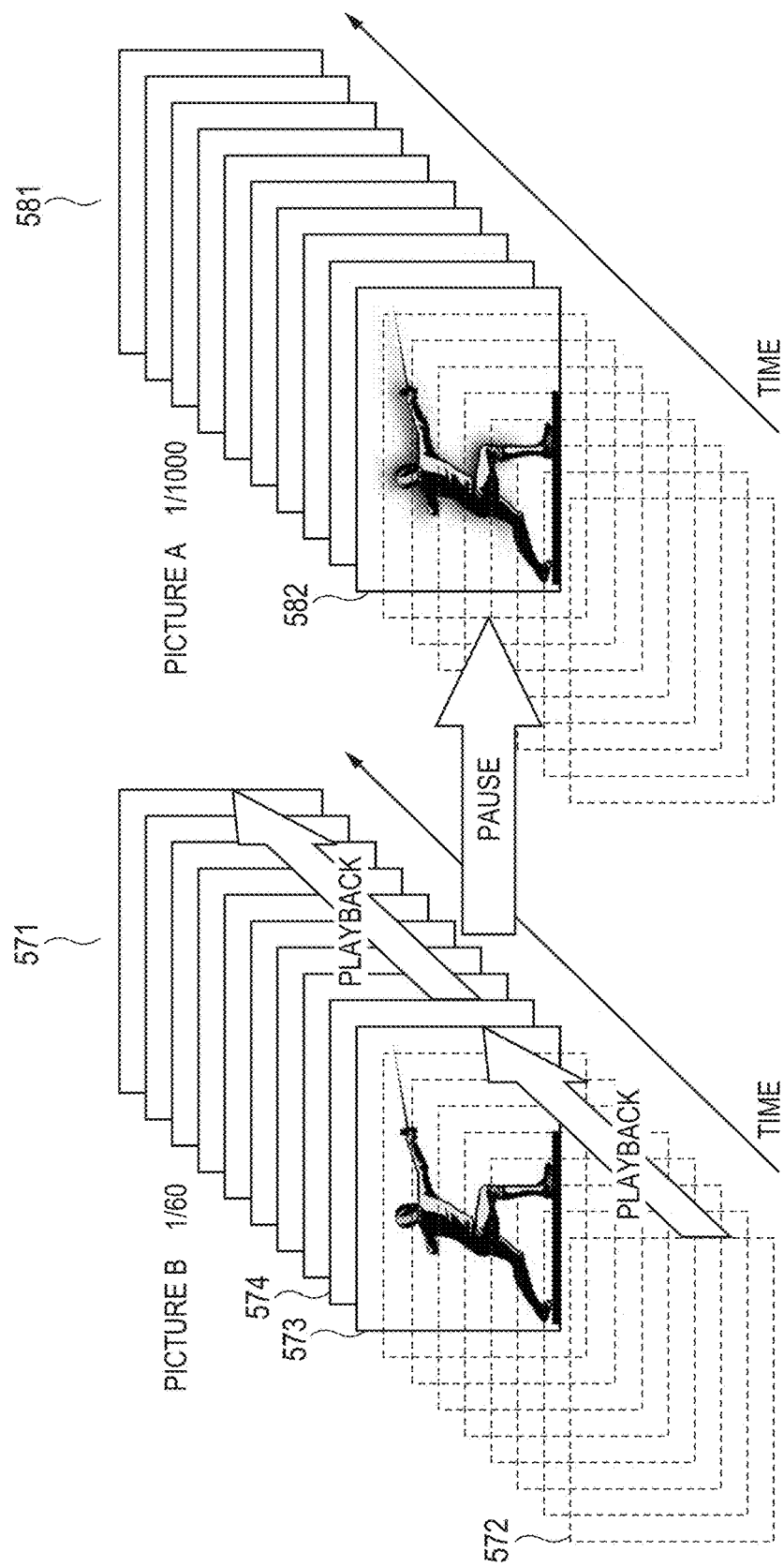
FIG. 23 is a diagram illustrating an example of a use of "picture A" and "picture B" stored in a storage.

FIG. 23 is a diagram illustrating an example of a use of "picture A" and "picture B" stored in a storage in a tablet terminal, a personal computer, a television monitor, or the like.

Data files of "picture A" and "picture B" are stored in a storage or the like on a network. In FIG. 23, a frame group 581 is a frame group of "picture A" stored in an MP4 file, and a frame group 571 is a frame group of "picture B" stored in another MP4 file. The same CLIP-UMID is set in these MP4 files at the capturing time and associated with each other.

First, upon the start of reproduction of a motion image, frames are sequentially reproduced at a defined framerate from a top frame 572 of the frame group 571 of "picture B". Since "picture B" is captured at a setting such that the shutter speed does not become excessively fast (in this example, 1/60 seconds), a reproduced video is of a high quality without jerkiness like a frame-by-frame video. In FIG. 23, a circumference of an object in the frame 573 is shaded off to express a motion of the object to a degree not causing jerkiness.

In response to a user making a pause operation at the time when the reproduction reaches the frame 573, the frame 582 having the same timecode is automatically searched from the data file of "picture A" corresponding to "picture B" and displayed. The "picture A" has been captured at a fast shutter speed (1/1000 seconds in this example) by which a stop motion effect is likely to be obtained, and is a powerful image that captures a moment of a sports scene. While two images of "picture A" and "picture B" are captured with different accumulation time settings, almost the same level of signal charges are obtained by the imaging element 184 without an increase of the gain for "picture A". Therefore, images having a good S/N ratio and causing less feeling of noise are obtained for both "picture A" and "picture B".

Here, upon an instruction of printing, data of the frame 582 of "picture A" is output to the printer 195 via the print interface unit 194. Therefore, a print also provides a powerful feeling with a stop motion effect that reflects "picture A". In response to the user releasing the pause, the frame group 571 of "picture B" is automatically used again and reproduction is resumed from the frame 574. At this time, a played back video is of a high quality without jerkiness like a frame-by-frame video.

In such a way, an image suitable for a motion image without jerkiness can be obtained by using "picture B" as a image signal for a motion image. Further, an image suitable for a static image and a print with a stop motion effect can be obtained by using "picture A" as an image signal for a static image. In the imaging device of the present embodiment, these two effects can be implemented by using a single imaging element.

Further, in the present embodiment, a file for a static image and a file for a motion image are separated and filed in different folders in the storage medium 193 in order to improve operatability at a playback. For example, as described above, both "picture A" and "picture B" are stored separately in a folder for motion images and a folder for static images with the same framerate and the same MP4 format. Then, in response to an operation of the playback button 161, "picture B" stored as file data for a motion image is continuously played back as a motion image. Further, "picture A" stored as file data for a static image is played back as a static image one by one in response to an image advance operation.

With respect to a display of a static image during a playback of a motion image, a static image "picture A" of the same timecode as that of the motion image "picture B" during playback may be displayed at the timing when the switch ST 154 is operated. Further, a static image before or after the up/down switch 158 or 159 is operated may be displayed.

A combination of "picture A" and "picture B" used for a motion image capturing and a static image capturing is determined at the capturing, as described later. Each of the captured "picture A" and "picture B" is then filed in a folder for motion images or a folder for static images.

As discussed above, the present embodiment includes an imaging device having a first photoelectric conversion unit (a first photodiode) and a second photoelectric conversion unit (a second photodiode) whose light-receiving efficiency is lower than that of the first photoelectric conversion unit. Further, a capturing condition setting unit (a switch input, a system control CPU) adapted to set capturing conditions including accumulation periods of a motion image capturing and a static image capturing is provided. Thereby, a combination of the first and second photodiodes used for a motion image capturing and a static image capturing can be selected in accordance with capturing conditions. For example, when an object is dark, degradation of the S/N ratio of an image signal can be reduced by using an image "picture A" of the first photodiode having a high light-receiving efficiency for both a motion image and a static image. Alternatively, when an object is bright, degradation of the S/N ratio of an image signal can be reduced by using an image "picture B" of the second photodiode having a low light-receiving efficiency for both a motion image and a static image.

Further, in the present embodiment, image data captured as a static image and image data captured as a motion image are stored separately in the storage medium. This allows for not only playing back a motion image and a static image in a separate manner which have been captured at the same time but also displaying a motion image and a static image in a linked manner which have been captured at different capturing conditions.

Second Embodiment

An imaging device according to the second embodiment of the present invention will be described by using FIG. 24 to FIG. 27. In the present embodiment, a method of selecting the first and second photodiodes used for a motion image capturing and a static image capturing in accordance with capturing conditions including accumulation periods of a motion image capturing and a static image capturing will be specifically described by using the following examples of scenes 1 to 4.

Scene 1: a static image of a quay wall onto which waves are dynamically breaking (accumulation period: 1/1000 seconds)

Scene 2: a static image of a fall in which water is flowing like threads (accumulation period: 1/15 seconds)

Scene 3: a motion image in which a skateboarder is jumping with a full of energy (accumulation period: 1/30 seconds)

Scene 4: a motion image presenting a smooth motion of a ballerina (accumulation period: 1/30 seconds)

In this example, "accumulation period" refers to a shutter speed. In order to obtain an image signal without S/N ratio degradation or signal saturation in the capturing conditions of each accumulation period set in each of the scenes 1 to 4, it is necessary to select the first and second photodiodes used for respective capturing of a motion image and a static image in accordance with the brightness of an object.

Figure 24:
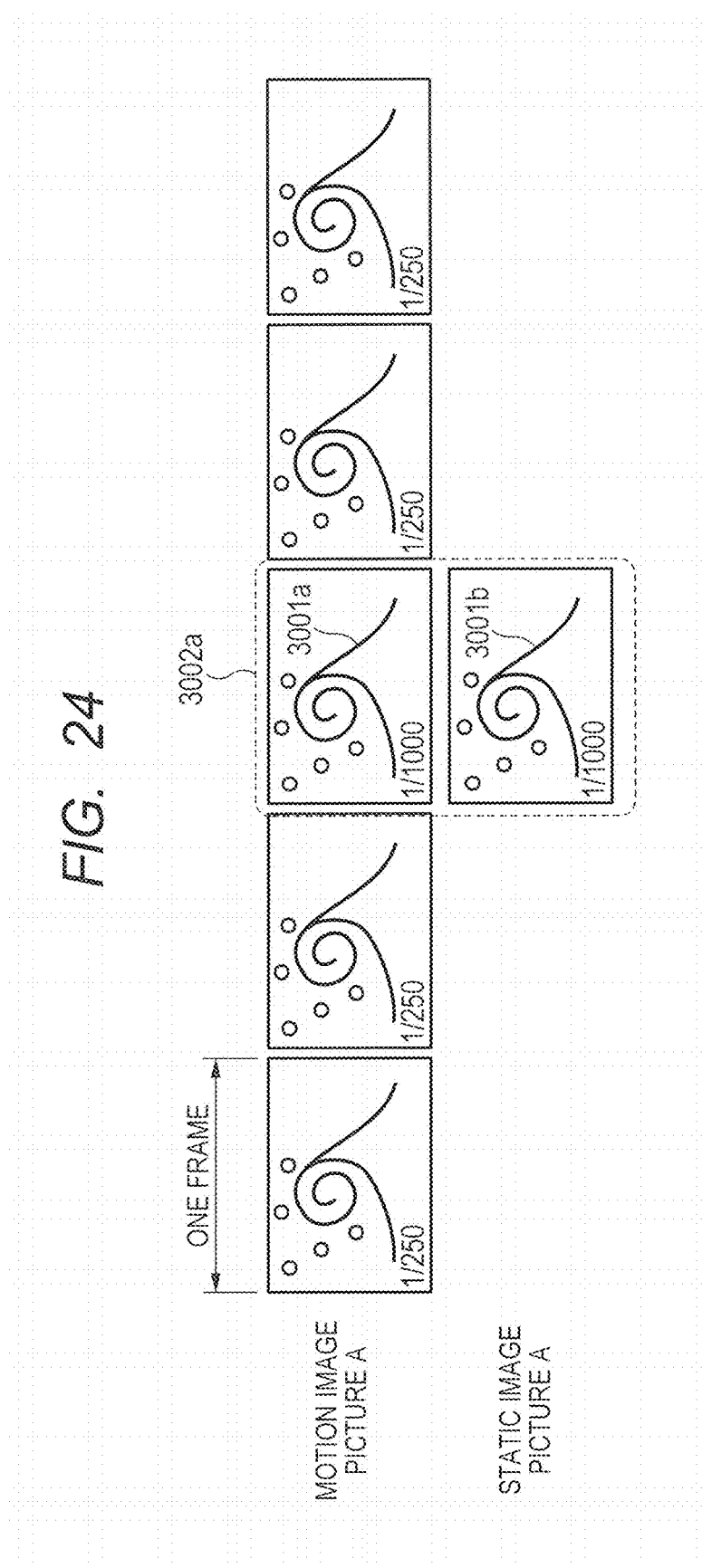
FIG. 24 is a diagram illustrating an example of a scene 1 in which both a motion image and a static image are captured in a short accumulation period in an imaging device according to a second embodiment of the present invention.

FIG. 24 is a diagram illustrating the example of the scene 1 in which both a motion image and a static image are captured in a short accumulation period in the imaging device according to the second embodiment of the present invention. For example, when the accumulation period is intended to be short for both a motion image and a static image, such as when a photographer intends to capture dynamic wave splashes, the first photodiode is used to capture both the motion image and the static image. In such a capturing condition where an object is very bright and thus a pixel signal is saturated, however, the second photodiode is used for both a motion image and a static image.

In FIG. 24, "picture A" is used as an image signal for both a motion image and a static image. Specifically, a motion image of wave splashes with jerkiness is captured in the capturing condition of an accumulation period of 1/250 seconds. Then, for a frame 3002a at a timing when an operation of a static image capturing is made, the accumulation period is changed to 1/1000 seconds to capture a wave 3001a with a greater stop motion effect. The captured image of "picture A" is filed in both a motion image folder and a static image folder. In such a way, in the scene 1 where the accumulation period is different for a motion image and a static image in a dual image mode, a motion image is captured in response to an operation of the switch MV 155. Then, when the switch ST 154 is operated during a motion image capturing, only the frame at the time of that operation is captured with the accumulation period for a static image. The frame 3002a obtained at this time is filed also in the static image folder.

Figure 25:
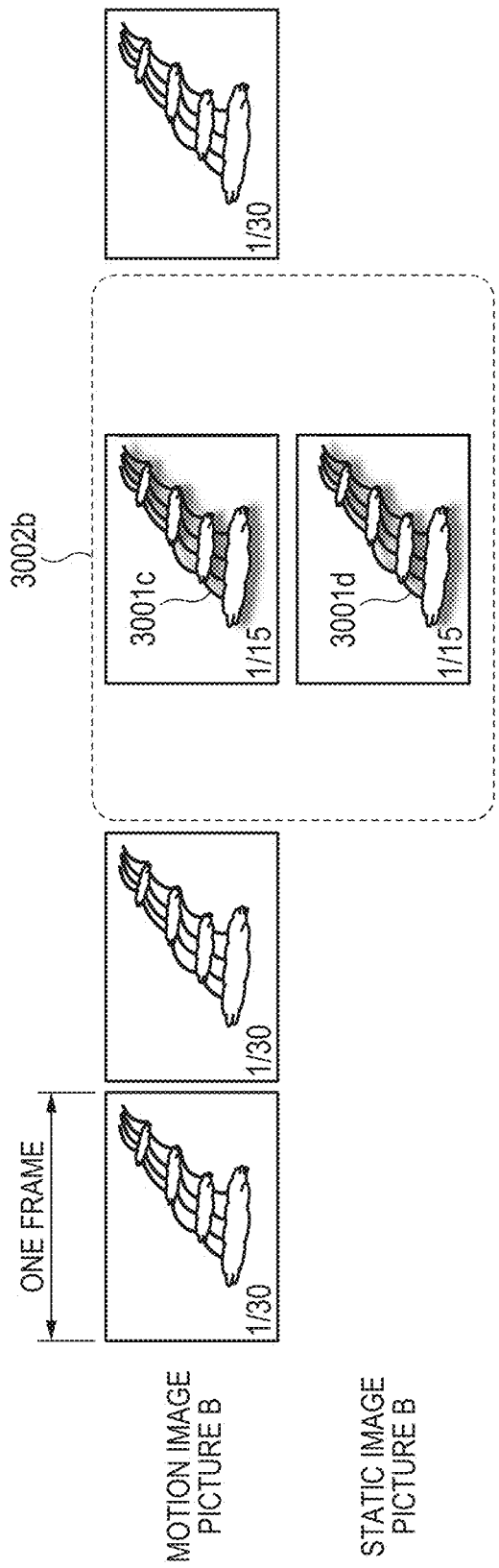
FIG. 25 is a diagram illustrating an example of a scene 2 in which both a motion image and a static image are captured in a long accumulation period in the imaging device according to the second embodiment of the present invention.

FIG. 25 is a diagram illustrating the example of the scene 2 in which both a motion image and a static image are captured in a long accumulation period in the imaging device according to the second embodiment of the present invention. For example, when the accumulation period is intended to be long for both a motion image and a static image, such as when a photographer intends to capture a fall with water flowing like threads, the second photodiode is used to capture both the motion image and the static image. In such a capturing condition where an object is very dark and thus a pixel signal is insufficient, however, the first photodiode is used for both a motion image and a static image.

In FIG. 25, "picture B" is used as an image signal for both a motion image and a static image. Specifically, a motion image of a fall without jerkiness is captured in the capturing condition of an accumulation period of 1/30 seconds. Then, for a frame 3002b at a timing when an operation of a static image capturing is made, the accumulation period is changed to 1/15 seconds to capture an object 3001c of the fall with water flowing like threads. Note that, in FIG. 25, shades are provided around the object 3001c and object 3001d in order to express the motion of the object image. The captured image of "picture B" is filed in both a motion image folder and a static image folder. In such a way, in the scene 2 where the accumulation period is different for a motion image and a static image in a dual image mode, a motion image is captured in response to an operation of the switch MV 155. Then, when the switch ST 154 is operated during a motion image capturing, only the frame at the time of that operation is captured with the accumulation period for a static image. The frame 3002b obtained at this time is filed also in the static image folder.

Figure 26:
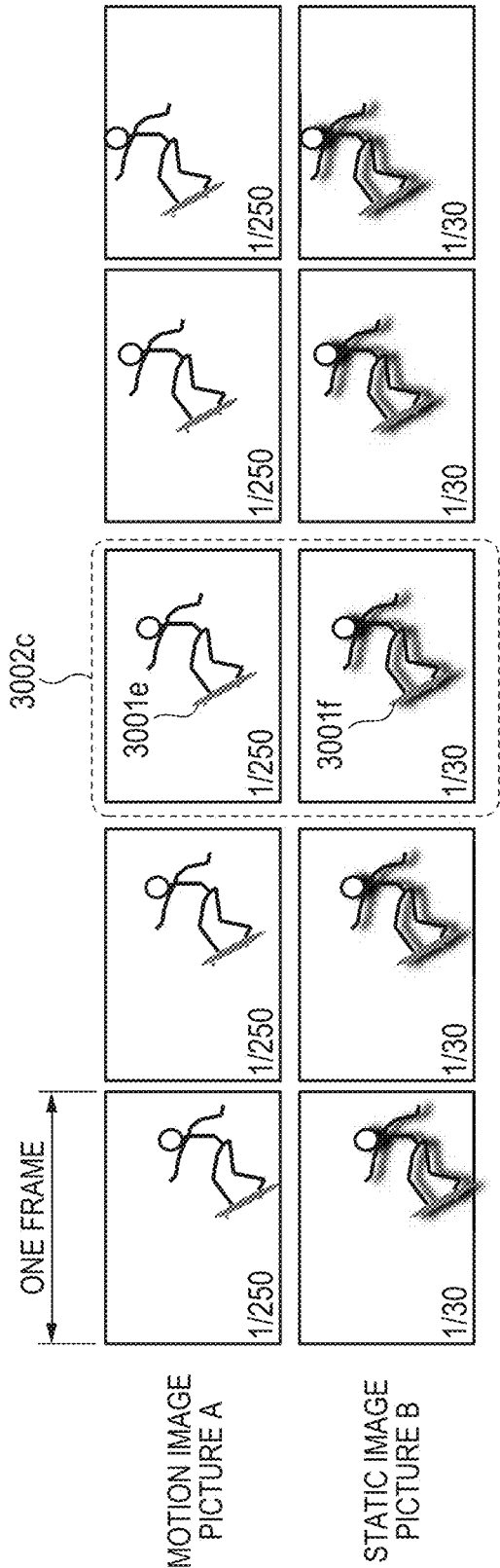
FIG. 26 is a diagram illustrating an example of a scene 3 in which a motion image is captured in a short accumulation period and a static image is captured in a long accumulation period in the imaging device according to the second embodiment of the present invention.

FIG. 26 is a diagram illustrating the example of the scene 3 in which a motion image is captured in a short accumulation period and a static image is captured in a long accumulation period in the imaging device according to the second embodiment of the present invention. For example, when the accumulation period is intended to be short for a motion image and the accumulation period is intended to be long for a static image, such as when a photographer intends to capture a motion of a skateboarder with a blur, the first photodiode is used for the motion image and the second photodiode is used for the static image. In such a capturing condition where an object is very bright and thus a pixel signal is saturated, however, the second photodiode is used also for a motion image.

In FIG. 26, "picture A" is used to capture a motion image of a skateboarder with jerkiness in the capturing condition of an accumulation period of 1/250 seconds. Further, "picture B" is used to capture a lively static image of a skateboarder blurred with the capturing condition of an accumulation period of 1/30 seconds. The "picture A" is filed in a motion image folder and the "picture B" is filed in a static image folder.

Then, when a photographer selects an object 3001e of a preferred frame 3002c, for example, during a playback of a motion image of "picture A", an image of an object 3001f is played back as a static image.

Figure 27:
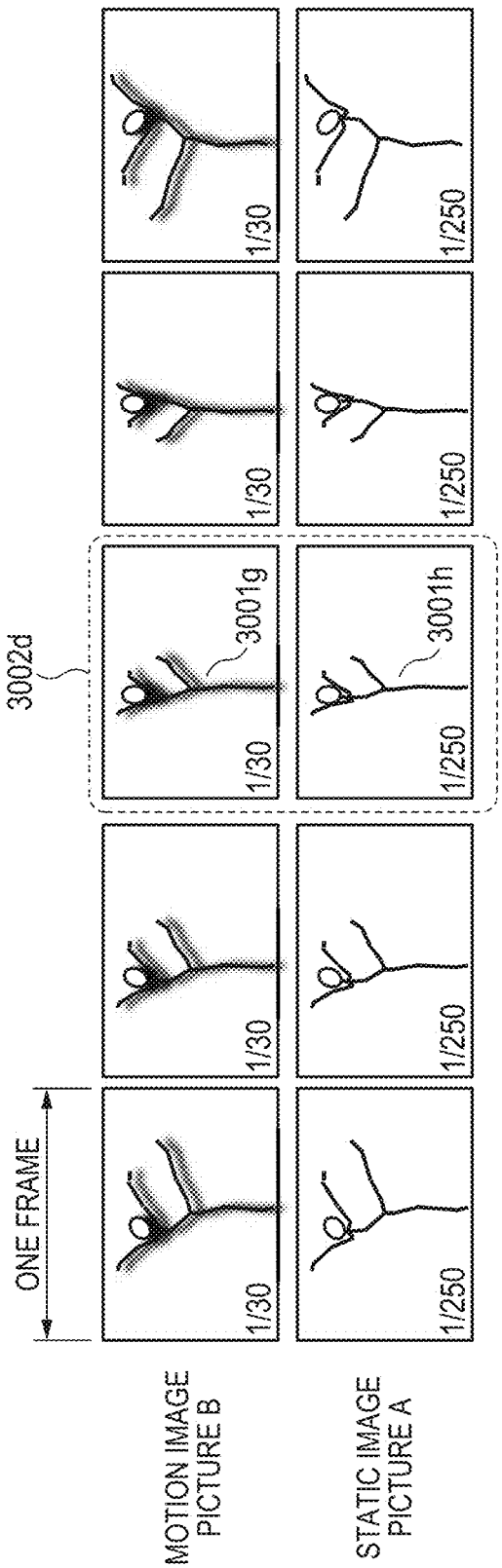
FIG. 27 is a diagram illustrating an example of a scene 4 in which a motion image is captured in a long accumulation period and a static image is captured in a short accumulation period in the imaging device according to the second embodiment of the present invention.

FIG. 27 is a diagram illustrating the example of the scene 4 in which a motion image is captured in a long accumulation period and a static image is captured in a short accumulation period in the imaging device according to the second embodiment of the present invention. For example, when the accumulation period is intended to be long for a motion image and the accumulation period is intended to be short for a static image, such as when a photographer intends to capture a ballerina with a stop motion, the second photodiode is used for the motion image and the first photodiode is used for the static image. In such a capturing condition where an object is very bright and thus a pixel signal is saturated, however, the second photodiode is used also for a static image.

In FIG. 27, "picture B" is used to capture a smooth motion image of a ballerina without jerkiness in the capturing condition of an accumulation period of 1/30 seconds. Further, "picture A" is used to capture a static image of a ballerina with a stop motion effect in the capturing condition of an accumulation period of 1/250 seconds. The "picture B" is filed in a motion image folder and the "picture A" is filed in a static image folder.

Then, when a photographer selects an object 3001g of a preferred frame 3002d, for example, during a playback of a motion image of "picture B", an image of an object 3001h is played back as a static image.

As discussed above, in the present embodiment, a combination of the first and second photodiodes used for a motion image and a static image is selected in accordance with capturing conditions including accumulation periods of a motion image capturing and a static image capturing. Thereby, a high quality image optimized in accordance with a scene can be captured. Further, when either one of the first and second photodiodes is used for capturing, a motion image is captured with an accumulation period of a static image capturing at the timing of a static image capturing. Thereby, even when an object is too bright or too dark, the exposure can be optimized to suppress degradation of the S/N ratio.

Third Embodiment

An imaging device according to the third embodiment of the present invention will be described by using FIG. 28 to FIG. 33. The second embodiment has described the method of selecting photodiodes used for a motion image capturing and a static image capturing in accordance with capturing conditions including an accumulation period. In the present embodiment, in addition to the above, a method of selecting photodiodes used for a motion image capturing and a static image capturing in accordance with the brightness of an object will be described.

The general configuration of the imaging device of the present embodiment is the same as the general configuration of the imaging device of the first embodiment illustrated in FIG. 2. A signal of the first photodiode 310A is input to the analog frontend 185 of FIG. 2 and a signal of the second photodiode 310B is input to the analog frontend 186. In general capturing conditions, the first photodiode 310A with a high light-receiving efficiency is used for a static image capturing in order to obtain a stop motion effect. At this time, a signal from the first photodiode 310A is incorporated via the analog frontend 185 based on an operation of the switch ST 154. Further, the second photodiode 310B with a low light-receiving efficiency is used for a motion image capturing in order to eliminate jerkiness. At this time, a signal from the second photodiode 310B is incorporated via the analog frontend 186 based on an operation of the switch MV 155.

On the other hand, in the dual image mode in which the capturing mode selection lever 156 is rotated in the clockwise direction, signals of the first photodiode 310A and the second photodiode 310B are simultaneously incorporated in the analog frontends 185 and 186. Note that, as seen in the examples of the scenes 1 and 2 described in FIG. 24 and FIG. 25, only one of the first photodiode image and the second photodiode image may be used for some accumulation period set by the photographer even in the dual capturing mode. The image signals incorporated in the analog frontends 185 and 186 are processed by the digital signal processors 187 and 188 and stored in separate folders in the storage medium 193 for the motion image and the static image, as described above. At the time of a playback, a motion image and a static image are played back separately and also a static image corresponding to a particular frame of a motion image is played back as an image with a stop motion effect, as illustrated before by using FIG. 23.

The system control CPU 178 detects the brightness of a captured object based on image signals of the digital signal processors 187 and 188. At this time, when a first photodiode signal from the digital signal processor 187 is significantly large close to saturation, the brightness of the object is detected based on a second photodiode signal from the digital signal processor 188. In contrast, when a second photodiode signal from the digital signal processor 188 is significantly small, the brightness of the object is detected based on a first photodiode signal from the digital signal processor 187. Further, there is no saturation or degradation in any of the first and second photodiode signals, the brightness of the object is detected by using the first photodiode signal from the digital signal processor 187 having a short accumulation period. In such a way, since a photodiode used for detecting the brightness of an object is selected from the first and second photodiodes in accordance with the brightness of the object, the brightness of the object can be accurately detected from an image signal without an object blur or a camera shake.

Figure 28:
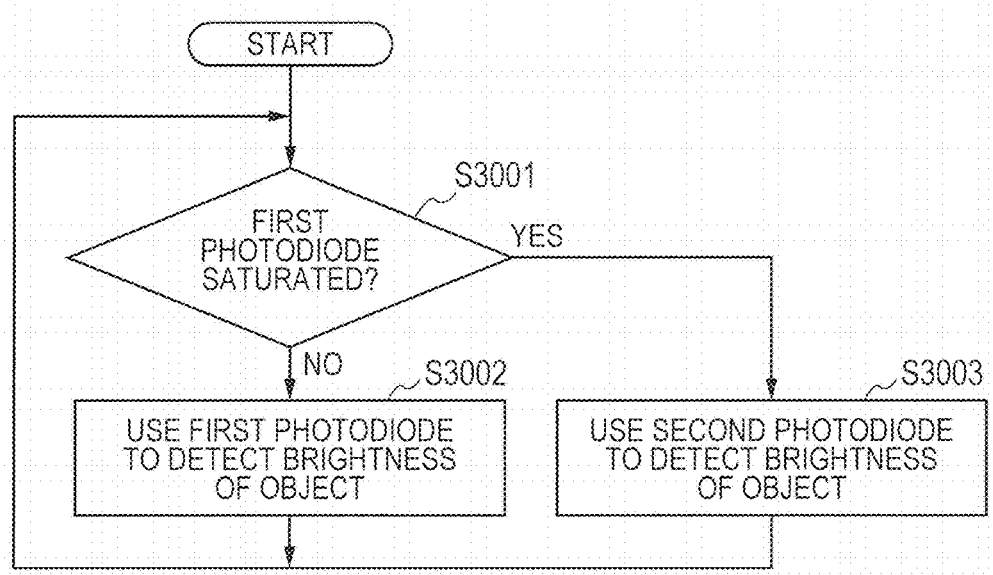
FIG. 28 is a flowchart of a method of detecting the brightness of an object by using first and second photodiodes in an imaging device according to a third embodiment of the present invention.

FIG. 28 is a flowchart of a method of detecting the brightness of an object by using the first and second photodiodes in the imaging device according to the third embodiment of the present invention. The flowchart illustrated in FIG. 28 is repeatedly performed by the system control CPU 178 from the start to the end of an operation of the imaging element 184. Note that, in this flowchart, operations that are less relevant to the present invention are omitted to illustrate an algorithm in a clearly understandable manner.

At step S3001, the brightness of an object (hereafter, also referred to as "object brightness") detects whether or not a first photodiode signal is saturated. If the first photodiode is saturated, the process proceeds to step S3003, otherwise, the process proceeds to step S3002. At step S3002, since the first photodiode signal is not saturated, the first photodiode is used to detect the object brightness. This is because, the object brightness which is less affected by a camera shake or an object blur can be detected with a shorter accumulation period by using the first photodiode having a high light-receiving efficiency rather than by using the second photodiode having a lower light-receiving efficiency. On the other hand, at step S3003, since the first photodiode signal is saturated and thus the object brightness is unable to be accurately detected, the second photodiode is used to detect the object brightness.

Note that, although subsequent flows are branched at step S3001 by determining saturation of the first photodiode signal, the process is not limited to such a method. For example, subsequent flows may be branched by determining which of the first or second photodiode is suitable for detection of the object brightness. Specifically, when accumulated charges of the first photodiode are saturated to around three quarters and a use of the second photodiode provides a higher detection linearity of the object brightness, the second photodiode is used to detect the object brightness. As such, the brightness of an object can be accurately detected by following the flowchart of FIG. 28.

Next, a method of selecting photodiodes used for a motion image capturing and a static image capturing in accordance with the detected brightness of an object will be described. As described in the second embodiment, capturing conditions including accumulation periods of a motion image and a static image are set by using the switch input 179 according to the photographer's preference and input to the system control CPU 178. In the capturing condition priority mode that prioritizes capturing conditions, capturing conditions set by the photographer are maintained unchanged. On the other hand, when the capturing mode is not the capturing condition priority mode, capturing conditions set by the photographer may be changed in order to optimize the exposure or the like. The capturing condition priority mode refers to a mode in which the photographer specifies in advance capturing conditions (a scene) including accumulation periods of a motion image and a static image in order to obtain a capturing effect for waves, a stream, a skateboarder, or a ballerina as in the scenes 1 to 4 described above, for example.

In this method, when the exposure is optimized in accordance with the brightness of an object, it is necessary to note that the aperture is common to a motion image and a static image. That is, since it is possible to simultaneously capture a motion image and a static image in the present embodiment, for some value of the capturing conditions including accumulation periods set by the photographer, optimization of the exposure of one of the motion image and the static image may cause the other to be inappropriate. For example, when intended capturing effects are different between a motion image capturing and a static image capturing, different accumulation periods may be set for the motion image and the static image. The photographer is able to use the up/down switches 158 and 159 and the dial 160 in the digital still motion camera illustrated in FIG. 1A and FIG. 1B to set respective accumulation periods of a motion image and a static image separately. For example, it is assumed that the suitable exposure is obtained for both a motion image and a static image when an accumulation period of the first photodiode used for a static image is set to $1/250$ seconds, an accumulation period of the second photodiode used for a motion image is set to 1/30 seconds that is lower by three steps, and a common aperture value is set to F5.6. In this example, when the photographer intends to set a faster accumulation period for a static image and sets an accumulation period of the first photodiode to 1/1000 seconds, for example, the common aperture value of F5.6 will cause the exposure of the static image to be underexposure by two steps.

Therefore, the capturing condition priority mode of the present embodiment prioritizes one of a motion image and a static image to the other to optimize the exposure. For example, in a motion image priority mode, the suitable exposure for a motion image is obtained with an accumulation period of 1/30 seconds and F5.6, and two-step underexposure for a static image is obtained with an accumulation period of 1/1000 seconds and F5.6. On the other hand, in a static image priority mode, two-step overexposure for a motion image is obtained with an accumulation period of 1/30 seconds and F2.8, and the suitable exposure for a static image is obtained with an accumulation period of 1/1000 seconds and F2.8. The under part of the underexposure or the over part of the overexposure is compensated by a gain adjustment by the digital signal processors 187 and 188.

On the other hand, when the capturing mode is not the capturing condition priority mode, the accumulation period set by the photographer may be changed. For example, the suitable accumulation period for a motion image is obtained with an accumulation period of 1/30 seconds and F5.6, and a stop motion effect of a static image is reduced with an accumulation period of 1/250 seconds and F5.6. On the other hand, in a static image priority mode, while a motion image is obtained at the expense of a smoothness of the motion image (jerkiness remains) with an accumulation period 1/125 seconds and F2.8, a suitable accumulation period for a static image is obtained with an accumulation period of 1/1000 seconds and F2.8. Note that, in a capturing condition setting which depends on a camera when the capturing mode is not the capturing condition priority mode, only the static image priority mode that strictly evaluates the image quality is applied to omit the motion image priority mode, and a setting operation of capturing conditions may be simplified.

Figure 29:
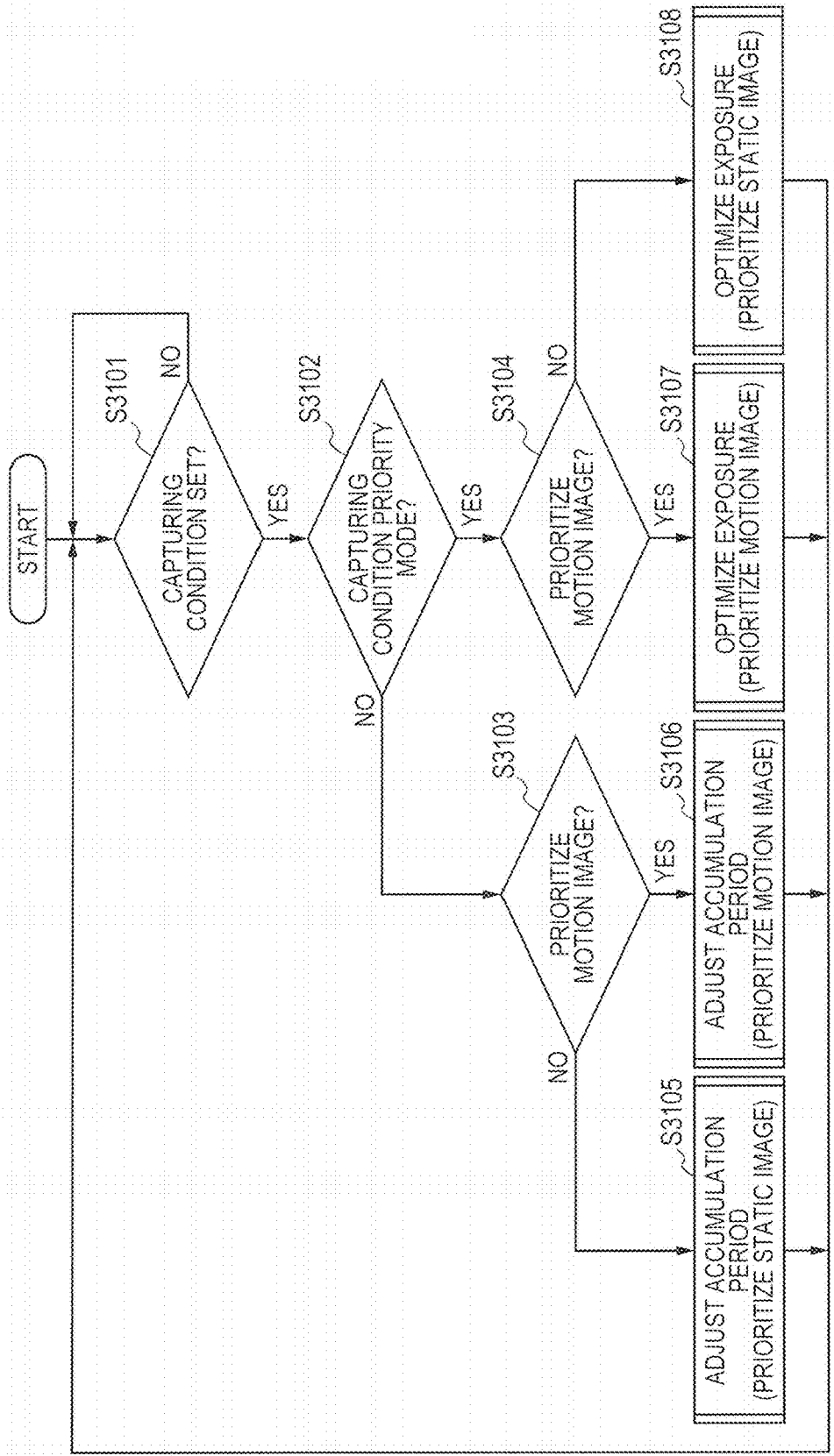
FIG. 29 is a flowchart illustrating a method of optimizing a motion image and a static image in the imaging device according to the third embodiment of the present invention.

FIG. 29 is a flowchart illustrating a method of optimizing a motion image and a static image in the imaging device according to the third embodiment of the present invention. The flowchart illustrated in FIG. 29 is repeatedly performed by the system control CPU 178 from the start of an operation by the imaging element 184 to the end of the operation. Note that, in this flowchart, operations that are less relevant to the present invention are omitted to illustrate an algorithm in a clearly understandable manner.

At step S3101, the process is on standby until it is detected that a photographer has set capturing conditions by using switch input 179. At step S3102, if the capturing mode is the capturing condition priority mode, the process proceeds to step S3104. On the other hand, if the capturing mode is not the capturing condition priority mode, the process proceeds to step S3103. At step S3104, accumulation of the first and second photodiodes is performed with respective accumulation periods set by the photographer. At this time, as described before, respective light-receiving efficiencies and sensitivity steps (three steps) of the first and second photodiodes have been determined in advance. Therefore, when an aperture value is determined in accordance with the brightness of an object so as to optimize the exposure of one of a motion image and a static image, the exposure of the other will be underexposure or overexposure. At step S3104, the process proceeds to step S3107 when the capturing mode is the motion image priority mode, or proceeds to step S3108 when the capturing mode is the static image priority mode.

At step S3107, an aperture value is set such that an accumulation period set by the photographer provides the suitable exposure for a motion image. As a result, while the exposure of a static image may become underexposure or overexposure with the accumulation period set by the photographer, the exposure of the static image is compensated by adjusting the gain. At step S3108, an aperture value is set such that an accumulation period set by the photographer provides the suitable exposure for a static image. As a result, while the exposure of a motion image may become underexposure or overexposure with the accumulation period set by the photographer, the exposure of the motion image is compensated by adjusting the gain.

At step S3103, since the capturing mode is not the capturing condition priority mode, a change of the capturing conditions set by the photographer is accepted. In such a mode which prioritizes optimization of the exposure to capturing conditions, the capturing conditions such as an accumulation period are adjusted in accordance with the brightness of an object. As described before, respective light-receiving efficiencies and both sensitivity steps (three steps) of the first and second photodiodes have been determined in advance. Therefore, when the aperture value is determined in accordance with the brightness of an object so as to optimize the exposure of one of a motion image and a static image, the exposure of the other would be underexposure or overexposure. Thus, when the capturing mode is not the capturing condition priority mode, the accumulation period of a motion image or a static image is changed in order to obtain the suitable exposure. At step S3103, if the capturing mode is the motion image priority mode, the process proceeds to step S3106. On the other hand, if the capturing mode is the static image priority mode, the process proceeds to step S3105.

At step S3106, an aperture value is set such that an accumulation period set by the photographer provides the suitable exposure for a motion image. As a result, when the exposure of a static image becomes underexposure or overexposure with the accumulation period set by the photographer, the accumulation period of the static image is adjusted to optimize the exposure of the static image. That is, while the accumulation period of a motion image is the same as an initial value set by the photographer, the accumulation period of a static image may be different from the initial value set by the photographer. At step S3105, an aperture value is set such that an accumulation period set by the photographer provides the suitable exposure for a static image. As a result, when the exposure of a motion image becomes underexposure or overexposure with the accumulation period set by the photographer, the accumulation period of the motion image is adjusted to optimize the exposure of the motion image. That is, while the accumulation period of a static image is the same as an initial value set by the photographer, the accumulation period of a motion image may be different from the initial value set by the photographer.

As discussed above, with a preset of (a) capturing conditions including accumulation periods, (b) whether or not the capturing mode is the capturing condition priority mode, and/or (c) the motion image priority mode/the static image priority mode, a motion image and a static image can be optimized according to the flowchart illustrated in FIG. 29.

As described by using FIG. 28 and FIG. 29, in the present embodiment, an object is captured while capturing conditions including accumulation periods of a static image capturing and a motion image capturing set by the photographer or the like is optimized in accordance with the brightness of an object detected by the imaging element 184. In this way, the proper use of the first photodiode and the second photodiode in accordance with the brightness of an object and/or capturing conditions allows for further optimization of the exposure of a motion image and a static image. Further, the first and second photodiodes are used properly in accordance with capturing conditions suitable for various capturing scenes, which allows the photographer to perform a desirable capturing.

Next, a method of selecting the first and second photodiodes used for a motion image capturing and a static image capturing in accordance with capturing conditions and the brightness of an object will be described by exemplifying some capturing conditions.

1. A Case where the Capturing Mode is not the Capturing Condition Priority Mode

This corresponds to step S3103 of the flowchart illustrated in FIG. 29 and the case where the accumulation period or the aperture value are automatically optimized in accordance with the brightness of an object. For example, when an object is moderately bright and the suitable exposure is obtained with an accumulation period of $1/30$ seconds and the maximum aperture of F2.0 in the second photodiode, the second photodiode is used to perform a motion image capturing. Further, the first photodiode is used for a static image capturing with an accumulation period of $1/125$ seconds and an aperture of F2.0.

Further, when an object is very dark, for example, when the exposure is three-step underexposure even with an accumulation period of $1/30$ seconds and the maximum aperture of F2.0 in the second photodiode, the first photodiode is used for a capturing of a motion image and a static image. In contrast, when an object is very bright, for example, when the exposure is three-step overexposure even with an accumulation period of $1/250$ seconds and the minimum aperture of F16 in the first photodiode, the second photodiode is used for a capturing of a motion image and a static image.

2. A Case where the Capturing Mode is the Capturing Condition Priority Mode

This corresponds to step S3104 of the flowchart illustrated in FIG. 29 and a case where capturing conditions including the accumulation periods of a motion image and a static image set by the photographer are prioritized.

Scene 1 (Dynamic Waves): A Case where Both a Motion Image and a Static Image are Captured with a Short Accumulation Period For example, accumulation periods are set to $1/1000$ seconds and aperture values are set to F5.6 for both a motion image and a static image. When the suitable exposure is obtained in these capturing conditions, the first photodiode is used for both a motion image and a static image. However, when an object is very bright and a pixel signal is thus saturated (overexposure) even with an accumulation period of $1/1000$ seconds and the minimum aperture value of F16, the second photodiode is used for both a motion image and a static image.

Scene 2 (a Stream): A Case where Both a Motion Image and a Static Image are Captured with a Long Accumulation Period For example, accumulation periods are set to $1/6$ seconds and aperture values are set to the minimum value of F16 for both a motion image and a static image. When the suitable exposure is obtained in these capturing conditions, the second photodiode is used for both a motion image and a static image. However, when an object is dark and the exposure is thus underexposure even with an accumulation period of $1/6$ seconds and the maximum aperture value of F2.0, the first photodiode is used for both a motion image and a static image.

Scene 3 (a Motion of a Skateboarder is Captured with a Blur): A Case where a Motion Image is Captured with a Short Accumulation Period and a Static Image is Captured with a Long Accumulation Period For example, an accumulation period of a motion image is set to short $1/250$ seconds and an accumulation period of a static image is set to long $1/30$ seconds. The first photodiode is used for a motion image and the second photodiode is used for a static image. However, when an object is very bright and a pixel signal of the first photodiode is thus saturated (overexposure), the second photodiode is used also for a motion image.

Scene 4 (a Ballerina is Captured with a Stop Motion Effect): A Case where a Motion Image is Captured with a Long Accumulation Period and a Static Image is Captured with a Short Accumulation Period For example, an accumulation period of a motion image is set to long $1/30$ seconds and an accumulation period of a static image is set to short $1/250$ seconds. The second photodiode is used for a motion image and the first photodiode is used for a static image. However, when an object is very bright and a pixel signal of the first photodiode is thus saturated (overexposure) even with an accumulation period of $1/250$ seconds and the minimum aperture value of F16, the second photodiode is used also for a static image.

Figure 30:
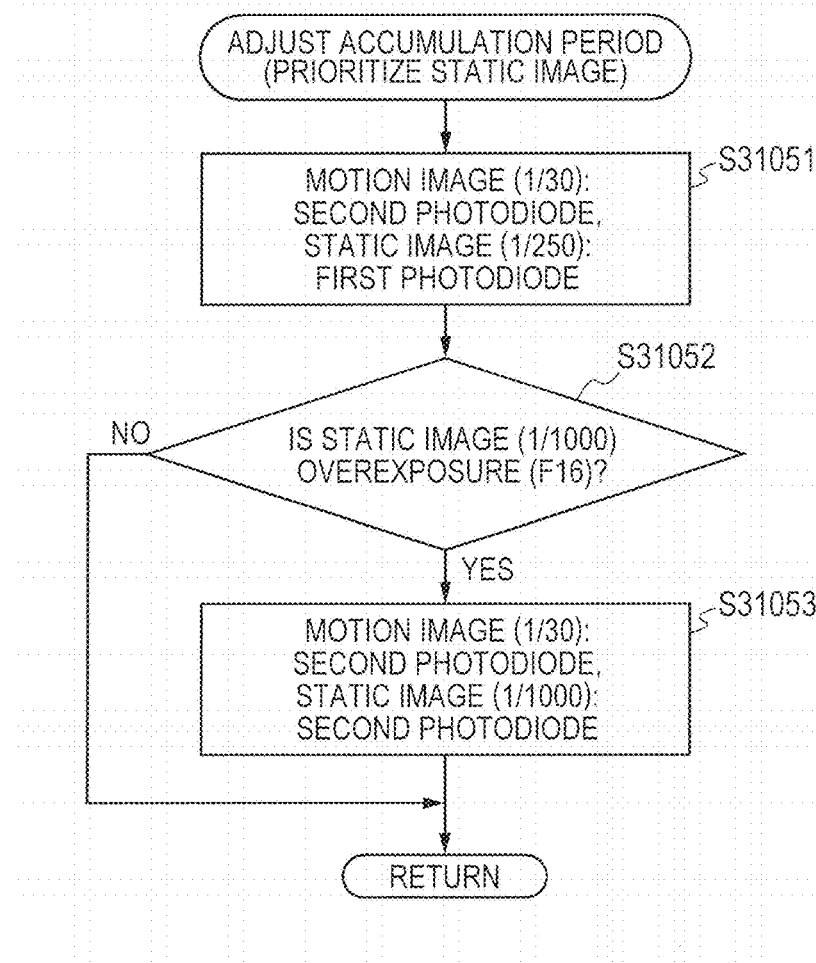
FIG. 30 is a flowchart illustrating a method of selecting a photodiode by prioritizing a static image when the capturing mode is not a capturing condition priority mode in the imaging device according to the third embodiment of the present invention.

FIG. 30 is a flowchart illustrating a method of selecting the photodiode prioritizing a static image when the capturing mode is not the capturing condition priority mode in the imaging device according to the third embodiment of the present invention. FIG. 30 is a subroutine of step S3105 of the flowchart illustrating FIG. 29. In FIG. 30, the first and second photodiodes used for the motion image capturing and the static image capturing are selected by prioritizing an accumulation period of a static image capturing to an accumulation period of a motion image capturing.

At step S31051, the initial values of the first and second photodiodes used for a static image capturing and a motion image capturing are set. For example, the first photodiode (an accumulation period of $1/250$ seconds) is used for a static image, and the second photodiode (an accumulation period of $1/30$ seconds) is used for a motion image.

At step S31052, the photodiodes are selected in accordance with the brightness of an object. When an object is too bright resulting in overexposure of a static image even with an accumulation period of the minimum accumulation period $1/1000$ seconds, which is shorter than the initial value of $1/250$ seconds, and an aperture of the minimum aperture value (F16) for a static image, the process proceeds to step S31053. On the other hand, when the suitable exposure is obtained even with a longer accumulation period than $1/1000$ seconds, the process exits this flowchart and returns to the flowchart of FIG. 29. At step S31053, a static image capturing is set to use the second photodiode in the same manner as a motion image capturing. The process then completes this flowchart and returns to the flowchart of FIG. 29.

That is, in the flowchart illustrated in FIG. 30, when an object is too bright, only the second photodiode of the first and second photodiodes is used. As such, the use of the second photodiode for capturing both a motion image and a static image can reduce the exposure by three steps to prevent saturation of an image.

Figure 31:
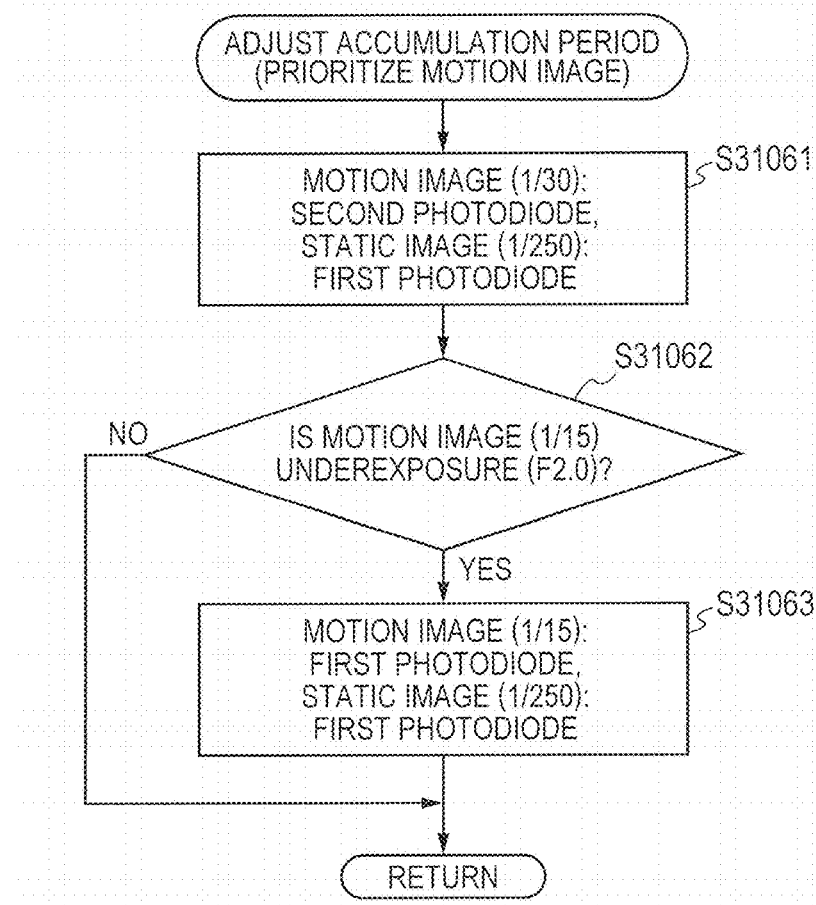
FIG. 31 is a flowchart illustrating a method of selecting a photodiode by prioritizing a motion image when the capturing mode is not a capturing condition priority mode in the imaging device according to the third embodiment of the present invention.

FIG. 31 is a flowchart illustrating a method of selecting the photodiode prioritizing a motion image when the capturing mode is not the capturing condition priority mode in the imaging device according to the third embodiment of the present invention. FIG. 31 is a subroutine of step S3106 of the flowchart illustrating FIG. 29. In FIG. 31, the first and second photodiodes used for the motion image capturing and the static image capturing are selected by prioritizing an accumulation period of a motion image capturing to an accumulation period of a static image capturing.

At step S31061, the initial values of the first and second photodiodes used for a static image capturing and a motion image capturing are set. For example, the first photodiode (an accumulation period of 1/250 seconds) is used for a static image, and the second photodiode (an accumulation period of 1/30 seconds) is used for a motion image.

At step S31062, a selection of the photodiodes is performed in accordance with the brightness of an object. When an object is too dark resulting in underexposure of a motion image even with an accumulation period of the maximum accumulation period of 1/15 seconds, which is the limit against a camera shake and is longer than the initial value of 1/30 seconds, and an aperture of the maximum aperture value (F2.0) for a motion image, the process proceeds to step S31063. On the other hand, when the suitable exposure is obtained even with a shorter accumulation period than 1/15 seconds, the process exits this flowchart and returns to the flowchart of FIG. 29. At step S31063, a motion image capturing is set to use the first photodiode in the same manner as a static image capturing. The process then completes this flowchart and returns to the flowchart of FIG. 29.

That is, in the flowchart illustrated in FIG. 31, when an object is too dark, only the first photodiode of the first and second photodiodes is used. As such, the use of the first photodiode for capturing both a motion image and a static image can increase the exposure by three steps to suppress a noise superimposed on an image.

Figure 32:
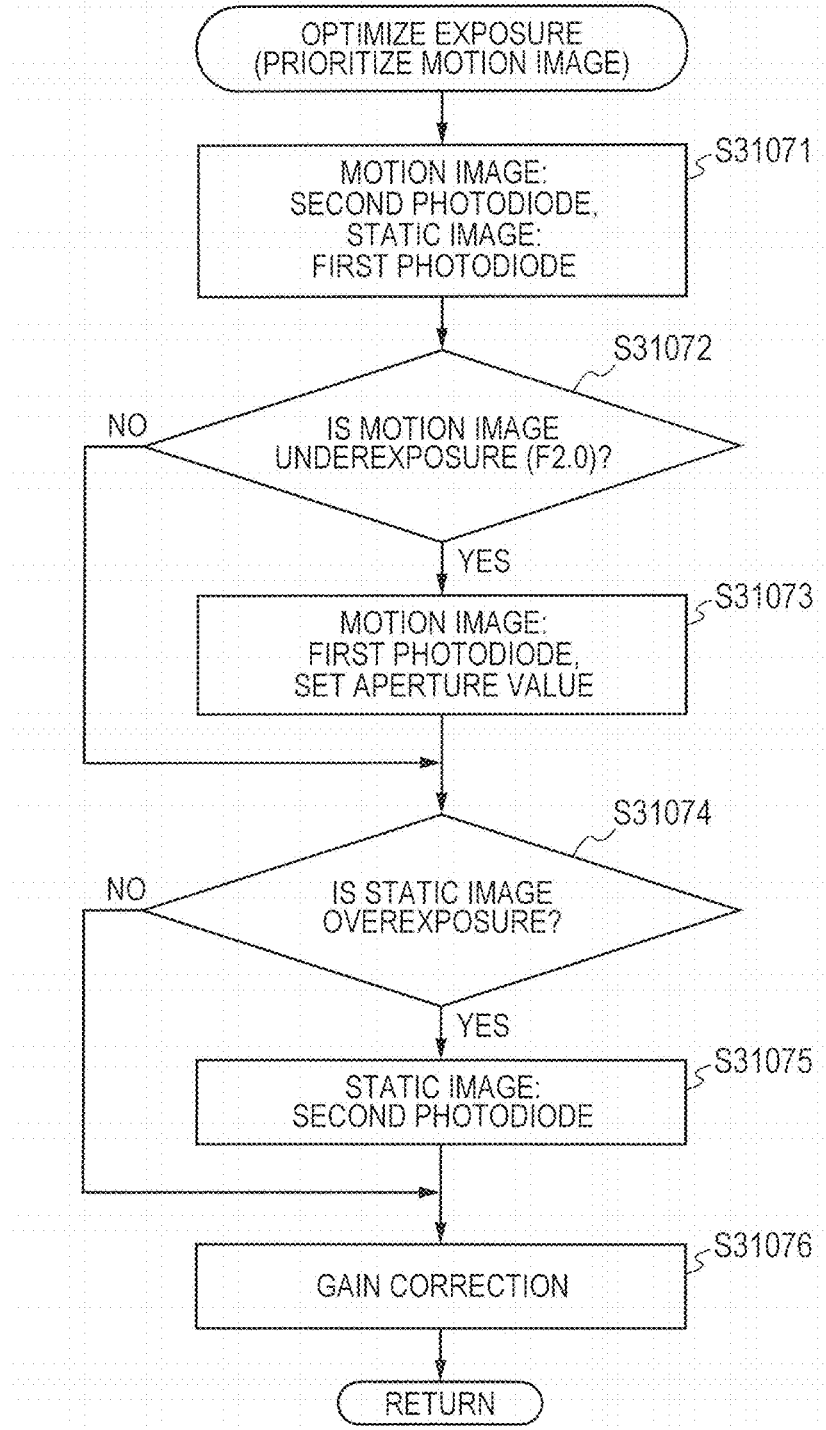
FIG. 32 is a flowchart illustrating a method of selecting a photodiode by prioritizing a motion image when the capturing mode is a capturing condition priority mode in the imaging device according to the third embodiment of the present invention.

FIG. 32 is a flowchart illustrating a method of selecting the photodiode prioritizing a motion image when the capturing mode is the capturing condition priority mode, in the imaging device according to the third embodiment of the present invention. FIG. 32 is a subroutine of step S3107 of the flowchart illustrating FIG. 29. In FIG. 32, the first and second photodiodes used for the motion image capturing and the static image capturing are selected by prioritizing an exposure of a motion image capturing to an exposure of a static image capturing.

At step S31071, a static image is captured by the first photodiode and a motion image is captured by the second photodiode with respective accumulation periods set by the photographer. At step S31072, the photodiode used for a motion image is selected in accordance with the brightness of an object. When the object is dark resulting in underexposure of a motion image even with the maximum aperture value (F2.0), the process proceeds to step S31073. On the other hand, when the suitable exposure is obtained even when the aperture value is less than the maximum aperture value, the process proceeds to step S31074. At step S31073, a change to a setting of using the first photodiode for a motion image capturing is made. An aperture value is then set such that the exposure of a motion image is optimized.

At step S31074, in the same manner as in step S31072, the photodiode used for a static image is selected in accordance with the brightness of an object. When the exposure of a static image becomes overexposure with the aperture value set at step S31073 and the accumulation period specified by the photographer, the process proceeds to step S31075. On the other hand, when the suitable exposure is obtained even with the aperture value set at step S31073 and the accumulation period specified by the photographer, the process proceeds to step S31076. At step S31075, a change to a setting of using the second photodiode for a static image capturing is made. At step S31076, when the suitable exposure is not obtained for a motion image and a static image, the signal gain is corrected. The process then completes this flowchart and returns to the flowchart of FIG. 29.

That is, in the flowchart illustrated in FIG. 32, when an object is too dark, the first photodiode with a high light-receiving efficiency is used to capture a motion image. Further, when an object is too bright, the second photodiode with a low light-receiving efficiency is used to capture a static image.

Figure 33:
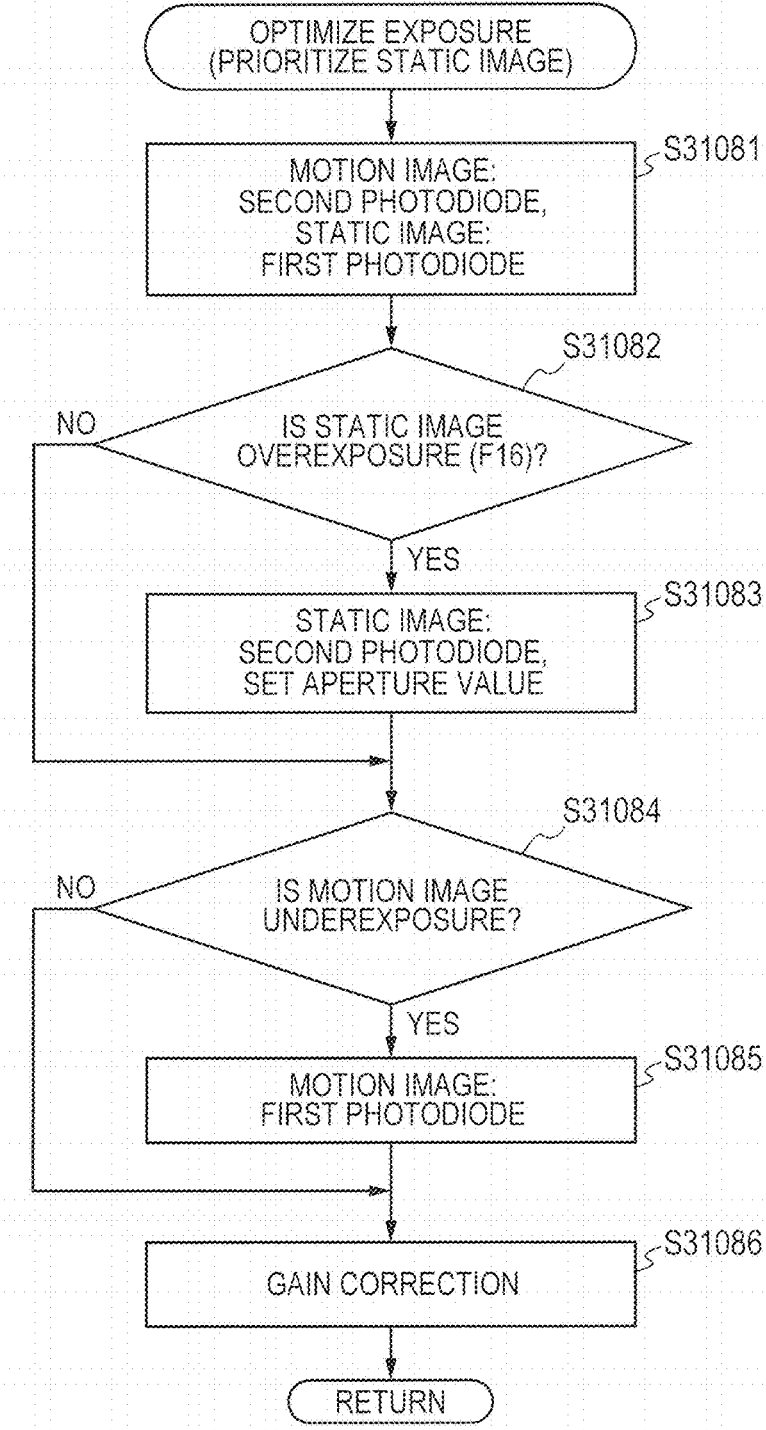
FIG. 33 is a flowchart illustrating a method of selecting a photodiode by prioritizing a static image when the capturing mode is a capturing condition priority mode in the imaging device according to the third embodiment of the present invention.

FIG. 33 is a flowchart illustrating a method of selecting the photodiodes by prioritizing a static image when the capturing mode is the capturing condition priority mode in the imaging device according to the third embodiment of the present invention. FIG. 33 is a subroutine of step S3108 of the flowchart illustrating FIG. 29. In FIG. 33, the first and second photodiodes used for the motion image capturing and the static image capturing are selected by prioritizing the exposure of a static image capturing to the exposure of a motion image capturing.

At step S31081, a static image is captured by the first photodiode and a motion image is captured by the second photodiode with respective accumulation periods set by the photographer. At step S31082, the photodiode used for a static image is selected in accordance with the brightness of an object. When overexposure of a static image is resulted due to the object being bright even with the maximum aperture value (F16), the process proceeds to step S31083. On the other hand, when the suitable exposure is obtained even when the aperture value is greater than the minimum aperture value, the process proceeds to step S31084. At step S31083, a change to a setting of using the second photodiode for a static image capturing is made. An aperture value is then set such that the exposure of a static image is optimized.

At step S31084, in the same manner as in step S31082, the photodiode used for a motion image is selected in accordance with the brightness of an object. When the exposure of a motion image becomes underexposure with the aperture value set at step S31083 and the accumulation period specified by the photographer, the process proceeds to step S31085. On the other hand, when the suitable exposure is obtained even with the aperture value set at step S31083 and the accumulation period specified by the photographer, the process proceeds to step S31086. At step S31085, a change to a setting of using the first photodiode for a motion image capturing is made. At step S31086, when the suitable exposure is not obtained for a motion image and a static image, the signal gain is corrected. The process then completes this flowchart and returns to the flowchart of FIG. 29.

That is, in the flowchart illustrated in FIG. 33, when an object is too bright, the second photodiode with a low light-receiving efficiency is used to capture a static image. Further, when an object is too dark, the first photodiode with a high light-receiving efficiency is used to capture a motion image.

As discussed above, in the present embodiment, a combination of the first and second photodiodes used for a motion image capturing and a static image capturing is selected in accordance with the brightness of an object. This allows for optimization of the exposure for both a motion image and a static image and further optimization of the exposure of the motion image and the static image when simultaneously capturing two images with different capturing conditions by using a single capturing element. Further, in the present embodiment, when both the first and second photodiodes are used, the gain of the first and second photodiode signals is corrected in accordance with the brightness of an object and the light-receiving efficiencies of the first and second photodiodes. This allows for not only prioritizing the accumulation period of one of a motion image capturing and a static image capturing but also optimizing the exposure of the other. Note that, when the capturing mode is not the capturing condition priority mode, the capturing conditions including accumulation period are not always required to be set in advance by the photographer. In this case, the capturing conditions are automatically set in accordance with the brightness of an object.

Fourth Embodiment

An imaging device according to the fourth embodiment of the present invention will be described by using FIG. 34. In the third embodiment, the accumulation period for a motion image is set to 1/30 seconds at step S31051 illustrated in FIG. 30 and step S31061 illustrated in FIG. 31, for example. This is because the accumulation period of 1/30 seconds of a motion image is an accumulation period that causes less jerkiness and is less affected by a camera shake. However, the magnitude of jerkiness depends on a motion of an object and, when a motion of the object is slow, less jerkiness may occur even with a shorter accumulation period. For example, for a motion image of a static object, the accumulation period can be set to 1/125 seconds or the like that is shorter than 1/30 seconds. Therefore, a method of adjusting an accumulation period for a motion image in accordance with the magnitude of a motion of an object will be described in the present embodiment.

Figure 34:
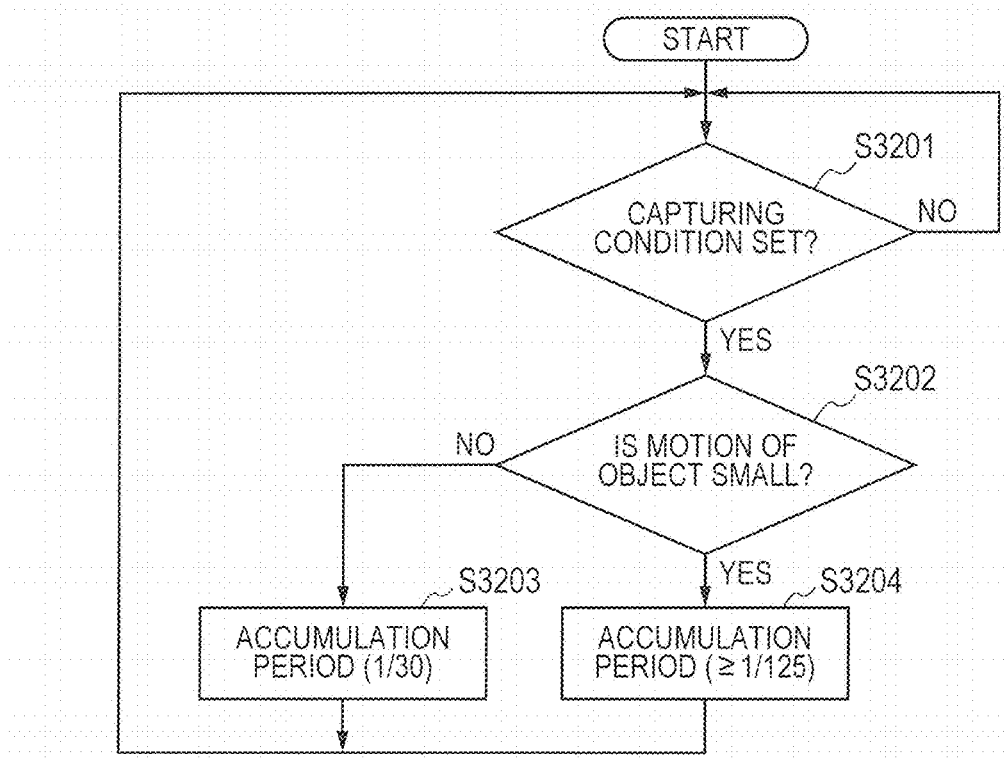
FIG. 34 is a flowchart of a method of adjusting an accumulation period of a motion image in accordance with the magnitude of a motion of an object in an imaging device according to a fourth embodiment of the present invention.

FIG. 34 is a flowchart of a method of adjusting an accumulation period for a motion image in accordance with the magnitude of a motion of an object in the imaging device according to the fourth embodiment of the present invention. The flowchart illustrated in FIG. 34 is repeatedly performed by the system control CPU 178 from the start of an operation of the imaging element 184 to the end of the operation. Note that, in this flowchart, operations that are less relevant to the present invention are omitted to illustrate an algorithm in a clearly understandable manner.

At step S3201, the process is on standby until it is detected that a photographer has set capturing conditions by using switch input 179. At step S3202, a motion of an object is detected. A motion of an object can be detected by utilizing a motion vector or the like obtained by time comparison of image signals from the imaging element, for example. When a motion vector is small and the orientation thereof does not frequently change, it is determined that a motion of an object is small. If a motion of an object is determined to be small, the process then proceeds to step S3204, otherwise, the process proceeds to step S3203. At step S3203, an initial value of an accumulation period of a motion image capturing is set to 1/30 seconds. On the other hand, at step S3204, the initial value of the accumulation period for a motion image, that is, 1/30 seconds set at step S3203 is reduced to 1/125 seconds at the minimum in accordance with the brightness of an object.

Thereby, since the lower limit that can be set as an accumulation period of a motion image is further reduced, a range of the accumulation period by which a motion image can be captured with the suitable exposure is expanded. Note that, while an example in which the lower limit of the accumulation period for a motion image capturing is adjusted when a motion of an object is small is illustrated in FIG. 34, it is possible, in a similar manner, to adjust the upper limit of the accumulation period for a motion image capturing when a motion of an object is large.

As discussed above, an accumulation period of a motion image capturing is adjusted in accordance with the magnitude of a motion of an object in the present embodiment. Since this results in a wider range of the accumulation period by which a motion image can be captured with the suitable exposure, the exposure of a motion image and a static image can be further optimized.

Further, the first and second photodiodes are selected in accordance with the brightness of an object and/or the accumulation periods set by a photographer and captured data is stored as data of a motion image and data of a static image, respectively, and thereby an image with less noise can be obtained in various capturing conditions. Furthermore, the first and second photodiodes are combined properly in accordance with capturing conditions when a motion image and a static image are simultaneously captured, which allows for obtaining a high quality image.

Further, a factor as to whether the suitable exposure is prioritized or the accumulation period is prioritized (to remove jerkiness or provide a stop motion effect) is added in the selection of the first photodiode and the second photodiode in a motion image and a static image, which allows for continuing a high quality capturing with an easy operation. Furthermore, the first and second photodiodes are properly selected to detect the object brightness when capturing conditions are set, which enables accurate setting of capturing conditions.

Fifth Embodiment

The imaging device according to the fifth embodiment of the present invention will be described by using FIG. 35 and FIG. 36. The third embodiment has described a method of switching the photodiodes used for a motion image capturing and a static image capturing in accordance with the brightness of an object. In the present embodiment, a method of causing a change in an image to be less visible when the photodiodes are switched will be described.

The brightness of an object is not always constant during a capturing. Thus, an object may become dark during a motion image capturing and thus a motion image capturing by the second photodiode may be switched to a motion image capturing by the first photodiode. Conversely, an object may become bright causing a motion image capturing by the first photodiode to be switched to a motion image capturing by the second photodiode. Therefore, a method of performing a pixel switching during a capturing in a high quality manner in such a situation will be described in the present embodiment.

For example, let us assume a situation where an object becomes suddenly dark during a motion image capturing and thus a capturing by the second photodiode is switched to a capturing by the first photodiode. It is assumed here that the second photodiode is currently performing a motion image capturing with the maximum accumulation period of 1/15 seconds that is natural number times a frame period. It is then assumed that, because the object has become dark, a longer accumulation period (for example, 1/4 seconds) is required. At this time, in order to maintain a light amount without increasing the accumulation period, the capturing by the second photodiode is switched to a capturing by the first photodiode. Since the sensitivity of the first photodiode is higher by three times than that of the second photodiode, the accumulation period can be reduced to ⅟₃₀ seconds. However, since an accumulation period that is different from the previous accumulation period of ⅟₁₅ seconds will not provide a motion image intended by the photographer, the accumulation period of the first photodiode is also set to ⅟₁₅ seconds for the capturing. At this time, in order to obtain the suitable exposure, an aperture value will be further reduced by one step. Even when the motion image exposure is optimized by changing the aperture value while maintaining the same accumulation periods, a motion image representation would be different because an object depth changes from that in the previous motion image. To address this, the digital signal processor 188 corrects the exposure caused when the second photodiode is switched to the first photodiode by further decreasing the gain by one step with respect to a signal obtained by the first photodiode.

With the process described above, a motion image without S/N ratio degradation can be continued without causing a change in the motion representation. Because of variation in the sensitivity of the first and second photodiodes, however, switching the photodiodes all at once may cause a change in an image and a decrease in a motion image quality. To address this, the photodiodes are switched gradually at a predefined time constant in the present embodiment.

Figure 35:
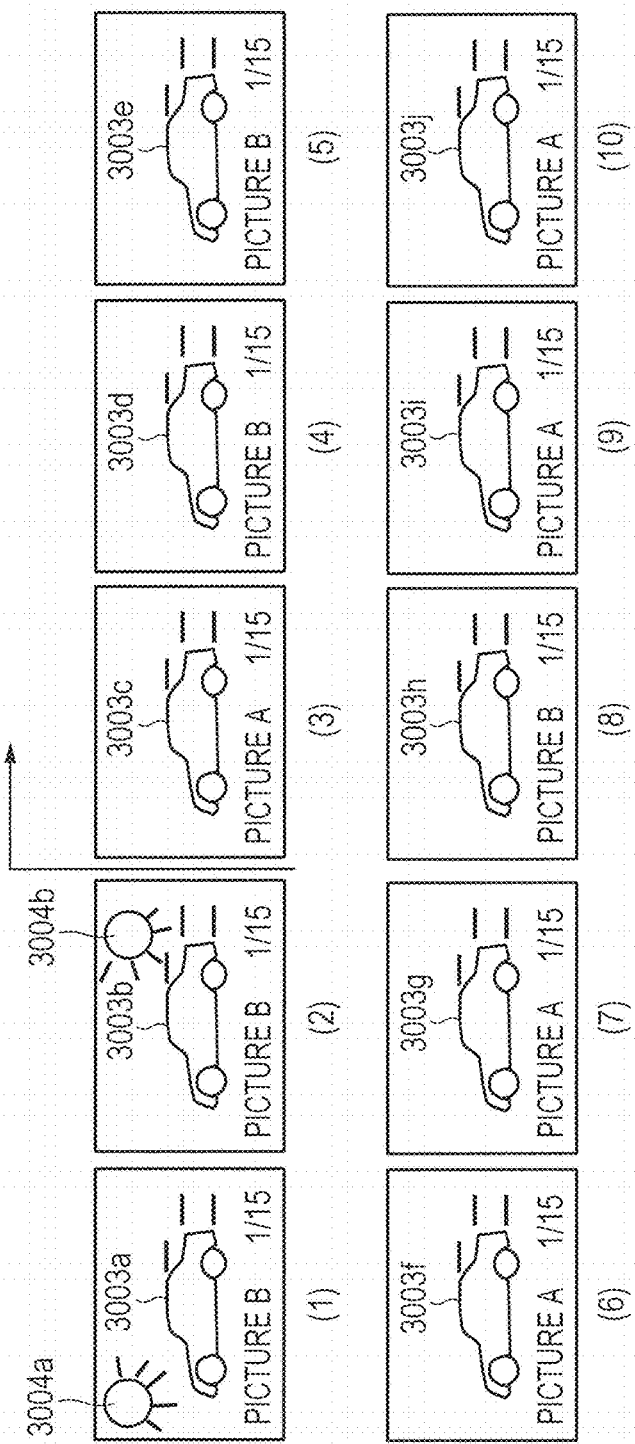
FIG. 35 is a diagram illustrating a method of gradually switching photodiodes used for capturing a motion image in an imaging device according to a fifth embodiment of the present invention.

FIG. 35 is a diagram illustrating a method of gradually switching the photodiodes used for a motion image capturing in the imaging device according to the fifth embodiment of the present invention. FIG. 35 illustrates an image including 10 frames when the photodiodes are switched. In FIG. 35, a frame number is indicated under each frame. For example, "(1)" indicates the first frame. In the following description, the n-th frame is denoted as "frame (n)".

A frame (1) is captured by using the second photodiodes ("picture B") with an accumulation period of ⅟₁₅ seconds. In the frame (1), a traveling vehicle 3003*a* that is an object is illuminated bright by a nearby lighting 3004*a*. After the capturing is continued such that the traveling vehicle 3003*a* is located in the center of a screen, a frame (2) is captured by using the second photodiodes ("picture B") that are the same as in the frame (1) with the accumulation period of ⅟₁₅ seconds. In the frame (2), the position of the lighting 3004*b* to the traveling vehicle 3003*b* has changed. Then, on and after a frame (3), the lighting 3004*b* is out of the frame and the traveling vehicles 3003*c* to 3003*j* are dark.

In the present embodiment, the photodiodes used for the capturing is therefore switched to the first photodiodes ("picture A"). This prevents S/N ratio degradation of an image. As described above, since it is necessary to compensate the exposure when the second photodiodes are switched to the first photodiodes, the digital signal processor 188 decreases the gain of the first photodiode signal by one step. In this case, the degradation of the S/N ratio is not large due to the downward change of the gain. On and after the frame (3), it is desirable to use the first photodiodes for the capturing, because the object remains dark. In the present embodiment, however, frames (4) and (5) are captured by again using the second photodiodes ("picture B") so that a change in the image due to the switching of the photodiodes is less visible. The shortage of exposure is addressed by increasing the gain of the second photodiode signal by two steps. In this case, the S/N ratio would be degraded due to the two-step increase of the gain.

Frames (6) and (7) are captured by using the first photodiodes ("picture A") and the overexposure is addressed by decreasing the gain of the first photodiode signal by one step. A frame (8) is captured by again using the second photodiodes ("picture B") and the shortage of exposure is addressed by increasing the gain of the second photodiode signal by two steps. A frame (9) and the subsequent frame are captured by using the first photodiodes ("picture A") and the overexposure is addressed by decreasing the gain of the first photodiode signal by one step.

In such a way, since the photodiodes are switched taking a predetermined time, a high quality motion image capturing can be continued without a sudden change in the image quality even when the brightness of an object changes.

Figure 36:
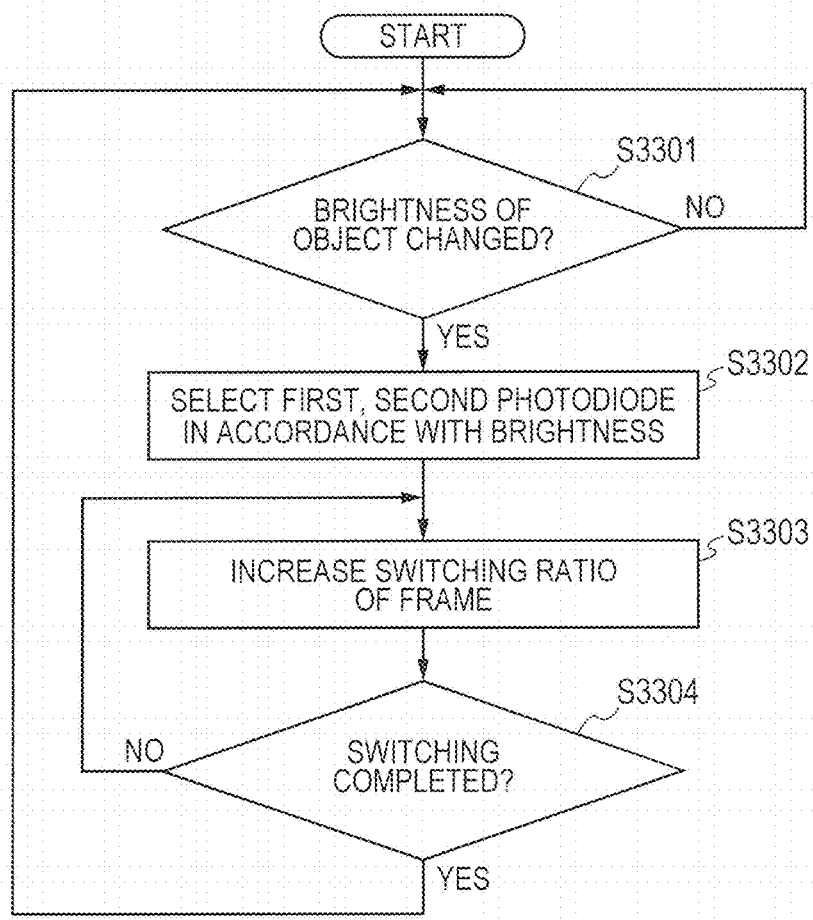
FIG. 36 is a flowchart of the method of gradually switching photodiodes used for capturing a motion image in the imaging device according to the fifth embodiment of the present invention.

FIG. 36 is a flowchart of a method of gradually switching the photodiodes used for a motion image capturing in the imaging device according to the fifth embodiment of the present invention. The flow in FIG. 36 is repeatedly performed by the system control CPU 178 from the start of a capturing operation to the end of the operation. Note that, in this flowchart of FIG. 36, operations that are less relevant to the present invention are omitted to illustrate an algorithm in a clearly understandable manner.

At step S3301, it is determined whether or not the brightness of an object changes above a predetermined level. During the brightness of an object does not change above a predetermined level, step S3301 is repeated. If the brightness of the object changes above a predetermined level, the process proceeds to step S3302. At step S3302, a switching to the first or second photodiode is applied in accordance with the brightness of the object.

For example, as described by using FIG. 35, when an object to be captured becomes dark, a switching to the first photodiode is applied and the signal gain is adjusted as necessity. In contrast, when an object becomes bright, a switching to the second photodiode is applied and the signal gain is adjusted as necessity. When the second photodiode is currently used for a capturing and an object becomes much brighter, the photodiodes are not switched and the signal gain is decreased. Also, when the first photodiode is currently being used for a capturing and an object becomes much darker, the photodiodes are not switched and the signal gain is increased.

At step S3303, as described with the frame (3) to the frame (8) of FIG. 35, the number of frames to be switched is gradually increased as the capturing frame advances (with time).

At step S3304, it is determined whether or not a switching of photodiodes has been completed. Until the ratio of the frames captured by the switched photodiodes becomes 100%, the process returns to step S3303 to repeat the switching process. Then, upon the completion of the switching of the photodiodes, the process returns to step S3301.

As discussed above, in the present embodiment, when the photodiodes used for a motion image are switched, the ratio of frames captured by the switched photodiodes is gradually increased with a predefined time constant. Thereby, a change in an image due to a switching of the photodiodes can be less visible.

Sixth Embodiment

An imaging device according to the sixth embodiment of the present invention will be described by using FIG. 37 and FIG. 38. The fifth embodiment has described the method of gradually increasing the ratio of frames captured by the switched photodiodes when switching the photodiodes. In contrast, in the present embodiment, a method of gradually expanding a pixel area within a frame (hereafter, simply referred to as "area") captured by using the switched photodiodes will be described.

Figure 37:
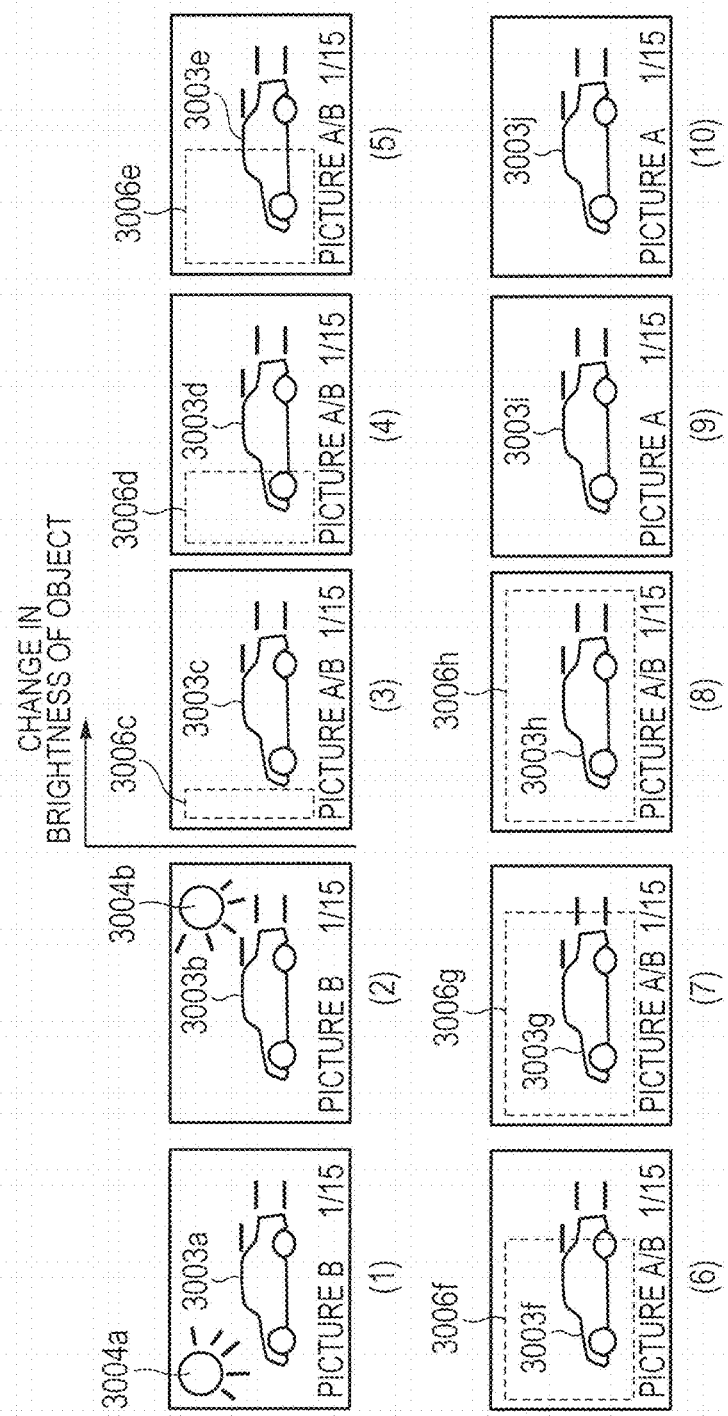
FIG. 37 is a diagram illustrating a method of gradually switching photodiodes used for capturing a motion image in an imaging device according to a sixth embodiment of the present invention.

FIG. 37 is a diagram illustrating a method of gradually switching the photodiodes used for a motion image capturing in the imaging device according to the sixth embodiment of the present invention. FIG. 37 illustrates an image including 10 frames when the photodiodes are switched. In FIG. 37, a frame number is indicated under each frame. For example, "(1)" indicates the first frame. In the following description, the n-th frame is denoted as "frame (n)".

A frame (1) is captured by using the second photodiodes ("picture B") with an accumulation period of 1/15 seconds. In the frame (1), the traveling vehicle 3003a that is an object is illuminated bright by the nearby lighting 3004a. After the capturing is continued such that the traveling vehicle 3003a is located in the center of a screen, a frame (2) is captured by using the second photodiodes ("picture B") that are the same as in the frame (1) with an accumulation period of 1/15 seconds. In the frame (2), the position of the lighting 3004b to the traveling vehicle 3003b has changed. Then, on and after a frame (3), the lighting 3004b is out of the frame and the traveling vehicles 3003c to 3003j are dark.

In the present embodiment, an area 3006c of a part of the frame is then switched to a capturing by using the first photodiodes ("picture A"). This prevents S/N ratio degradation of an image in the area 3006c. As described above, since it is necessary to compensate the exposure when the second photodiodes are switched to the first photodiodes, the digital signal processor 188 decreases the gain of the first photodiode signal by one step. An area other than the area 3006c is continued to be captured by using the second photodiodes, and the gain is increased by two steps to correct the exposure for the reduced brightness of the object. In a frame (4), the area 3006d is captured by using the first photodiodes and other area is captured by the second photodiodes. Then, in a similar manner, from a frame (5) to a frame (8), the area where the first photodiodes are used is increased as illustrated from the areas 3006e to 3006h. On and after a frame (9), the entire area is captured by using the first photodiodes.

In such a way, since the photodiodes are switched taking a predetermined time, a high quality motion image capturing can be continued without a sudden change in the image quality even when the brightness of an object changes.

Note that, in FIG. 37, it has been exemplified that the area of the first photodiodes is gradually increased from the left in the screen. This is because, when a camera is panned to follow an object, a change in the image quality is less visible when the direction of panning corresponds to the direction of the switching of the photodiodes. Therefore, it is desirable to determine a start point and a direction of the switching area in accordance with a motion of an object within a frame angle. For example, when the direction to follow an object is different from that illustrated in FIG. 37, a start point of an area from which the photodiodes are switched is changed in accordance with the direction to follow the object. On the other hand, in such a case where an object is stopped, the photodiodes are switched in a radial direction from the center of a primary object as a start point.

Figure 38:
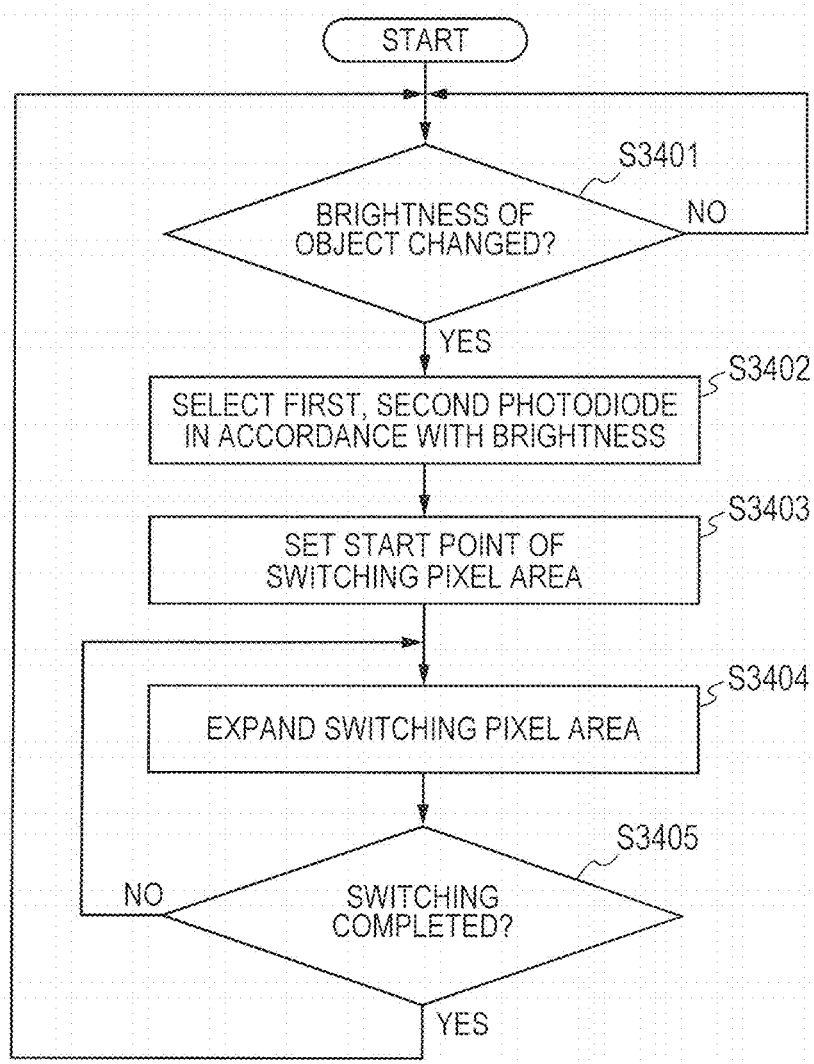
FIG. 38 is a flowchart of the method of gradually switching photodiodes used for capturing a motion image in the imaging device according to the sixth embodiment of the present invention.

FIG. 38 is a flowchart of a method of gradually switching the photodiodes used for a motion image capturing in the imaging device according to the sixth embodiment of the present invention. FIG. 38 is repeatedly performed by the system control CPU 178 from the start of a capturing operation to the end of the operation. Note that, in the flowchart of FIG. 38, operations that are less relevant to the present invention are omitted to illustrate an algorithm in a clearly understandable manner.

At step S3401, it is determined whether or not the brightness of an object changes above a predetermined level. When the brightness of an object does not change above a predetermined level, step S3401 is repeated. When the brightness of an object changes above a predetermined level, the process proceeds to step S3402. At step S3402, a switching of the first photodiodes or the second photodiodes is applied in accordance with the brightness of the object.

For example, as illustrated by using FIG. 37, when a capturing object becomes dark, a switching to the first photodiodes is applied and the signal gain is adjusted as necessity. In contrast, when the object becomes bright, a switching to the second photodiode is applied and the signal gain is adjusted as necessity. When the second photodiodes are currently used for a capturing and the object becomes much brighter, the photodiodes are not switched and the signal gain is decreased. Further, when the first photodiode is currently used for a capturing and the object becomes much darker, the photodiodes are not switched and the signal gain is increased.

At step S3403, an area from which switching of the photodiodes is started is set. As described before, when a camera is panned to capture an object, the direction change of the camera is detected by a gyro and/or a motion vector of the imaging element, and an end of the screen is set as an area from which the switching is started in accordance with the detected direction and/or movement. On the other hand, when the camera is not being panned, a high contrast area (for example, a primary object in focus) is set as a starting area of the switching.

At step S3404, as described with the frame (3) to the frame (8) of FIG. 37, the area where the photodiodes are switched is expanded as a capturing frame advances (with time). Also in this case, as seen in the case where the camera is being panned, the switching area is expanded in the panning direction from a starting point of the switching area set at step S3401 when the camera is moving. On the other hand, when the camera is not being panned, a switching area is expanded in a radial direction from a primary object as the center. The starting point and the switching direction of pixel areas may be determined by a movement of the object included in the screen instead of a movement of the camera.

At step S3405, it is determined whether or not the switching of the photodiodes have been completed in the entire area. Until the switching of the photodiodes have been completed in the entire area, the process returns to step S3404 to repeat the switching process. Upon the completion of the switching of the photodiodes, the process returns to step S3401.

As discussed above, in the present embodiment, when the photodiodes used for a motion image are switched, a frame pixel area captured by using the switched photodiodes is gradually expanded at a predefined time constant. Thereby, a change in an image due to the switching of photodiodes can be less visible.

Seventh Embodiment

An imaging device according to the seventh embodiment of the present invention will be described by using FIG. 39 to FIG. 43. The first embodiment has described the method of selectively using two types of photodiodes with different light-receiving efficiencies in accordance with capturing conditions for a motion image capturing and a static image capturing. In contrast, in the present embodiment, described will be a method of controlling the duration of an accumulation period of one type of photodiodes in accordance with capturing conditions of a motion image capturing and a static image capturing to obtain substantially the same advantageous effects as in the first embodiment.

Figure 39:
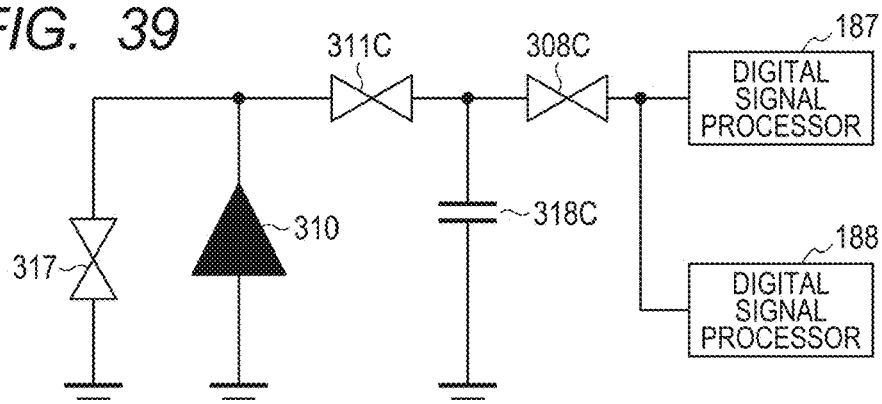
FIG. 39 is a schematic diagram illustrating an equivalent circuit of an imaging element in an imaging device according to a seventh embodiment of the present invention.

FIG. 39 is a schematic diagram illustrating an equivalent circuit of the imaging element 184 in the imaging device according to the seventh embodiment of the present invention. The imaging element 184 of the present embodiment has a photodiode 310, an overflow transistor 317, a transfer transistor 311C, a charge holding unit 318C, a readout circuit 308C, and digital signal processors 187 and 188.

The photodiode 310 photoelectrically converts a light flux from an object and accumulates charges generated by the photoelectric conversion. The transfer transistor 311C transfers charges accumulated in the photodiode 310 to the charge holding unit 318C. The charge holding unit 318C holds charges transferred from the photodiode 310. The readout circuit 308C reads out a pixel signal in accordance with the amount of charges held in the charge holding unit 318C. The digital signal processors 187 and 188 process the pixel signal read out by the readout circuit 308C.

The imaging element 184 of the present embodiment is featured in having the overflow transistor 317. The overflow transistor 317 can be controlled by the vertical scanning circuit 307 illustrated in FIG. 3. In response to the overflow transistor 317 being turned on, charges accumulated in the photodiode 310 are drained to an overflow drain such as a power source node. Therefore, the accumulation period that is a period during which charges are accumulated in the photodiode 310 can be controlled by controlling the overflow transistor 317.

Specifically, the vertical scanning circuit 307 controls the overflow transistor 317 to be turned off from an on-state and starts accumulation of charges by the photodiode 310. Then, after a desired accumulation period has elapsed, the vertical scanning circuit 307 turns on the transfer transistor 311C to transfer charges accumulated in the photodiode 310 to the charge holding unit 318C. Thereby, charges accumulated in the charge holding unit 318C during a period of an off-state of the overflow transistor 317 are transferred to the charge holding unit 318C. At the same time, the vertical scanning circuit 307 controls the overflow transistor 317 to be turned on form an off-state to complete charge accumulation by the photodiode 310. The readout circuit 308C then reads out a pixel signal in accordance with the amount of charges held in the charge holding unit 318C.

A method of controlling an accumulation period of the photodiode 310 when a motion image and a static image of respective scenes illustrated in FIG. 24 to FIG. 27 are captured will be described below as an example of an imaging method in the imaging element 184 of the present embodiment illustrated in FIG. 39. Note that, although the digital signal processor 187 generates a static image and the digital signal processor 188 generates a motion image in the following description, the opposite thereof is possible, or the digital signal processors 187 and 188 may be used by switching on a frame period basis.

Figure 40:
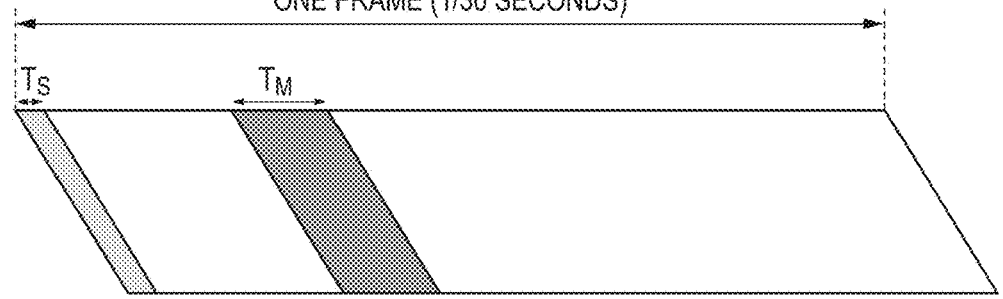
FIG. 40 is a diagram illustrating a control method when capturing both a motion image and a static image in a short accumulation period in the imaging device according to the seventh embodiment of the present invention.

FIG. 40 is a diagram illustrating a control method when capturing both a motion image and a static image in a short accumulation period in the imaging device according to the seventh embodiment of the present invention. FIG. 40 illustrates a method of controlling the accumulation period of the photodiode 310 during one frame when capturing the motion image and the static image illustrated in FIG. 24.

The vertical scanning circuit 307 first controls the overflow transistor 317 to accumulate charges in the photodiode 310 with the capturing condition of an accumulation period $T_S = 1/1000$ seconds. Next, the vertical scanning circuit 307 controls the transfer transistor 311C to transfer charges accumulated in the photodiode 310 to the charge holding unit 318C. The digital signal processor 187 reads out, via the readout circuit 308C, a pixel signal that is based on the amount of charges transferred to the charge holding unit 318C and generates a static image illustrated in FIG. 24.

Subsequently, the vertical scanning circuit 307 first controls the overflow transistor 317 to accumulate charges in the photodiode 310 with the capturing condition of an accumulation period $T_M = 1/250$ seconds. Next, the vertical scanning circuit 307 controls the transfer transistor 311C to transfer charges accumulated in the photodiode 310 to the charge holding unit 318C. The digital signal processor 188 reads out, via the readout circuit 308C, a pixel signal that is based on the amount of charges transferred to the charge holding unit 318C and generates a motion image illustrated in FIG. 24.

As a result, while a motion image with a jerkiness effect can be captured by the capturing condition of the short accumulation period of 1/250 seconds, a static image with a stop motion effect can be captured by the capturing condition of the short accumulation period of 1/1000 seconds.

Figure 41:
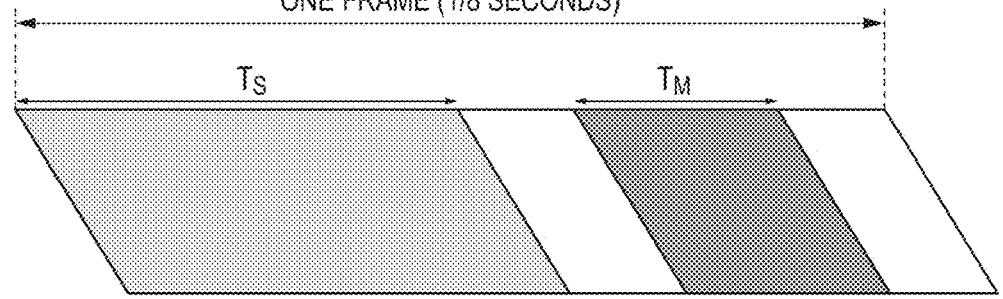
FIG. 41 is a diagram illustrating a control method when capturing both a motion image and a static image in a long accumulation period in the imaging device according to the seventh embodiment of the present invention.

FIG. 41 is a diagram illustrating a control method when capturing both a motion image and a static image in a longer accumulation period in the imaging device according to the seventh embodiment of the present invention. FIG. 41 illustrates a method of controlling the accumulation period of the photodiode 310 during one frame when capturing the motion image and the static image illustrated in FIG. 25.

The control method illustrated in FIG. 41 is the same as the control method illustrated in FIG. 40 except that both a motion image and a static image are captured with a longer accumulation period. Specifically, a pixel signal based on the amount of charges accumulated in the photodiode 310 with the capturing condition of the accumulation period $T_S = 1/15$ seconds is read out to generate a static image illustrated in FIG. 25. In a similar manner, a pixel signal based on the amount of charges accumulated in the photodiode 310 with the capturing condition of the accumulation period $T_M = 1/30$ seconds is read out to generate a motion image illustrated in FIG. 25. As a result, while a static image with a blur effect can be captured in the capturing condition of the long accumulation period of 1/15 seconds, a motion image with less jerkiness can be captured by the capturing condition of the short accumulation period of 1/30 seconds.

Figure 42:
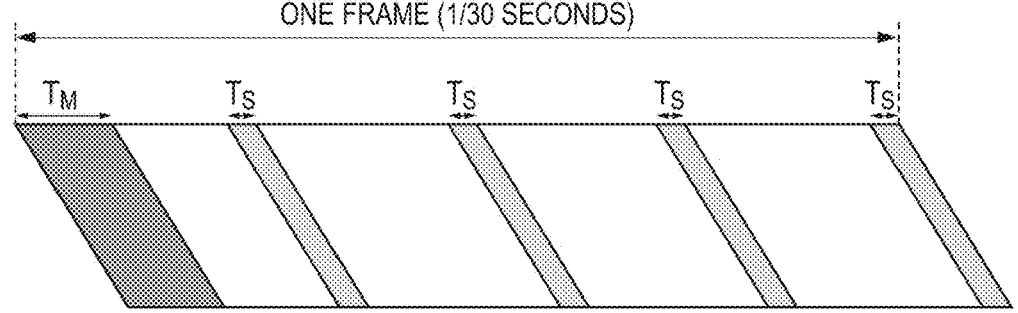
FIG. 42 is a diagram illustrating a control method when capturing a motion image in a short accumulation period and a static image in a long accumulation period in the imaging device according to the seventh embodiment of the present invention.

FIG. 42 is a diagram illustrating a control method when capturing a motion image in a short accumulation period and capturing a static image in a long accumulation period in the imaging device according to the seventh embodiment of the present invention. FIG. 42 illustrates a method of controlling the accumulation period of the photodiode 310 during one frame when capturing the motion image and the static image illustrated in FIG. 26.

The control method illustrated in FIG. 42 is basically the same as the control method illustrated in FIG. 40 except that a motion image is captured with a short accumulation period and a static image is captured with a long accumulation period. Note that four accumulation periods $T_S$ are arranged distributed within one frame of 1/30 seconds and therefore the accumulation period for a static image capturing substantially corresponds to 1/30 seconds.

Specifically, the vertical scanning circuit 307 first controls the overflow transistor 317 to accumulate charges in the photodiode 310 with the capturing condition of the accumulation period $T_M = 1/250$ seconds. Next, the vertical scanning circuit 307 controls the transfer transistor 311C to transfer charges accumulated in the photodiode 310 to the charge holding unit 318C. The digital signal processor 188 reads out, via the readout circuit 308C, a pixel signal that is based on the amount of charges transferred to the charge holding unit 318C and generates a motion image illustrated in FIG. 26.

Subsequently, the vertical scanning circuit 307 first controls the overflow transistor 317 and accumulates charges in the photodiode 310 with the capturing condition of the accumulation period $T_S=1/1000$ seconds. Next, the vertical scanning circuit 307 controls the transfer transistor 311C to transfer charges accumulated in the photodiode 310 to the charge holding unit 318C. The vertical scanning circuit 307 repeats this process for four times during one frame period. The digital signal processor 187 reads out, via the readout circuit 308C, a pixel signal that is based on the amount of charges corresponding to four times of the accumulation periods $T_S$ transferred to the charge holding unit 318C and generates a static image illustrated in FIG. 26.

The actual accumulation period of the resultant static image is $1/1000$ seconds×4 times=$1/250$ seconds, which is shorter than the accumulation period of $1/30$ seconds of the static image illustrated in FIG. 26. As illustrated in FIG. 42, however, with the four accumulation periods $T_S$ being arranged distributed within one frame period of $1/30$ seconds, a static image whose accumulation period substantially corresponds to $1/30$ seconds can be obtained in a similar manner to FIG. 26. This allows for capturing a lively motion image with a blur effect.

Figure 43:
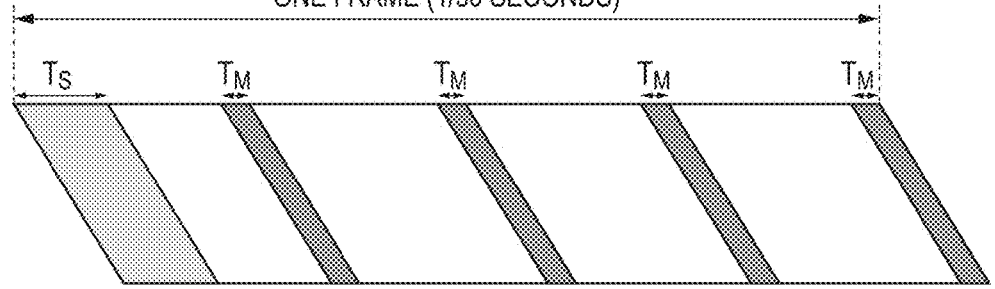
FIG. 43 is a diagram illustrating a control method when capturing a motion image in a long accumulation period and a static image in a short accumulation period in the imaging device according to the seventh embodiment of the present invention.

FIG. 43 is a diagram illustrating a control method when capturing a motion image in a long accumulation period and capturing a static image in a short accumulation period in the imaging device according to the seventh embodiment of the present invention. FIG. 43 illustrates a method of controlling the accumulation period of the photodiode 310 during one frame when capturing the motion image and the static image illustrated in FIG. 27.

The control method illustrated in FIG. 43 is the same as the control method illustrated in FIG. 42 except that a motion image is captured with a long accumulation period and a static image is captured with a short accumulation period. Specifically, a pixel signal based on the amount of charges accumulated in the photodiode 310 with the capturing condition of the accumulation period $T_S=1/250$ seconds is read out to generate a static image illustrated in FIG. 27. Subsequently, a pixel signal based on the amount of charges for four accumulation periods $T_M$ accumulated in the photodiode 310 with the capturing condition of the accumulation period $T_M=1/1000$ seconds is read out to generate a motion image illustrated in FIG. 27.

The actual accumulation period of the resultant motion image is $1/1000$ seconds×4 times=$1/250$ seconds, which is shorter than the accumulation period of $1/30$ seconds of the motion image illustrated in FIG. 27. As illustrated in FIG. 43, however, with the four accumulation periods $T_M$ being arranged distributed within one frame period of $1/30$ seconds, a motion image whose accumulation period substantially corresponds to $1/30$ seconds can be obtained in a similar manner to FIG. 27. This allows for capturing a motion image with less jerkiness.

As discussed above, the imaging element of the present embodiment has a third photoelectric conversion unit (the photodiode 310) that photoelectrically converts a light flux from an object and accumulates the generated charges and an overflow transistor that drains charges accumulated in the third photoelectric conversion unit. Then, the control unit (the vertical scanning circuit, the system control CPU) of the present embodiment controls the overflow transistor to control an accumulation period for a motion image capturing and an accumulation period for a static image capturing in the third photoelectric conversion unit. Thereby, the durations of accumulation periods for a motion image capturing and a static image capturing can be controlled in accordance with capturing conditions, which allows for obtaining substantially the same advantageous effects as those in the first embodiment. Note that, although four accumulation periods are arranged distributed within one frame period in FIG. 42 and FIG. 43, the number of accumulation periods is not limited to four, and similar advantageous effects can be obtained also in the case where more accumulation periods are arranged within one frame period.

Eighth Embodiment

An imaging device according to the eighth embodiment of the present invention will be described by using FIG. 44 to FIG. 48. In the seventh embodiment, the configuration in which one imaging element 184 has one charge holding unit 318C has been described. In contrast, in the present embodiment, a configuration in which one imaging element 184 has two charge holding units 318C and 318D will be described. In the following, arrangements that are different from those in the seventh embodiment will be mainly described, and the description of the same arrangements as those in the seventh embodiment may be omitted.

Figure 44:
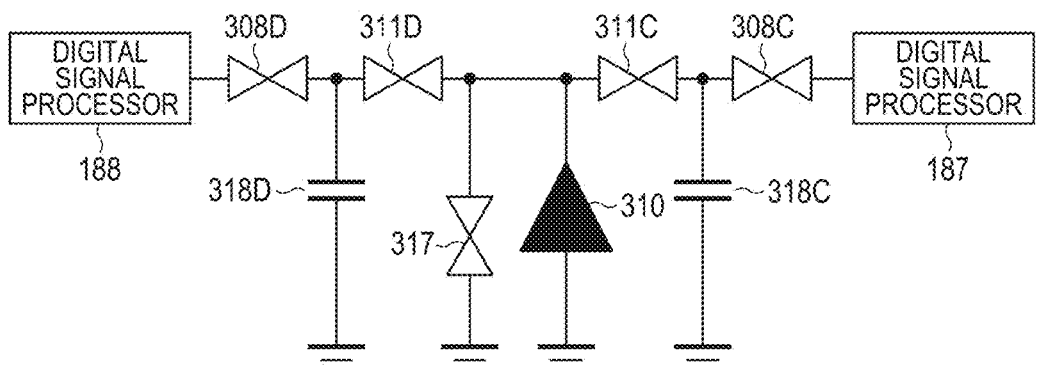
FIG. 44 is a schematic diagram illustrating an equivalent circuit of an imaging element in an imaging device according to an eighth embodiment of the present invention.

FIG. 44 is a schematic diagram illustrating an equivalent circuit of the imaging element 184 in the imaging device according to the eighth embodiment of the present invention. The imaging element 184 of the present embodiment is featured in having two charge holding units 318C and 318D. Further, due to such an arrangement, the imaging element 184 has transfer transistors 311C and 311D that transfer charges accumulated in the photodiode 310 to the charge holding units 318C and 318D, respectively. Further, the imaging element 184 has readout circuits 308C and 308D that read out pixel signals in accordance with the amounts of charges held in the charge holding units 318C and 318D, respectively.

Such a configuration allows the imaging element 184 of the present embodiment to transfer charges to one of the charge holding units 318C and 318D and hold the charges even when pixel signals are read out in accordance with the amounts of charges held in the other. Further, it is possible to separately control the two transfer transistors 311C and 311D to separately transfer charges to the charge holding units 318C and 318D, respectively. Further, it is also possible to separately control two readout circuits 308C and 308D to separately read out pixel signals from the charge holding units 318C and 318D. This can eliminate a standby period for reading out pixel signals from the charge holding units 318C and 318D that is provided between the end of the previous accumulation period and the start of next accumulation period, as illustrated in FIG. 40 to FIG. 43.

A method of controlling an accumulation period of the photodiode 310 when a motion image and a static image of respective scenes illustrated in FIG. 24 to FIG. 27 are captured will be described below as an example of an imaging method in the imaging element 184 of the present embodiment illustrated in FIG. 44. Note that, although charges for a static image capturing are held in the charge holding unit 318C and charges for a motion image capturing are held in the charge holding unit 318D in the following description, the opposite thereof is possible, or the charge holding units 318C and 318D may be switched on a frame period basis.

Figure 45:
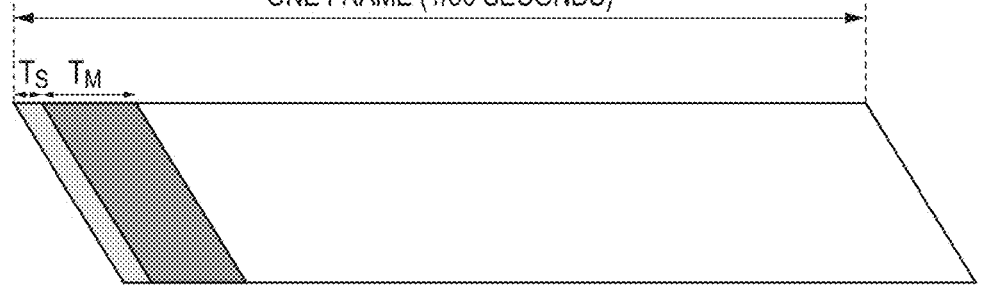
FIG. 45 is a diagram illustrating a control method when capturing both a motion image and a static image in a short accumulation period in the imaging device according to the eighth embodiment of the present invention.

FIG. 45 is a diagram illustrating a control method when capturing both a motion image and a static image in a short accumulation period in the imaging device according to the eighth embodiment of the present invention. FIG. 45 illustrates a method of controlling the accumulation period of the photodiode 310 during one frame when capturing the motion image and the static image illustrated in FIG. 24.

Since the imaging device of the present embodiment has two charge holding units 318C and 318D, it is not necessary to provide a standby period between accumulation periods that is for reading out pixel signals in accordance with the amounts of charges held in the charge holding units 318C and 318D. Thus, as illustrated in FIG. 45, the accumulation period $T_M$ of a motion image can be started immediately after the end of the accumulation period $T_S$ of a static image.

The control method illustrated in FIG. 45 is the same as the control method illustrated in FIG. 40 except that no standby period for an accumulation period is provided from the end of the accumulation period $T_S$ for a static image to the start of the accumulation period $T_M$ for a motion image. Specifically, the digital signal processor 187 reads out a pixel signal that is based on the amount of charges accumulated in the photodiode 310 with a capturing condition of the accumulation period $T_S$=1/1000 seconds and generates a static image illustrated in FIG. 24. Subsequently, immediately after the end of the accumulation period $T_S$, the digital signal processor 188 starts accumulation to the photodiode 310 with the capturing condition of the accumulation period $T_M$=1/250 seconds and reads out a pixel signal that is based on the amount of the accumulated charges and generates a motion image illustrated in FIG. 24. This allows for controlling accumulation periods for a motion image capturing and a static image capturing more flexibly in accordance with capturing conditions, in addition to allowing for the same advantageous effects as those in the seventh embodiment.

Figure 46:
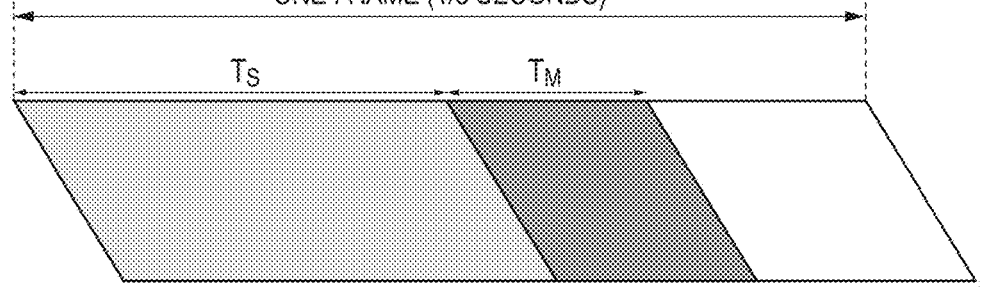
FIG. 46 is a diagram illustrating a control method when capturing both a motion image and a static image in a long accumulation period in the imaging device according to the eighth embodiment of the present invention.

FIG. 46 is a diagram illustrating a control method when capturing both a motion image and a static image in a long accumulation period in the imaging device according to the eighth embodiment of the present invention. FIG. 46 illustrates a method of controlling the accumulation period of the photodiode 310 during one frame when capturing the motion image and the static image illustrated in FIG. 25.

The control method illustrated in FIG. 46 is the same as the control method illustrated in FIG. 45 except that both a motion image and a static image are captured with a long accumulation period. Specifically, the digital signal processor 187 reads out a pixel signal based on the amount of charges accumulated in the photodiode 310 with the capturing condition of the accumulation period $T_S$=1/15 seconds and generates a static image illustrated in FIG. 25. Subsequently, immediately after the end of the accumulation period $T_S$, the digital signal processor 188 starts accumulation to the photodiode 310 with the capturing condition of the accumulation period $T_M$=1/30 seconds and reads out a pixel signal that is based on the amount of the accumulated charges and generates a motion image illustrated in FIG. 25. This allows for controlling accumulation periods for a motion image capturing and a static image capturing more flexibly in accordance with capturing conditions, in addition to allowing for the same advantageous effects as those in the seventh embodiment.

Figure 47:
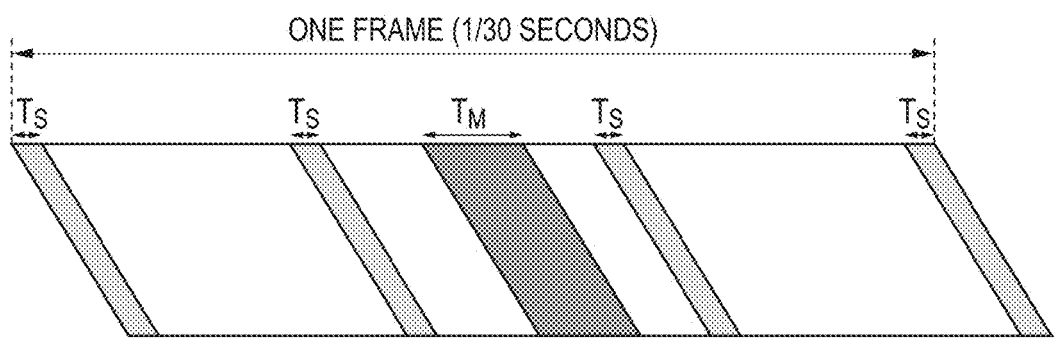
FIG. 47 is a diagram illustrating a control method when capturing a motion image in a short accumulation period and a static image in a long accumulation period in the imaging device according to the eighth embodiment of the present invention.

FIG. 47 is a diagram illustrating a control method when capturing a motion image in a short accumulation period and capturing a static image in a long accumulation period in the imaging device according to the eighth embodiment of the present invention. FIG. 47 illustrates a method of controlling the accumulation period of the photodiode 310 during one frame when capturing the motion image and the static image illustrated in FIG. 26.

The imaging device of the present embodiment has the two charge holding units 318C and 318D and therefore can start the accumulation period $T_S$ of a static image of the next frame immediately after the end of the accumulation period $T_S$ of a static image of the previous frame, as illustrated in FIG. 47. Further, in view of a span within one frame period, a standby period from the end of the previous accumulation periods $T_S$ and $T_M$ to the start of the next accumulation periods $T_S$ and $T_M$ can be reduced.

Specifically, immediately after the end of the accumulation period $T_S$ of the previous frame, the vertical scanning circuit 307 starts accumulation of charges by the photodiode 310 with the capturing condition of the accumulation period $T_S$=1/1000 seconds. The vertical scanning circuit 307 performs four times of accumulation of the accumulation period $T_S$ distributed within one frame period and transfers charges accumulated in the photodiode 310 to the charge holding unit 318C for each time the accumulation period $T_S$ ends. The digital signal processor 187 then reads out a pixel signal that is based on the charge amount for the four accumulation periods $T_S$ held in the charge holding unit 318C and generates a static image illustrated in FIG. 26.

In parallel to the above, in the middle period within one frame where no accumulation for a static image is performed, the vertical scanning circuit 307 performs accumulation with the capturing condition of the accumulation period $T_M$=1/250 seconds and transfers charges accumulated in the photodiode 310 to the charge holding unit 318D. The digital signal processor 188 then reads out a pixel signal that is based on the charge amount for the accumulation periods $T_M$ held in the charge holding unit 318D to generate a motion image illustrated in FIG. 26.

As a result, in the control method illustrated in FIG. 47, compared to the seventh embodiment, since four accumulation periods for a static image capturing are arranged in a more spread manner within one frame of 1/30 seconds, a lively static image with a greater blur effect can be captured. Further, since an accumulation period for a motion image capturing can be arranged in the middle of one frame period, a static image and a motion image captured during the same frame have the same center of the time weight and therefore, even when an object is moving fast, the position of the object on an image can be the same in the static image and the motion image.

Figure 48:
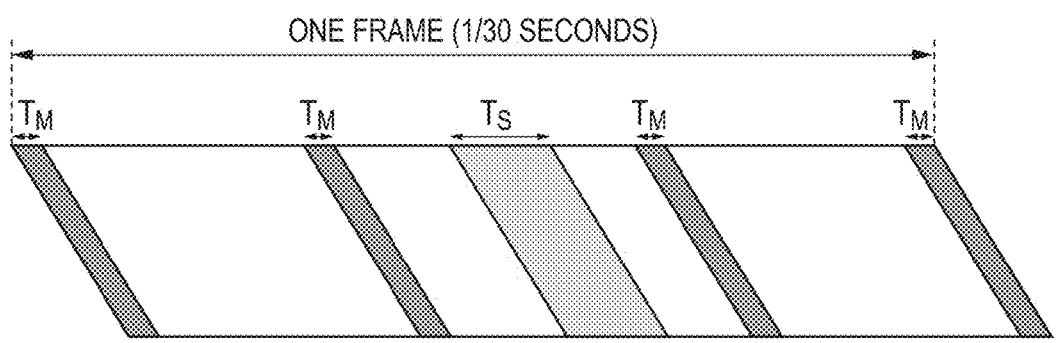
FIG. 48 is a diagram illustrating a control method when capturing a motion image in a long accumulation period and a static image in a short accumulation period in the imaging device according to the eighth embodiment of the present invention.

FIG. 48 is a diagram illustrating a control method when capturing a motion image in a long accumulation period and capturing a static image in a short accumulation period in the imaging device according to the eighth embodiment of the present invention. FIG. 48 illustrates a method of controlling the accumulation period of the photodiode 310 during one frame when capturing the motion image and the static image illustrated in FIG. 27. The specific process is the same as that in FIG. 47 except that the accumulation period $T_S$ of a static image and the accumulation period $T_M$ of a motion image are opposite to those illustrated in FIG. 47, and thus the description thereof will be omitted.

As discussed above, the imaging element of the present embodiment has two charge holding units that hold charges transferred from the third photoelectric conversion unit (the photodiode 310). Further, while reading out a pixel signal that is based on the amount of charges held in the one of the two charge holding units, the control unit (the vertical scanning circuit, the system control CPU) of the present embodiment transfers charges to the other and holds the charges. This allows for controlling accumulation periods for a motion image capturing and a static image capturing more flexibly in accordance with capturing conditions.

Modified Embodiment

Various modifications are possible in the present invention without limited to the embodiments described above. For example, the configuration of the imaging device described in the above embodiment is a mere example, and the imaging device to which the present invention is applicable is not limited to the configurations illustrated in FIG. 1A, FIG. 1B, and FIG. 2. Further, the circuit configuration of each portion of the imaging element is not limited to the configuration illustrated in FIG. 3, FIG. 8, FIG. 11, FIG. 39, FIG. 44, or the like. Further, the photoelectric conversion unit is not necessarily limited to the photodiode as illustrated in FIG. 4, but may be any element as long as it has a photoelectric conversion function.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-202086, filed Oct. 13, 2015 and Japanese Patent Application No. 2016-148738, Jul. 28, 2016, which are hereby incorporated by reference herein in their entirety.

What is claimed is:
1. An imaging device comprising:
an imaging sensor having a photoelectric converter that photoelectrically converts a light flux from an object and accumulates generated charges and a first capacitor and a second capacitor that hold the charges transferred from the photoelectric converter;
an optics that guides the light flux from the object to the imaging sensor; and
a controller that reads out a pixel signal that is based on an amount of charges held in one of the first capacitor and the second capacitor, and that transfers the charges to the other of the first capacitor and the second capacitor and holds the charges,
wherein the controller sets capturing conditions including accumulation periods for a motion image capturing and a static image capturing, and
wherein the controller selects a combination of the first capacitor and the second capacitor used for a motion image capturing and a static image capturing in accordance with the capturing conditions and a brightness of the object.

2. The imaging device according to claim 1,
wherein the imaging sensor further has an overflow transistor that drains the charges accumulated in the photoelectric converter, and
wherein, while the controller controls the overflow transistor to control an accumulation period for a motion image capturing and an accumulation period for a static image capturing in the photoelectric converter.

3. The imaging device according to claim 1, wherein the controller stores image data obtained by a static image capturing and image data obtained by a motion image capturing separately in a storage medium.

4. The imaging device according to claim 1, wherein, when both the first capacitor and the second capacitor are used, the controller corrects a gain of a signal from the first capacitor or the second capacitor in accordance with the brightness of the object, a light-receiving efficiency of the first capacitor, and a light-receiving efficiency of the second capacitor.

5. The imaging device according to claim 1, wherein, when only one of the first capacitor and the second capacitor is used, the controller captures a motion image at a timing of a static image capturing with an accumulation period of a static image capturing.

6. The imaging device according to claim 1, wherein the controller adjusts an accumulation period of a motion image capturing in accordance with a magnitude of a motion of the object.

7. The imaging device according to claim 1, wherein, in a capturing condition priority mode that prioritizes the capturing conditions, the controller selects a combination of the first capacitor and the second capacitor used for a motion image capturing and a static image capturing with the capturing conditions being maintained unchanged.

8. The imaging device according to claim 1, wherein the controller prioritizes one of the accumulation period of the motion image capturing and the accumulation period of the static image capturing to the other to select a combination of the first photoelectric conversion unit and the second capacitor used for the motion image capturing and the static image capturing.

9. The imaging device according to claim 1, wherein the controller prioritizes one of an optimization of exposure of the motion image capturing and an optimization of exposure of the static image capturing to the other to select a combination of the first capacitor and the second capacitor used for the motion image capturing and the static image capturing.

10. The imaging device according to claim 1, wherein the controller selects, from the first capacitor or the second capacitor, a capacitor which detects the brightness of the object in accordance with the brightness of the object.

11. The imaging device according to claim 1, wherein the controller switches the first capacitor to or from the second capacitor by increasing, at a predefined time constant, a ratio of images captured by using the switched capacitor.

12. The imaging device according to claim 11, wherein the controller switches the first capacitor to or from the second capacitor by increasing, at a predefined time constant, a ratio of frames captured by using the switched capacitor.

13. The imaging device according to claim 11, wherein the controller switches the first capacitor to or from the second capacitor by expanding, at a predefined time constant, a frame pixel area captured by using the switched capacitor.

14. The imaging device according to claim 13, wherein the controller determines a start point and a direction of a switching pixel area in accordance with a motion of the object.

15. A controlling method of an imaging device comprising: an imaging sensor having a photoelectric converter that photoelectrically converts a light flux from an object and accumulates generated charges and a first capacitor and a second capacitor that hold the charges transferred from the photoelectric converter; and an optics that guides the light flux from the object to the imaging sensor, the method comprising:
  reading out a pixel signal that is based on an amount of charges held in one of the first capacitor and the second capacitor,
  transferring the charges to the other of the first capacitor and the second capacitor and holds the charges,
  setting a capturing conditions including accumulation periods for a motion image capturing and a static image capturing, and
  selecting a combination of the first capacitor and the second capacitor used for a motion image capturing and a static image capturing in accordance with the capturing conditions and a brightness of the object.

* * * * *